United States Patent [19]
Shick et al.

[11] Patent Number: 6,121,340
[45] Date of Patent: *Sep. 19, 2000

[54] PHOTODEFINABLE DIELECTRIC COMPOSITIONS COMPRISING POLYCYCLIC POLYMERS

[75] Inventors: Robert A. Shick, Strongsville; Saikumar Jayaraman, Twinsburg; Edmund Elce; Brian L. Goodall, both of Akron, all of Ohio

[73] Assignee: The B. F. Goodrich Company, N.Y.

[*] Notice: This patent is subject to a terminal disclaimer.

[21] Appl. No.: 08/964,080

[22] Filed: Nov. 4, 1997

Related U.S. Application Data

[60] Provisional application No. 60/030,410, Nov. 4, 1996.

[51] Int. Cl.$^7$ .............................. C08F 2/50; G03F 7/075; G03C 1/73
[52] U.S. Cl. ................................ 522/31; 522/57; 522/65; 522/66; 522/67; 522/148; 522/149; 522/150; 522/160; 430/270.1; 430/286.1; 430/287.1
[58] Field of Search ................................ 522/31, 65, 148, 522/149, 57, 66, 67, 150, 157, 160; 430/227.5, 277.5, 286.1, 287.1, 270.1

[56] References Cited

U.S. PATENT DOCUMENTS

| | | |
|---|---|---|
| 3,330,815 | 7/1967 | McKeon et al. . |
| 3,838,115 | 9/1974 | Bond, Jr. . |
| 3,920,714 | 11/1975 | Streck ...................................... 526/142 |
| 5,011,730 | 4/1991 | Tenney et al. . |
| 5,071,701 | 12/1991 | Tenney et al. ........................... 428/285 |
| 5,179,171 | 1/1993 | Minami et al. .......................... 525/288 |
| 5,407,970 | 4/1995 | Peterson et al. .......................... 52/149 |
| 5,468,819 | 11/1995 | Goodall et al. . |
| 5,717,808 | 2/1998 | Brehm et al. . |

FOREIGN PATENT DOCUMENTS

| | | |
|---|---|---|
| 5214079 | 8/1993 | Japan . |
| 7104474 | 4/1995 | Japan . |

OTHER PUBLICATIONS

Derwent World Patent Index Abstract of JP–2042441A, Feb., 1990.

*Primary Examiner*—Susan W. Berman
*Attorney, Agent, or Firm*—Thoburn T. Dunlap

[57] ABSTRACT

The present invention relates to a photodefinable dielectric composition comprising a photoinitiator and a polycyclic addition polymer comprising polycyclic repeating units that contain pendant silyl functionalities containing hydrolyzable substituents. Upon exposure to a radiation source the photoinitiator catalyzes the hydrolysis of the hydrolyzable groups to effect the cure of the polymer and adhesion of the polymer to desired substrates.

33 Claims, No Drawings

PHOTODEFINABLE DIELECTRIC COMPOSITIONS COMPRISING POLYCYCLIC POLYMERS

This Application claims the benefit of U.S. Provisional Application No. 60/030,410, filed Nov. 4, 1996.

TECHNICAL FIELD

The present invention is related to polycyclic polymers and their use in photodefinable dielectric compositions. More specifically, the invention is directed to photosensitive dielectric compositions comprising a polycyclic addition polymer and a cationic photoinitiator. The polycyclic polymer contains recurring pendant silyl functional groups and is polymerized from silyl substituted polycycloolefin monomers containing at least one norbornene moiety. The pendant silyl functional groups in combination with polymer backbone microstructure offer superior substrate adhesive properties and crosslinking sites for the selective application of dielectric films in the manufacture and packaging of integrated circuits.

BACKGROUND

Inorganic materials such as silicon dioxide and silicon nitride have been traditionally used in the microelectronics industry as insulating and passivating materials in the manufacture of integrated circuits. However, as the demand for smaller, faster, and more powerful devices becomes prevalent new materials will be needed to enhance the performance and the efficient manufacture of these devices.

To meet these enhanced performance and manufacturing criteria considerable interest in high performance polymers characterized by low dielectric constant, low moisture uptake, good substrate adhesion, chemical resistance, high glass transition temperatures (e.g., Tg>250° C.), toughness, high thermo and thermo-oxidative stabilities, as well as good optical properties is increasingly gaining momentum. Such polymers are useful as dielectric coatings and films in the construction and manufacture of multichip modules (MCMs) and in integrated circuits (IC's). Integrated circuits (IC's) are paramount in the manufacture of an array of electronic devices. They are fabricated from the sequential formation of alternating and interconnecting bands of conductive, semiconductive and nonconductive layers on an appropriate substrate (e.g., silicon wafer) that are selectively patterned to form circuits and interconnections to produce specific electrical functions. Of concern in the present invention is the selective formation of a dielectric (i.e., nonconductive) layer(s) on an underlying substrate. The selective patterning of dielectric layers on an IC can be carried out in accordance with various photolithographic techniques known in the art. In one method, a photosensitive polymer film is applied over the desired substrate surface and dried. A photomask containing the desired patterning information is then placed in close proximity to the photoresist film. The photoresist is irradiated through the overlying photomask by one of several types of imaging radiation including UV light, e-beam electrons, x-rays, or ion beam. Upon exposure to the radiation, the polymer film undergoes a chemical change (crosslinks) with concomitant changes in solubility. After irradiation, the substrate is soaked in a developer solution that selectively removes the non-crosslinked or unexposed areas of the film.

As disclosed in Japanese Kokai Application No. 7-104474 to Nippon Zeon Co., Ltd. (NZ '474) attention is being directed to the polycycloolefins (e.g. polymers derived from polycyclic monomers containing a norbornene moiety). Because of their high hydrocarbon content, polycycloolefins have low dielectric constants and low affinities for moisture. Presently, there are several routes to polymerize cyclic olefin monomers such as norbornene or other higher polycyclic monomers containing the norbornene functionality. These include: (1) ring-opening metathesis polymerization (ROMP); (2) ROMP followed by hydrogenation; (3) addition copolymerization (Ziegler type copolymers with ethylene); and (4) addition homopolymerization. Each of the foregoing routes produces polymers with specific structures as shown in the diagram below:

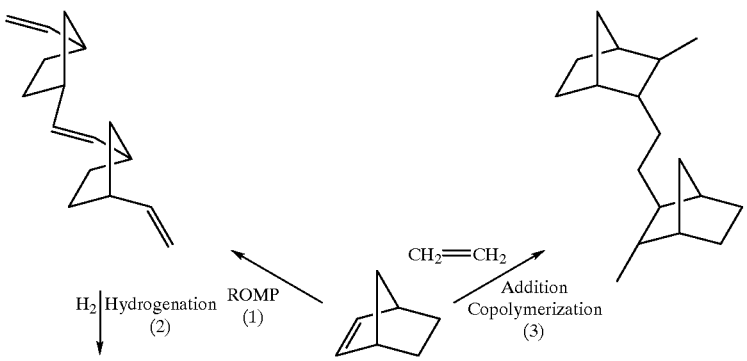

-continued

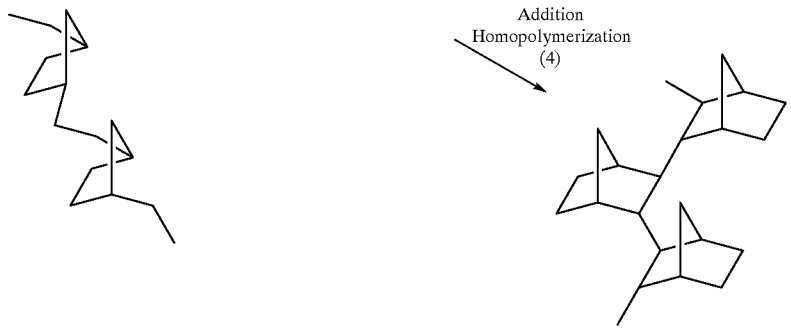

Addition
Homopolymerization
(4)

As illustrated above, a ROMP catalyzed polymer contains a repeat unit with one less cyclic unit than did the starting monomer. The so-called ring-opended repeat units are linked together in an unsaturated backbone characteristic of a ROMP polymer. As can readily be surmised ROMP catalyzed polymers suffer the inherent disadvantage of backbone unsaturation which significantly reduces the thermo-oxidative stability of the polymer. ROMP catalyzed polymers exist as thermoplastics or thermosets (Tg<240° C.). ROMP catalyzed thermosets have been utilized to produce circuit board substrates via reaction injection molding (RIM) as disclosed in U.S. Pat. No. 5,011,730 to Tenney et al. However, as discussed above, these polymers inherently suffer from thermo-oxidative instability as well as insufficiently low Tg's. Moreover, in the RIM process a finished polymer part is directly polymerized in the mold from a reactive monomer solution containing a molybdenum or tungstun catalyst and an organoaluminum halide cocatalyst. No intermediate resin or cement is produced. Consequently, all reactants and reactant by-products including catalyst metal residues and halide compounds remain in the finished part as contaminants. There is no way to remove these contaminants from the finished article without first destroying it. The metal residues deleteriously affect the electrical insulating properties of the polymer and the halide can combine with moisture to form corrosive hydrogen halide.

To overcome the deficiencies of the ROMP catalyzed thermoplastics it has been proposed to hydrogenate the polymer in an attempt to yield a more stable backbone. However, what is gained in stability is lost in thermal properties. Hydrogenation typically reduces the Tg of the ROMP polymer by approximately 50° C. Furthermore, the cost of the two-step process (ROMP, followed by hydrogenation), the inherent brittleness of the polymer, and the reduced thermal performance of the polymer (Tg<180° C.) is limiting the commercial impact of all ROMP based thermoplastics.

The alternative to the two-step ROMP/hydrogenation route to cyclic olefin polymers is the Ziegler or addition copolymerization route. Addition copolymers derived from higher polycyclic monomers such as tetracyclododecene and ethylene using homogeneous vanadium catalysts are commercially prepared and are available under the trademark Apel®. However, this catalytic approach can suffer from a number of limitations such as low catalytic activity and significant oligomeric fractions (Benedikt, G. M.; Goodall, B. L.; Marchant, N. S.; Rhodes, L. F. *Proceedings of the Worldwide Metallocene Conference (MetCon '94)*, Catalyst Consultants Inc., Houston, Tex., 1994.)

The limitations of the vanadium catalysts led to the development of the higher activity zirconium-based metallocene polymerization catalysts developed by Prof. Walter Kaminsky (University of Hamburg, Germany) to produce higher molecular weight polycyclic addition copolymers with narrow molecular weight distributions (*Plastics News*, Feb. 27, 1995, p. 24.). Due to the reduced activity at high polycyclic (norbornene) concentrations, these addition copolymers typically suffer from inadequate Tg's (Tg<240° C.) similar to ROMP catalyzed polymers. Even though these polymers exhibit improved stability, they are still brittle and have poor resistance to hydrocarbon and halohydrocarbon solvents.

Addition homopolymers of norbornene have been polymerized utilizing the Kaminsky zirconium-based metallocene catalysts. These polymers, however, are intractable, e.g., are crystalline, are not soluble in common organic solvents, and do not exhibit a transition (glass or melt) before they decompose (Kaminsky, W.; Bark, A.; Drake, I. *Stud. Surf Sci. Catal.* 1990, 56, 425.)

Addition homopolymers of norbornene have also been polymerized via palladium based catalyst systems ([Pd(CH$_3$CN)$_4$][BF$_4$]$_2$) as reported by Christof Mehler and Wilhelm Risse (*Makromol. Chem., Rapid Commun.* 12, 255–259 (1991)). However, these polymers are insoluble in common hydrocarbon solvents such as cyclohexane, toluene, xylene and the like.

In order for a polymer to be considered for microelectronic applications, the polymer must be able to be coated onto a substrate surface. In practice the polymer is deposited from solution onto the desired substrate surface. Solvent choice is very important in that halogenated solvents are strictly avoided in the microelectronics industry. Simply stated, the polymer must be soluble in nonhalogenated organic solvents. Palladium catalyzed cycloaddition polymers do not have the desired solubility in common nonhalogenated organic solvents (Sen, A.; Lai, T.-W.; Thomas R. R., *J. Organomet. Chem.*, 358 (1988) 567–588).

In addition to the solubility criterion, a polymer must exhibit satisfactory adhesion to a variety of different substrates, e.g., inorganic substrates such as silicon, silicon dioxide, silicon nitride, alumina, copper, aluminum, the noble metals such as gold, silver, and platinum, and tie layer metals such as titanium nickel, tantalum, and chromium, as well as to itself when multiple layers of the polymer are desired. Good adhesion is required through repeated cycling at temperature extremes (i.e. at depressed and elevated temperatures), as well as through varying humidity conditions. Good adhesion must also be maintained through device processing and assembly temperatures.

There exists a need in the microelectronics industry for a thermally stable, noncorrosive, low dielectric constant polymer with good solvent resistance, high glass transition temperatures, good mechanical performance, solubility in nonhalogenated organic solvents, and good adhesive properties that can be applied directly to an underlying substrate.

With the inherent low moisture affinity and electrical insulating properties of the addition polymerized polycycloolefins, it would be desirous to improve upon the physical properties (e.g., glass transition temperature, toughness, solvent resistance, solubility, etc.) as well as the adhesive properties so that these polymers can be utilized in electrical applications.

The incorporation of functional substituents into hydrocarbon polymer backbones has been a useful method for modifying the chemical and physical properties of the polymer. It is known, however, that polymers containing functional substituents are difficult to prepare because of the propensity of the functional group to poison the catalyst. The free electron pairs on the functional substituent (e.g., nitrogen and oxygen atoms in particular) deactivate the catalyst by complexing with the active catalytic sites. Consequently, catalyst activity decreases and the polymerization of monomer is inhibited.

Previous attempts to addition polymerize a functionally substituted polycycloolefinic monomer via transition metal catalysis have resulted in polymers with low molecular weights. In U.S. Pat. No. 3,330,815 to Union Carbide (UC '815), for example, attempts to polymerize functionally substituted polycyclic monomers via palladium metal catalysis produced polymers with low molecular weights as evidenced in the Examples disclosed therein. Molecular weights above 10,000 $M_n$ were not obtained by the disclosed catalyst systems of the UC '815 patent.

To overcome the difficulty of polymerizing monomers with functional groups (due to catalyst system deactivation), it has been proposed to post react the polymer with the desired functional substituent in order to incorporate the moiety into the polymer. Nippon Zeon '474 concerns a photosensitive resin composition containing a cycloolefin polymer component and photoinitiator component (e.g., photoacid generator). The cycloolefin polymer component is functionalized with silyl groups containing hydrolyzable moieties. The disclosure is principally concerned with silyl functionalized hydrogenated ring-opened metathesis polymerized cycloolefins. The silyl functionality is introduced by grafting onto the ROMP backbone via a free radical or hydrosilylation reaction. In these embodiments, the ROMP backbone can be hydrogenated before or after the grafting reaction.

Nippon Zeon '474 also discloses the copolymerization of a cycloolefin monomer and a second monomer that contains a silyl group. The copolymerization reaction is conducted in the presence of a ROMP catalyst yielding a silyl functionalized ring-opened polymer. The silyl functionalized ring-opened polymer is subsequently hydrogenated to saturate the inherent backbone unsaturation.

As discussed above, the hydrogenated ROMP polycyclics suffer drawbacks in that their Tg's are relatively low (<190° C.) and the backbone polymer requires at least a two-step process for its manufacture. Moreover, the post functionalization graft reactions are not selective in that the amount and placement of the silyl substituent on the polycyclic backbone can not be controlled.

In another embodiment of the same disclosure, addition copolymers derived from cycloolefins and an α-olefin such as ethylene catalyzed in the presence of a transition metal/aluminum catalyst system or addition polymers derived from cycloolefins catalyzed in the presence of transition metal/aluminum or palladium catalyst systems are post functioanalized with silyl substituents via a grafting reaction. Notwithstanding the inherent deficiencies of the foregoing addition polymer backbones such as (i) the low Tg of the cycloolefin/ethylene copolymers and (ii) the insolubility of palladium catalyzed cycloaddition polymers, a further drawback is the inherent deficiencies of the post functionalization grafting reaction. As with the post functionalization of the polycyclic ROMP polymers, the amount and placement of the functional group on the backbone can not be controlled. The end result is that the silyl group can be located anywhere on the backbone where a graft reaction can occur. NZ '474 specifically teaches that the disclosed cycloaddition polymers are post functionalized with a silyl group via a conventional free radical generating mechanism. Assuming that the cycloaddition polymer was derived from the simplest of the polycyclic monomers (e.g., norbornene), the silyl functionality would have a probability of grafting to all sites on the polymer backbone that have the potential to form a free radical species (Koch, V. R.; Gleicher, G. J., *J. Amer. Chem. Soc.*, 93:7, 1657–1661 (1971)). Accordingly, the silyl functionality can graft to any or all of the numbered sites shown below in the diagram (lower numbers indicate higher probability grafting sites).

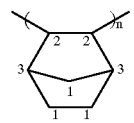

In spite of the hierarchy of the grafting site probabilities, the grafted product will comprise a mixture of the grafted products containing silyl functionality at one or more of the numbered sites indicated above. A major disadvantage of free radically grafted addition polymers is the propensity of the backbone to undergo cleavage or scission during the graft reaction. Free radicals generated at the repeating unit attachment sites ( site 2 in the above diagram) can cause chain scission.

Japanese Kokai Application No. 5-214079 to Nippon Zeon (NZ '079) discloses graft polymers consisting of a ring-opened cyclic polymer backbone that has been post functionalized with silyl moieties via hydrosilylation across the carbon—carbon double bonds in the polymer backbone. Although the hydrosilylation technique somewhat more site specific than in the free radical "shot gun" post functionalization approach described above, the hydrosilylation reaction is not entirely site specific. As shown in the diagram below ROMP polymers contain unsaturation in the backbone of the polymer. To introduce a pendant silyl group on the cyclic repeating unit a pendant substituent containing carbon—carbon unsaturation must be introduced as a hydrosilylation site. However, as shown below the backbone as well as the pendant unsaturated substituent is subject to the hydrosilylation reaction. One of carbons 1—1 and 2—2 will hydrosilylate as shown in the diagram.

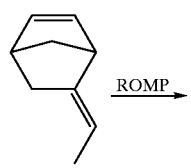

-continued

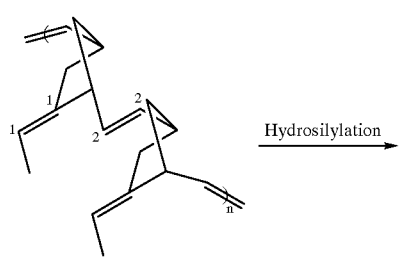

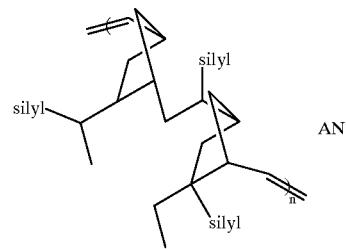

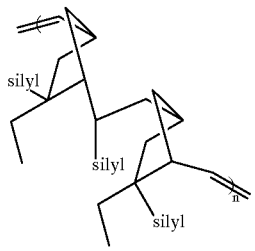

As shown above the hydrosilylation of the cyclic backbone is more specific than the free radical grafting technique disclosed in NZ '474. However, it can be readily seen that hydrosilation occurs across any carbon—carbon double bond. Moreover, one can not specifically predict or, for that matter, direct which of the carbon atoms across the carbon—carbon unsaturation will hydrosilylate. Obviously, the reaction will favor the more reactive carbon atom (given steric factors, and the like). The likely scenario is that a mixture of various hydrosilylation products will be obtained.

Nippon Zeon '079 also discloses that cycloaddtion polymers can be hydrosilylated. However, the disclosure provides no exemplification or enabling description on how this is accomplished. One can only assume that the hydrosilylation is directed across carbon—carbon unsaturation pending from a cyclic repeat unit as shown in the following diagram.

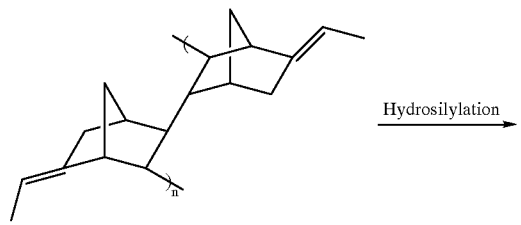

-continued

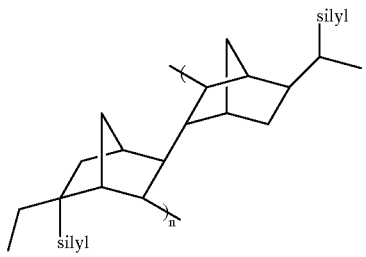

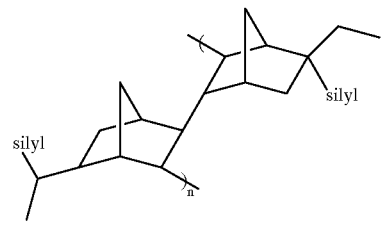

Hydrosilylation of an addition polymer is more specific than the hydrosilylation of a ROMP polymer, given that the addition polymer backbone does not have the repeat unit to repeat unit unsaturation as is inherent in the ROMP backbone. However, as with the ROMP polymers discussed above there is no specificity in directing the attachment of the silyl group to the adjacent unsaturated carbon atoms in the pendant substituent. Again a mixture of hydrosilylation products would be expected.

Minami et al., U.S. Pat. No. 5,179,171 (Minami '171), disclose copolymers containing polycyclic repeating units which have been post modified with a functional substituent. Among the disclosed copolymers are those derived from maleic anhydride, vinyltriethoxy silane, and glycidyl methacrylate grafted to a polycyclic backbone.

The functional substituent or moiety (i.e. a free radically polymerizable functional group containing monomer) is grafted to the polycyclic copolymer by reacting the functional moiety with the base polymer in the presence of a free radical initiator. As discussed above, the free radical moiety (formed from the functional group containing monomer) attacks accessible hydrogens on the polymeric backbone as well as on the polycyclic repeat unit (excluding the bridgehead hydrogens) and grafts to carbon atoms at those sites. Again, the drawback with free radical grafting is that there is no control over where the substituent will graft. Moreover, only small amounts of the free radical moiety (typically less than 2 mole %) grafts to the polymer. Excess amounts of free radical moieties in the reaction medium can cause chain scission, leading to polymer chains of lower molecular weight. There is also a tendency for the grafting moiety to homopolymerize instead of grafting to the base polymer. In addition, grafting monomers have been known to form branched oligomers at the grafting site thereby reducing the efficacy of the desired functionality.

Minami '171 purports that the post modification of the disclosed ethylene/polycycloolefin copolymers leads to high Tg polymers (20 to 250° C.). However, the data reported in the Examples appears to suggest otherwise. The maleic anhydride, vinyltriethoxy silane, and glycidyl methacrylate graft copolymers of Examples 33 to 39 on average exhibit a 2° C. increase in Tg over their non-grafted counterparts. When taking experimental error into account, the slight overall increase in the reported Tg values are nil or insignificant at best. Contrary to the disclosure of Minami '171, high Tg polymers are not attained. In fact, the highest Tg reported in any of the Examples is only 160° C. There is no disclosure to suggest that addition polymerized silyl substituted polycyclic monomers provide polymers with superior physical and adhesive properties, especially adhesion to copper and noble metal substrates. The data reported in the examples also indicates that the highest incorporation through grafting of the vinyl triethoxy silane moiety is less than 0.1 mole %.

In view of the deficiencies in the prior art there is a need for a photodefinable dielectric polymer composition wherein the polymer component has functional substituents at selected positions and can be directly polymerized from functional monomer precursors.

SUMMARY OF THE INVENTION

Accordingly, it is a general object of this invention to provide photodefinable polymer compositions that possess low dielectric constants, low moisture absorption, high glass transition temperatures, high thermo and thermo-oxidative stabilities, resistance against chemical attack, toughness, and good solubility and adhesive properties.

It is another object of this invention to provide photodefinable polymer compositions that are useful in dielectric coatings and films for the construction and packaging of microelectronic devices requiring patterned dielectrics for interconnect such as integrated circuits, multichip modules and other high density interconnect.

It is another object of this invention to provide photodefinable polymer compositions that adhere to microelectronic substrates without the need for coupling agents.

It is a further object of this invention to provide photodefinable polymer compositions that adhere well to copper, silver, and gold substrates.

It is yet another object of this invention to provide a photodefinable polycycloolefin addition polymer containing silyl functional substituents that are attached directly to the polycycloolefin repeat unit.

It is another object of this invention to provide a photodefinable polycycloolefin addition polymer with specific microstructural arrangements.

It is a still further object of this invention to provide catalytic reaction mixtures that are resistant to functional group deactivation.

It is a specific object of this invention to provide catalyst systems that control polymer microstructure.

These and other objects of the invention are accomplished by providing a photodefinable dielectric composition comprising an addition polymer component comprising polycyclic repeat units having pendant silyl groups and a photoinitiator component. The addition polymer component is obtained by polymerizing a reaction mixture comprising at least one silyl functionalized polycycloolefinic monomer, a solvent, a single or multicomponent catalyst system each comprising a nickel metal ion source, in combination with one or both of an organometal cocatalyst and a third component, and an optional chain transfer agent (CTA) selected from a compound having a terminal olefinic double bond between adjacent carbon atoms, wherein at least one of said adjacent carbon atoms having two hydrogen atoms attached thereto.

DETAILED DESCRIPTION

The present invention relates to a negative tone photodefinable dielectric composition comprising a polycyclic addition polymer containing recurring silyl pendant groups along the polymer backbone and a photosensitive crosslinking initiator. The silyl group contains hydrolyzable substituents that confer adhesive and curing (crosslink) properties to the polymer after hydrolysis. The polymer composition containing the initiator is coated as a thin film on a substrate, baked under controlled conditions, exposed to photoradiation in a patterned configuration, and optionally post baked under controlled conditions to achieve a final cure. In the portions of the film that have been exposed to the photoradiation, the recurrent pendant silyl groups that contain the hydrolyzable substituents undergo a hydrolysis reaction to afford a crosslinked, adherent film. The unexposed areas (i.e., the noncrosslinked areas the film) are selectively removed with a suitable solvent developer.

The polymers of the present invention comprise polycyclic repeating units, a portion of which are substituted with silyl functional groups. The instant polymers are prepared by polymerizing, via an addition mechanism, the silyl substituted polycyclic monomers described below. By the term "polycyclic" (norbornene-type or norbornene-functional) is meant that the monomer contains at least one norbornene functionality as shown below:

The simplest polycyclic monomer of the invention is the bicyclic monomer, bicyclo[2.2.1]hept-2-ene, commonly referred to as norbornene. The pendant silyl functionality is introduced into the polymer chain by polymerizing a reaction medium comprising one or more silyl substituted polycyclic monomers set forth under Formula I below in optional combination with one or more hydrocarbyl substituted polycyclic monomers set forth under Formula II below.

Monomers

The silyl functional polycyclic monomers useful in the practice of the present invention are selected from one or more monomers represented by the formula below:

I

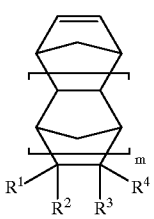

wherein $R^1$ and $R^4$ independently represent hydrogen; linear or branched ($C_1$ to $C_{20}$)alkyl; $R^1$ and $R^4$ taken together with the two ring carbon atoms to which they are attached represent a saturated or unsaturated cyclic group of 4 to 8 carbon atoms. The cyclic group formed by $R^1$ and $R^4$ is substituted by at least one of $R^2$ and $R^3$, the definition of which is set forth below. Substituents $R^1$ and $R^4$ when taken together with the two ring carbon atoms to which they are attached can also represent the group:

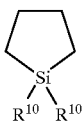

wherein $R^{10}$ is defined below; $R^2$ and $R^3$ independently represent hydrogen, linear or branched ($C_1$ to $C_{20}$)alkyl or the group:

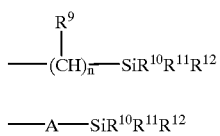

wherein A is a divalent radical selected from the following:

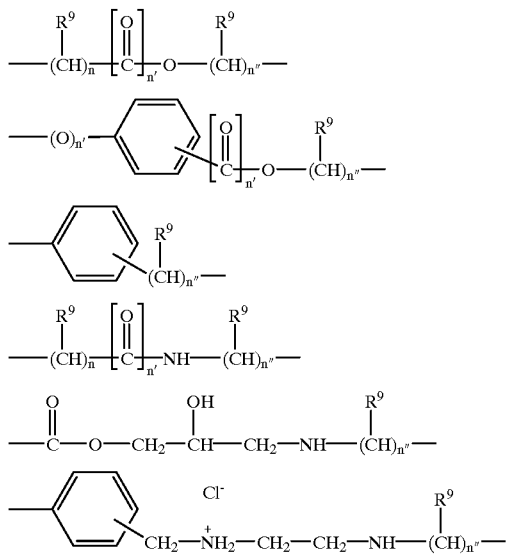

In the divalent formulae set forth above, the silyl substituent is located on the n" terminus portion of the radical; $R^9$ independently is hydrogen, methyl, or ethyl; $R^{10}$, $R^{11}$, and $R^{12}$ independently represent halogen selected from the group consisting of chlorine, flourine, bromine, and iodine, linear or branched ($C_1$ to $C_{20}$)alkyl, linear or branched ($C_1$ to $C_{20}$)alkoxy, linear or branched ($C_1$ to $C_{20}$)alkyl carbonyloxy, e.g., acetoxy, ($C_1$ to $C_{10}$)alkyl peroxy and substituted or unsubstituted ($C_6$ to $C_{20}$)aryloxy; $R^{10}$, $R^{11}$, and $R^{12}$ together with the silicone atom to which they are attached form the group:

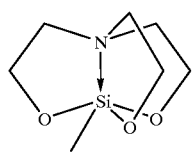

m is a number from 0 to 4; n is a number from 0 to 5; n' is 0 or 1; and n" is a number from 0 to 10 (1 to 10 being preferred). Substituents $R^2$ and $R^3$ are subject to the proviso that at least one of $R^2$ and $R^3$ must be selected from the group represented by Ia or Ib defined above, preferably at least one of $R^{10}$ to $R^{12}$ contains a silicon—oxygen bond, and with the additional proviso that when $R^1$ and $R^4$ are taken together to form a saturated cyclic group, only one of $R^2$ or $R^3$ (which are substituents on the cyclic ring) can represent a silyl group. More preferably, at least one of $R^{10}$, $R^{11}$, or $R^{12}$ is selected from a linear or branched ($C_1$ to $C_{10}$)alkoxy group, substituted and unsubstituted aryloxy such as phenoxy, acyloxy such as formyloxy, acetoxy, and propionoxy. Still more preferably, each of $R^{10}$, $R^{11}$, and $R^{12}$ are the same and are selected from methoxy, ethoxy, propoxy, butoxy, and pentoxy. More preferred, are substituents represented by Structure Ia wherein n is 0, and $R^{10}$, $R^{11}$, and $R^{12}$ are ethoxy, e.g., $R^2$ and/or $R^3$ is a triethoxysilyl substituent. When $R^2$ and/or $R^3$ is a silyl group, $R^1$ and/or $R^4$ is preferably hydrogen.

In Formula Ia it is evident that when n is 0 the silyl functionality is connected directly to the polycyclic monomer (or polymer repeat unit) through a silicon-carbon bond wherein the carbon atom of said silicon-carbon bond is supplied by a carbon atom on the polycyclic ring (i.e. a ring carbon atom). When n and n" are positive numbers other than 0 in Formulae Ia and Ib, respectively, it is evident that the silyl functionality is connected to the polycyclic ring (or repeat unit) through a moiety that contains a carbon—silicon bond. Less preferred of the silyl functionalities are those that are connected to the polycyclic ring by a moiety that contains a carbon-oxygen-silicon bond, e.g.,

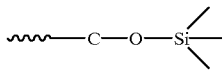

In Formula I above, m is preferably 0 or 1 as represented by structures Ic and Id, respectively, below:

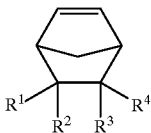

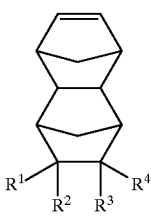

wherein $R^1$ to $R^4$ are as previously defined above. Monomers where m is 0, i.e., monomers of structure Ic, are especially preferred. As stated above at least one of $R^2$ and $R^3$ must be a silyl functionality as defined above. When $R^2$ and/or $R^3$ are silyl, $R^1$ and/or $R^4$ are/is preferably hydrogen.

As discussed above, substituents $R^1$ and $R^4$ together with the two ring carbon atoms to which they are attached can form a saturated cyclic group of 4 to 8 carbon atoms. Generically such monomers are represented by the following structure:

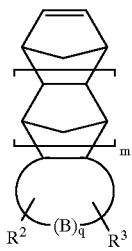

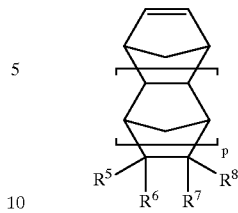

wherein B is a —$CH_2$— group and q is a number from 2 to 6. It should be apparent that when the carbon atom in the —$CH_2$— group represented by B is substituted by $R^2$ or $R^3$ (i.e., $R^2$ and $R^3$ are other than hydrogen), the —$CH_2$— group will have one less hydrogen atom attached thereto.

Representative structures are shown below:

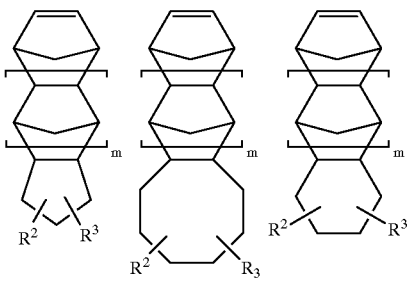

Substituents $R^1$ and $R^4$ can also be taken together with the two ring carbon atoms to which they are attached to form monomers represented by the following structure:

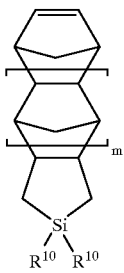

wherein $R^2$, $R^3$, $R^{10}$, and m above are as previously defined and subject to the same preferences and provisos as set forth above.

As used throughout the specification, the term "substituted" is meant to include linear and branched hydrocarbyl substituents such as ($C_1$ to $C_{10}$)alkyl, ($C_2$ to $C_{10}$)alkenyl, ($C_3$ to $C_{10}$)alkynyl; hydroxy and linear and branched hydroxyalkyl, amino, and linear and branched aminoalkyl.

Illustrative examples of monomers of formula I include 5-triethoxysilyl-norbornene, 5-trimethoxysilyl norbornene, 5-methyldimethoxysilyl norbornene, 5-dimethylmethoxy norbornene and 5-dimethylethoxysilyl norbornene.

The hydrocarbyl substituted polycyclic monomers useful in the practice of the present invention are selected from a monomer represented by the formula below:

wherein $R^5$, $R^6$, $R^7$, and $R^8$ independently represent hydrogen, linear and branched ($C_1$ to $C_{20}$)alkyl, hydrocarbyl substituted and unsubstituted ($C_5$ to $C_{12}$)cycloalkyl, hydrocarbyl substituted and unsubstituted ($C_6$ to $C_{40}$)aryl, hydrocarbyl substituted and unsubstituted ($C_7$ to $C_{15}$)aralkyl, ($C_3$ to $C_{20}$)alkynyl, linear and branched ($C_3$ to $C_{20}$)alkenyl or vinyl; any of $R^5$ and $R^6$ or $R^7$ and $R^8$ can be taken together to form a ($C_1$ to $C_{10}$)alkylidenyl group, $R^5$ and $R^8$ when taken with the two ring carbon atoms to which they are attached can represent saturated or unsaturated cyclic groups containing 4 to 12 carbon atoms or an aromatic ring containing 6 to 17 carbon atoms; and p is 0, 1, 2, 3, 4 or 5. By "hydrocarbyl" is meant that the substituent is hydrogen or is composed solely of carbon and hydrogen atoms.

Illustrative examples of hydrocarbyl substituted monomers include 2-norbornene, 5-methyl-2-norbornene, 5-hexyl-2-norbornene, 5-decyl-2-norbornene, 5-phenyl-2-norbornene, 5-naphthyl-2-norbornene 5-ethylidene-2-norbornene, vinylnorbornene, dicyclopentadiene, dihydrodicyclopentadiene, tetracyclododecene, methyltetracyclododecene, tetracyclododecadiene, dimethyltetracyclododecene, ethyltetracyclododecene, ethylidenyl tetracyclododecene, phenyltetracyclododecene, trimers of cyclopentadiene (e.g., symmetrical and asymmetrical trimers).

An economical route for the preparation of the silyl functional (Formula I) or hydrocarbyl substituted (Formula II) polycyclic monomers of the invention relies on the Diels-Alder reaction in which cyclopentadiene (CPD) or substituted CPD is reacted with a suitably substituted dienophile at elevated temperatures to form a substituted polycyclic adduct generally shown by the following reaction scheme:

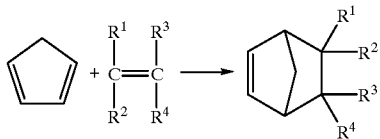

Other polycyclic adducts can be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adducts as shown below:

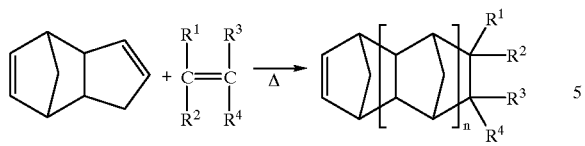

wherein $R^1$ to $R^4$ independently represents a silyl or hydrocarbyl group as defined under Formulae I and II above.

Polymers

One or more of the silyl substituted polycyclic monomers described under Formula I can be polymerized alone or in combination with one or more of the hydrocarbyl substituted polycyclic monomers described under Formula II. Accordingly, the present invention contemplates addition homopolymers and copolymers containing random repeating units derived from a monomer or monomers represented by Formula I, and addition copolymers containing random repeating units derived from a monomer(s) represented by Formulae I and II. Structurally, the foregoing polymers can be represented as follows:

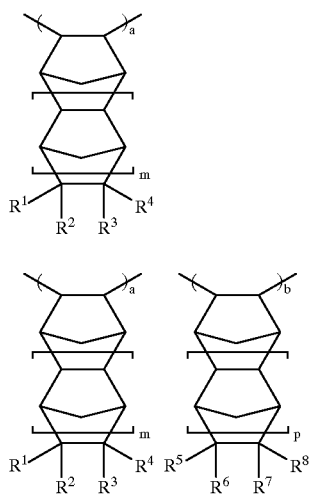

wherein $R^1$ to $R^8$, m, and p are the same as defined above, a and b, represent the number of repeating units derived from each respective monomer in the polymer chain.

Optionally, the polymers set forth under Formulae III and IV can be terminated with an olefinic end group. When the polycyclic monomers under Formula I in optional combination with the monomers described under Formula II are polymerized in the presence of the CTA's of this invention, polymers with olefinic end groups attached exclusively to the terminus thereof can be obtained. For example, when ethylene is employed as the CTA polymers of Formulae IIIa and IVa are obtained.

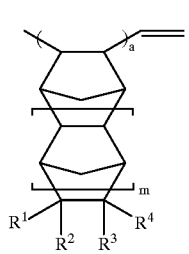

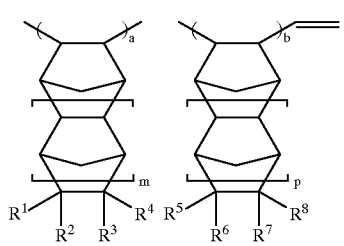

In Formulae IIIa and IVa, $R^1$ to $R^8$, m, p, a, and b are as defined above. As is apparent from the discussion above the foregoing polymers (other than homopolymers of structure I and Ia) are copolymers comprising statistically determined repeating units, therefore, the repeat units can be in any random order along the polymer chain or in a specific order allowing for block copolymer arrangements. Moreover, it should also be apparent that in Structures IIIa to IVa the olefinic end group will be attached to a silyl substituted polycyclic repeat unit or a hydrocarbyl substituted polycyclic repeat unit depending upon which polycyclic repeat unit is at the terminal end of the polymer chain.

By the term "derived" is meant that the polymeric repeating units are polymerized (formed) from at least one of the polycyclic monomers selected from Formula I, in optional combination with at least one polycyclic monomer of Formula II. The polymers can be addition polymerized in the presence of the catalyst systems of the invention.

The polymers of this invention can be classified by their solubility characteristics. In general, the nickel catalyzed polymers of this invention are readily soluble in hydrocarbons such as cyclohexane or toluene at room temperature. We have found in accordance with the literature that the prior art palladium catalyzed polymers are markedly less soluble. In general, these polymers must be heated in chlorinated aromatic solvents such as o-dichlorobenzene before any significant solubility is noted. While not intending to be bound by any specific theory, we believe that the difference in solubility between the nickel catalyzed polymers and the prior art palladium catalyzed polymers are due in all probability to differences in polymer microstructure.

The polymers of the present invention comprise polycyclic repeating units that are connected to one another via 2,3-linkages that are formed across the double bond contained in the norbornene moiety of the polycyclic monomer.

As will be discussed below, the differing repeating unit enchainment schemes can be controlled by the catalyst employed (e.g., the ligand field around the nickel metal, the solvent, and the counteranion employed).

The polymers of the present invention contain from about 0.1 to 100 mole percent of silyl functional polycyclic repeating units, preferably from about 1 to 50 mole percent, more preferably from about 3 to 25 mole percent, and most preferably from about 5 to 20 mole percent.

The present polymers have excellent physical properties, e.g., low moisture absorption (<0.1 weight percent), low dielectric constant (<2.6), low dielectric loss (0.001), excellent toughness (up to 10 percent or higher strain at break as measured on a BFGoodrich Portable Universal Tester™), good solubility in common nonhalogenated organic solvents such as cyclohexane, toluene, xylene, decalin, and the like, and excellent adhesive properties on alumina, silica, and especially on copper, silver, and gold.

The present polymers exhibit a broad range of Tg's from about 100° C. to about 400° C. The Tg's generally range from about 250° C. (i.e. 251) to 390° C. Preferably from at least 275° C., more preferably from at least 300° C., and most preferably from at least 340° C.

Surprisingly, we have found that the silyl functional addition polymers of this invention adhere tenaciously to copper and the noble metals such as silver, platinum, and gold. Moreover, we have also discovered that the present polymers get tougher with increasing levels of silyl functionality which functionality, we believe, acts as a crosslinker upon cure. Both of these phenomena are contrary to the teachings of the art. It is known that silyl functionalities bond very poorly if at all to copper and the noble metals such as gold. Additionally, it is also a well known fact that increased crosslink density increases the brittleness of a polymer.

Without wishing to be bound by theory of invention we believe that the polycyclic nature of the polymer backbone in combination with the silyl functionality that is pendant from the polycyclic repeating units produces a synergistic toughening effect and enables the polymer to adhere tenaciously to a variety of metal and inorganic substrates. In particular, we believe that it is regio- and stereo-chemistry of the polymer backbone which determines the distribution and orientation of the silyl functionalities which in turn governs the polymer's adhesive properties.

We have also found that toughness of the polymers can be improved by incorporating repeating units derived from 5-alkylnorbonene monomers such as 5-butylnorbornene and 5-hexylnorbornene.

Catalyst Systems

The foregoing polymer systems are polymerized from reaction mixtures comprising at least one silyl functional polycyclic monomer, a solvent, and a catalyst system containing a nickel ion source, and optionally a chain transfer agent. The catalyst system can be a preformed single component nickel based catalyst or a multicomponent nickel based catalyst.

Single Component Systems

The single component catalyst system of this invention comprises a nickel cation complex and a weakly coordinating counteranion as represented by the following formula:

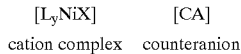

wherein L represents a ligand containing 1, 2, or 3 π-bonds; X represents a ligand containing 1 σ-bond and between 0 to 3 π-bonds; y is 0, 1, or 2. and CA is a weakly coordinating counteranion.

The phrase "weakly coordinating counteranion" refers to an anion which is only weakly coordinated to the cation, thereby remaining sufficiently labile to be displaced by a neutral Lewis base. More specifically the phrase refers to an anion which when functioning as a stabilizing anion in the catalyst system of this invention does not transfer an anionic substituent or fragment thereof to the cation, thereby forming a neutral product. The counteranion is non-oxidative, non-reducing, non-nucleophilic, and relatively inert.

L is a neutral ligand that is weakly coordinated to the nickel cation complex. In other words, the ligand is relatively inert and is readily displaced from the metal cation complex by the inserting monomer in the growing polymer chain. Suitable π-bond containing ligands include ($C_2$ to $C_{12}$) monoolefinic (e.g., 2,3-dimethyl-2-butene), diolefinic ($C_4$ to $C_{12}$) (e.g., norbornadiene) and ($C_6$ to $C_{20}$)aromatic moieties. Preferably ligand L is a chelating bidentate cyclo ($C_6$ to $C_{12}$)diolefin, for example cyclooctadiene (COD) or dibenzo COD, or an aromatic compound such as benzene, toluene, or mesitylene.

Ligand X is selected from (i) a moiety that provides a single nickel—carbon σ-bond (no π bonds) to the nickel in the cation complex or (ii) a moiety that provides a single nickel carbon σ-bond and 1 to 3 π-bonds to the nickel in the cation complex. Under embodiment (i) the moiety is bound to the nickel by a single nickel—carbon σ-bond and no π-bonds. Representative ligands defined under this embodiment include ($C_1$ to $C_{10}$)alkyl moieties selected from methyl, ethyl, linear and branched moieties such as propyl, butyl, pentyl, neopentyl, hexyl, heptyl, octyl, nonyl and decyl and ($C_7$ to $C_{15}$)aralkyl such as benzyl. Under embodiment (ii) generally defined above, the cation has a hydrocarbyl group directly bound to the nickel by a single nickel—carbon σ-bond, and also by at least one, but no more than three π-bonds. By hydrocarbyl is meant a group that is capable of stabilizing the nickel cation complex by providing a carbon—nickel σ-bond and one to three olefinic π-bonds that may be conjugated or non-conjugated. Representative hydrocarbyl groups are ($C_3$ to $C_{20}$)alkenyl which may be non-cyclic, monocyclic, or polycyclic and can be substituted with linear and branched ($C_1$ to $C_{20}$)alkoxy, ($C_6$ to $C_{15}$)aryloxy or halo groups (e.g., Cl and F).

Preferably X is a single allyl ligand, or, a canonical form thereof, which provides a σ-bond and a π-bond; or a compound providing at least one olefinic π-bond to the nickel, and a σ-bond to the nickel from a distal carbon atom, spaced apart from either olefinic carbon atom by at least two carbon—carbon single bonds embodiment (iii).

It should be readily apparent to those skilled in the art that when ligand L or X is absent, the nickel cation complex will be weakly ligated by the solvent in which the reaction was carried out. Representative solvents include but are not limited to halogenated hydrocarbons such as carbon tetrachloride, chloroform, dichloromethane, 1,2-dichloroethane and aromatic solvents such as benzene, toluene, mesitylene, chlorobenzene, and nitrobenzene, and the like. A more detailed discussion on appropriate solvents will follow.

Selected embodiments of the nickel cation complexes of the single component catalyst systems of this invention are shown below.

Structure VII illustrates embodiment (i) wherein ligand X is a methyl group that is bound to the nickel via a single nickel—carbon σ-bond, and ligand L is COD that is weakly coordinated to the nickel via two olefinic π-bonds.

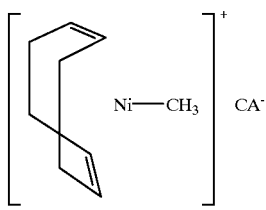

VII

Structures VIII, IX, and X below illustrate various examples of embodiment (ii) wherein X is an allyl group that is bound to the nickel atom via a single nickel—carbon σ-bond and at least one but no more than three π-bonds.

In Structure VIII, L is not present but an aromatic group providing three π-bonds is weakly coordinated to the nickel atom; X is an allyl group providing a single nickel—carbon σ-bond and an olefinic π-bond to the nickel atom.

In Structure IX, L is COD and X is an allyl group providing a nickel—carbon σ-bond and an olefinic π-bond to the nickel atom.

Structure X illustrates an embodiment wherein ligand X is an unsaturated hydrocarbon group that provides a nickel—carbon σ-bond, a conjugated π-bond and two additional π-bonds to the nickel atom; L is absent.

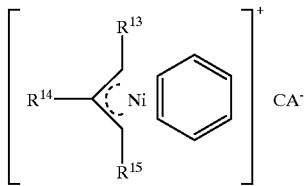

VIII

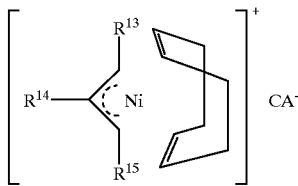

IX

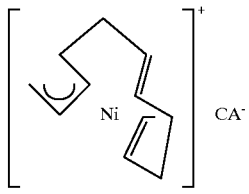

X

Substituents $R^{13}$, $R^{14}$, $R^{15}$ will be described in detail below.

Structures XI and XII illustrate examples of embodiment (iii) wherein L is COD and X is a ligand that provides at least one olefinic π-bond to the nickel atom and a σ-bond to the nickel atom from a distal carbon atom, spaced apart from either olefinic carbon atom by at least two carbon—carbon single bonds.

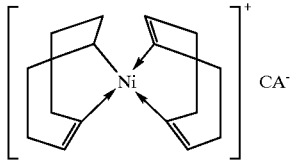

XI

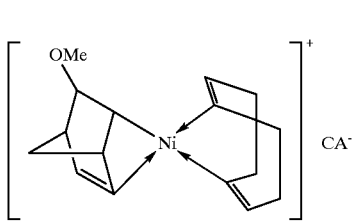

XII

The above-described nickel cation complexes are associated with a weakly coordinating or non-coordinating counteranion, CA⁻, which is relatively inert, a poor nucleophile and provides the cation complex with essential solubility in the reaction solvent. The key to proper anion design requires that it be labile, and stable and inert toward reactions with the cationic nickel complex in the final catalyst species and that it renders the single component catalyst soluble in the solvents of this invention. The anions which are stable toward reactions with water or Brønsted acids, and which do not have acidic protons located on the exterior of the anion (i.e., anionic complexes which do not react with strong acids or bases) possess the stability necessary to qualify as a stable anion for the catalyst system. The properties of the anion which are important for maximum lability include overall size, and shape (i.e., large radius of curvature), and nucleophilicity.

In general, a suitable anion may be any stable anion which allows the catalyst to be dissolved in a solvent of choice, and has the following attributes: (1) the anion should form stable salts with the aforementioned Lewis acid, Brønsted acids, reducible Lewis Acids, protonated Lewis bases, thallium and silver cations; (2) the negative charge on the anion should be delocalized over the framework of the anion or be localized within the core of the anion; (3) the anion should be a relatively poor nucleophile; and (4) the anion should not be a powerful reducing or oxidizing agent.

Anions that meet the foregoing criteria can be selected from the group consisting of a tetrafluoride of Ga, Al, or B; a hexafluoride of P, Sb, or As; perfluoro-acetates, propionates and butyrates, hydrated perchlorate; toluene sulfonates, and trifluoromethyl sulfonate; and substituted tetraphenyl borate wherein the phenyl ring is substituted with fluorine or trifluoromethyl moieties. Selected examples of counteranions include $BF_4^-$, $PF_6^-$, $AlF_3O_3SCF_3^-$, $SbF_6^-$, $SbF_5SO_3F^-$, $AsF_6^-$, trifluoroacetate ($CF_3CO_2^-$), pentafluoropropionate ($C_2F_5CO_2^-$), heptafluorobutyrate ($CF_3CF_2CF_2CO_2^-$), perchlorate ($ClO_4^- \cdot H_2O$), p-toluenesulfonate (p-$CH_3C_6H_4SO_3^-$) and tetraphenyl borates represented by the formula:

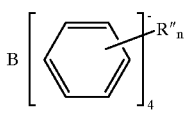

wherein R" independently represents hydrogen, fluorine and trifluoromethyl and n is 1 to 5.

Substituents $R^{13}$, $R^{14}$, and $R^{15}$ on the allyl group set forth above in Structures VIII, and IX and are each independently hydrogen, branched or unbranched ($C_1$ to $C_5$)alkyl such as methyl, ethyl, n-propyl, isopropyl, and t-butyl, ($C_6$ to $C_{14}$) aryl, such as phenyl and naphthyl, ($C_7$ to $C_{10}$)aralkyl such as benzyl, —$COOR^{16}$, —$(CH_2)_nOR^{16}$, Cl and ($C_5$ to $C_6$)cycloaliphatic, wherein $R^{16}$ is ($C_1$ to $C_5$)alkyl, such as methyl, ethyl, n-propyl, isopropyl, n-butyl and i-butyl, and n is 1 to 5.

Optionally, any two of $R^{13}$, $R^{14}$, and $R^{15}$ may be linked together to form a cyclic- or multi-cyclic ring structure. The cyclic ring structure can be carbocyclic or heterocyclic. Preferably any two of $R^{13}$, $R^{14}$, and $R^{15}$ taken together with the carbon atoms to which they are attached form rings of 5 to 20 atoms.

Multicomponent Systems

The multicomponent catalyst system embodiment of the present invention comprises a nickel ion source, in combination with one or both of an organometal cocatalyst and a third component. The cocatalyst is selected from organoaluminum compounds, dialkylaluminum hydrides, dialkyl zinc compounds, dialkyl magnesium compounds, and alkyllithium compounds.

There are no restrictions on the nickel compound so long as it provides a source of catalytically active nickel ions. Preferably, the nickel compound is soluble or can be made to be soluble in the reaction medium.

The nickel compound comprises ionic and/or neutral ligand(s) bound to the nickel atom. The ionic and neutral ligands can be selected from a variety of monodentate, bidentate, or multidentate moieties and combinations thereof.

Representative of the ionic ligands that can be bonded to the nickel to form the nickel compound are anionic ligands selected from the halides such as chloride, bromide, iodide or fluoride ions; pseudohalides such as cyanide, cyanate, thiocyanate, hydride; carbanions such as branched and unbranched ($C_1$ to $C_{40}$)alkylanions, phenyl anions; cyclopentadienylide anions; π-allyl groupings; enolates of β-dicarbonyl compounds such as acetylacetonate (4-pentanedionate), 2,2,6,6-tetramethyl-3,5-heptanedionate, and halogenated acetylacetonoates such as 1,1,1,5,5,5-hexafluoro-2,4-pentanedionate, 1,1,1-trifluoro-2,4,4-pentanedionate; anions of acidic oxides of carbon such as carboxylates and halogenated carboxylates (e.g., acetates, 2-ethylhexanoate, neodecanoate, trifluoroacetate, etc.) and oxides of nitrogen (e.g., nitrates, nitrites, etc.) of bismuth (e.g., bismuthate, etc.), of aluminum (e.g., aluminates, etc.), of silicon (e.g., silicate, etc.), of phosphorous (e.g., phosphates, phosphites, phosphines, etc.) of sulfur (e.g., sulfates such as triflate, p-toluene sulfonate, sulfites, etc.); ylides; amides; imides; oxides; phosphides; sulfides; ($C_6$ to $C_{24}$)aryloxides, ($C_1$ to $C_{20}$)alkoxides, hydroxide, hydroxy ($C_1$ to $C_{20}$)alkyl; catechols; oxalate; chelating alkoxides and aryloxides. Nickel compounds can also contain complex anions such as $PF_6^-$, $AlF_3O_3SCF_3^-$, $SbF_6^-$ and compounds represented by the formulae:

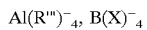

wherein R''' and X independently represent a halogen atom selected from Cl, F, I, and Br, or a substituted or unsubstituted hydrocarbyl group. Representative of hydrocarbyl are ($C_1$ to $C_{25}$)alkyl such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonodecyl, eicosyl, heneicosyl, docosyl, tricosyl, tetracosyl, pentacosyl, and isomeric forms thereof, ($C_2$ to $C_{25}$)alkenyl such as vinyl, allyl, crotyl, butenyl, pentenyl, hexenyl, octenyl, nonenyl, decenyl, undecenyl, dodecenyl, tridecenyl, tetradecenyl pentadecenyl, hexadecenyl, heptadecenyl, octadecenyl, nonadecenyl, pentacosenyl, and isomeric forms thereof. ($C_6$ to $C_{25}$)aryl such as phenyl, tolyl, xylyl, naphthyl, and the like; ($C_7$ to $C_{25}$)aralkyl such as benzyl, phenethyl, phenpropyl, phenbutyl, phenhexyl, napthoctyl, and the like; ($C_3$ to $C_8$)cycloalkyl such as cyclopropyl, cyclobutyl, cyclopentyl, cyclohexyl, cycloheptyl, cyclooctyl, 2-norbornyl, 2-norbornenyl, and the like. In addition to the above definitions X represents the radical:

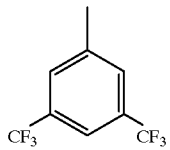

The term "substituted hydrocarbyl" means the hydrocarbyl group as previously defined wherein one or more hydrogen atoms have been replaced with a halogen atom such as Cl, F, Br, and I (e.g., as in the perfluorophenyl radical); hydroxyl; amino; alkyl; nitro; mercapto, and the like.

The nickel compounds can also contain cations such as, for example, organoammonium, organoarsonium, organophosphonium, and pyridinium compounds represented by the formulae:

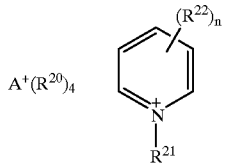

wherein A represents nitrogen, arsenic, and phosphorous and the $R^{20}$ radical can be independently selected from hydrogen, branched or unbranched ($C_1$ to $C_{20}$)alkyl, branched or unbranched ($C_2$ to $C_{20}$)alkenyl, and ($C_5$ to $C_{16}$)cycloalkyl, e.g., cyclopentyl, cyclohexyl, cycloheptyl, cyclooctyl, and the like. $R^{21}$ and $R^{22}$ are independently selected from hydrogen, branched and unbranched ($C_1$ to $C_5$)alkyl, linear and branched ($C_2$ to $C_{50}$)alkenyl and ($C_5$ to $C_{16}$)cycloalkyl groups as defined above; and n is 1 to 5, preferably n is 1, 2, or 3, most preferably n is 1. The $R^{22}$ radicals preferably are attached to positions 3, 4, and 5 on the pyridine ring.

It should be noted that increasing the sum of the carbon atoms contained in the $R^{20}$ radicals confers better solubility of the transition metal compound in organic media such as organic solvents and polycyclic the monomer. Preferably, the $R^{20}$ radicals are selected from ($C_1$ to $C_{18}$)alkyl groups wherein the sum of carbon atoms for all $R^{20}$ radicals is 15 to 72, preferably 25 to 48, more preferably 21 to 42. The $R^{21}$ radical is preferably selected from linear and branched ($C_1$ to $C_{50}$)alkyl, more preferably ($C_{10}$ to $C_{40}$)alkyl. $R^{22}$ is preferably selected from linear and branched ($C_1$ to $C_{40}$) alkyl, more preferably ($C_2$ to $C_{30}$)alkyl.

Specific examples of organoammonium cations include tridodecylammonium, methyltricaprylammonium, tris (tridecyl)ammonium and trioctylammonium. Specific examples of organoarsonium and organophosphonium cations include tridodecylarsonium and phosphonium, methyltricaprylarsonium and phosphonium, tris(tridecyl)arsonium and phosphonium, and trioctylarsonium and phosphonium. Specific pyridinium cations include eicosyl-4-(1-butylpentyl)pyridinium, docosyl-4-(13-pentacosyl) pyridinium, and eicosyl-4-(1-butylpentyl)pyridinium.

Suitable neutral ligands which can be bonded to the nickel are the olefins; the acetylenes; carbon monoxide; nitric oxide, nitrogen compounds such as ammonia, alkylisocyanide, alkylisocyanate, alkylisothiocyanate; pyridines and pyridine derivatives (e.g., I,10-phenanthroline, 2,2'-dipyridyl), 1,4-dialkyl-1,3-diazabutadienes, 1,4-diaryl-1,3-diazabutadienes and amines such as represented by the formulae:

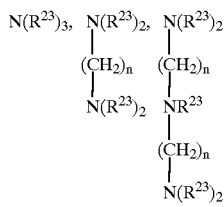

wherein $R^{23}$ is independently hydrocarbyl or substituted hydrocarbyl as previously defined and n is 2 to 10. Ureas; nitriles such as acetonitrile, benzonitrile and halogenated derivatives thereof; organic ethers such as dimethyl ether of diethylene glycol, dioxane, tetrahydrofuran, furan diallyl ether, diethyl ether, cyclic ethers such as diethylene glycol cyclic oligomers; organic sulfides such as thioethers (diethyl sulfide); arsines; stibines; phosphines such as triarylphosphines (e.g., triphenylphosphine), trialkylphosphines (e.g., trimethyl, triethyl, tripropyl, tripentacosyl, and halogenated derivatives thereof), bis(diphenylphosphino)ethane, bis (diphenylphosphino)propane, bis(dimethylphosphino) propane, bis(diphenylphosphino)butane, (S)-(–)2,2'-bis (diphenylphosphino)-1,1'-binaphthyl, (R)-(+)-2,2'-bis (diphenylphosphino)-1,1'-binaphthyl, and bis(2-diphenylphosphinoethyl)phenylphosphine; phosphine oxides, phosphorus halides; phosphites represented by the formula:

$$P(OR^{23})_3$$

wherein $R^{23}$ independently represents a hydrocarbyl or substituted hydrocarbyl as previously defined; phosphorus oxyhalides; phosphonates; phosphonites, phosphinites, ketones; sulfoxides such as ($C_1$ to $C_{20}$)alkylsulfoxides; ($C_6$ to $C_{20}$)arylsulfoxides, ($C_7$ to $C_{40}$)alkarylsulfoxides, and the like. It should be recognized that the foregoing neutral ligands can be utilized as optional third components as will be described hereinbelow.

Examples of nickel containing compounds suitable as the nickel ion source include: nickel acetylacetonates, nickel carboxylates, nickel dimethylglyoxime, nickel ethylhexanoate, $NiCl_2(PPh_3)_2$, $NiCl_2(PPh_2CH_2)_2$, $(P(cyclohexyl)_3)H$ $Ni(Ph_2P(C_6H_4)CO_2(PPh_3)(C_6H_5)Ni$ $(Ph_2PCH=C(O)Ph)$, bis(2,2,6,6-tetramethyl-3,5-heptanedionate) nickel (II), nickel (II) hexafluoroacetylacetonate tetrahydrate, nickel (II) trifluoroacetylacetonate dihydrate, nickel (II) acetylacetonate tetrahydrate, nickelocene, nickel (II) acetate, nickel bromide, nickel chloride, dichlorohexyl nickel acetate, nickel lactate, nickel oxide, nickel tetrafluoroborate, bis(allyl)nickel, and bis (cyclopentadienyl)nickel. The organoaluminum component of the multicomponent catalyst system of the present invention is represented by the formula:

$$AlR^{24}_{3-x}Q_x$$

wherein $R^{24}$ independently represents linear and branched ($C_1$ to $C_{20}$)alkyl, ($C_6$ to $C_{24}$)aryl, ($C_7$ to $C_{20}$)aralkyl, ($C_3$ to $C_{10}$)cycloalkyl; Q is a halide or pseudohalide selected from chlorine, fluorine, bromine, iodine, linear and branched ($C_1$ to $C_{20}$)alkoxy, ($C_6$ to $C_{24}$)aryloxy; and x is 0 to 2.5, preferably 0 to 2.

Representative organoaluminum compounds include trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum, tris-2-norbornylaluminum, and the like; dialkylaluminum halides such as dimethylaluminum chloride, diethylaluminum chloride, diisopropylaluminum chloride, diisobutylaluminum chloride, and the like;

monoalkylaluminum dihalides such as methylaluminum dichloride, ethylaluminum dichloride, ethylaluminum diiodide, propylaluminum dichloride, isopropylaluminum dichloride, butylaluminum dichloride, isobutylaluminum dichloride, and the like; and alkylaluminum sesquihalides such as methylaluminum sesquichloride, ethylaluminum sesquichloride, propylaluminum sesquichloride, isobutylaluminum sesquichloride, and the like.

The dialkylaluminum hydride is selected from linear and branched ($C_1$ to $C_{10}$)dialkylaluminum hydride, with diisobutylaluminum hydride being a preferred dialkylaluminum hydride compound.

The dialkyl zinc compounds are selected from linear and branched ($C_1$ to $C_{10}$)dialkyl zinc compounds with diethyl zinc being preferred. The dialkyl magnesium compounds are selected from linear and branched ($C_1$ to $C_{10}$)dialkyl magnesium with dibutyl magnesium being the most preferred. The alkyl lithiums are selected from linear and branched ($C_1$ to $C_{10}$)alkyl lithium compounds. Butyllithium is the preferred alkyl lithium.

In the practice of the present invention, the catalytic system obtained from the nickel ion source is utilized with one or both of a component selected from the group of cocatalyst compounds, and third component compounds.

Examples of third components are Lewis acids such as the $BF_3$.etherate, $TiCl_4$, $SbF_5$, tris(perfluorophenyl)boron, tris (3,5-di(trifluoromethyl)phenyl) boron, $BCl_3$, $B(OCH_2 CH_3)_3$; strong Brønsted acids such as hexafluoroantimonic acid ($HSbF_6$), $HPF_6$ hydrate, trifluoroacetic acid ($CF_3CO_2H$), and $FSO_3H.SbF_5$, $H_2C(SO_2CF_3)_2$ $CF_3SO_3H$, and paratoluenesulfonic acid; halogenated compounds such as hexachloroacetone, hexafluoroacetone, 3-butenoic acid-2,2,3,4,4-pentachlorobutylester, hexafluoroglutaric acid, hexafluoroisopropanol, and chloranil, i.e.,

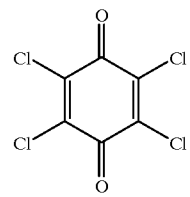

electron donors such as phosphines and phosphites and olefinic electron donors selected from ($C_4$ to $C_{12}$)aliphatic and ($C_6$ to $C_{12}$)cycloaliphatic diolefins, such as butadiene, cyclooctadiene, and norbornadiene.

Acidity of strong Brønsted acids can be gauged by determining their Hammet acidity function $H_0$. A definition of the Hammet acidity function is found in *Advanced Inorganic Chemistry* by F. A. Cotton and G. Wilkinson, Wiley-Interscience, 1988, p. 107.

As set forth above the neutral ligands can be employed as optional third components with electron donating properties.

In one embodiment of the invention, the multicomponent catalyst system can be prepared by a process which comprises mixing the catalyst components, i.e., the nickel compound, the cocatalyst compound, and third component (if employed), together in a hydrocarbon or halohydrocarbon solvent and then mixing the premixed catalyst system in the reaction medium comprising at least one silyl functional polycyclic monomer. Alternatively, (assuming the optional third component is utilized), any two of the catalyst system components can be premixed in a hydrocarbon or halohydrocarbon solvent and then introduced into the reaction medium. The remaining catalyst component can be added to the reaction medium before or after the addition of the premixed components.

In another embodiment, the multicomponent catalyst system can be prepared in situ by mixing together all of the catalyst components in the reaction medium. The order of addition is not important.

In one embodiment of the multicomponent catalyst system of the present invention, a typical catalyst system comprises a nickel salt, e.g., nickel ethylhexanoate, an organoaluminum compound, e.g., triethylaluminum, and a mixture of third components, e.g., $BF_3$.etherate and hexafluoroantimonic acid ($HSbF_6$), in a preferred molar ratio of $Al/BF_3$.etherate/Ni/acid of 10/9/1/0.5–2. The reaction scheme is written as follows:

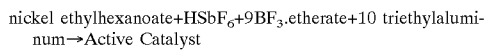

nickel ethylhexanoate+$HSbF_6$+9$BF_3$.etherate+10 triethylaluminum→Active Catalyst     1.

In another embodiment of the multicomponent catalyst system of the invention, the catalyst system comprises a nickel salt, e.g., nickel ethylhexanoate, an organoaluminum compound, e.g., triethylaluminum, and a third component Lewis acid, e.g., tris(perfluorophenyl)boron as shown in the following scheme:

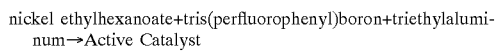

nickel ethylhexanoate+tris(perfluorophenyl)boron+triethylaluminum→Active Catalyst     2.

In another embodiment of the multicomponent catalyst system of the invention the third component is a halogenated compound selected from various halogenated activators. A typical catalyst system comprises a nickel salt, an organoaluminum, and a third component halogenated compound as shown below:

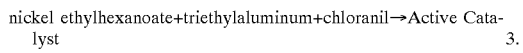

nickel ethylhexanoate+triethylaluminum+chloranil→Active Catalyst     3.

In still another embodiment of the multicomponent catalyst system of this invention no cocatalyst is present. The catalyst system comprises a nickel salt (e.g. $\pi^3$-allylnickelbromide dimer and a Lewis acid (e.g. tris(perfluorophenyl)boron as shown below:

$\pi^3$-allylnickel chloride+tris(perfluorophenyl)boron→Active Catalyst     4.

We have found that the choice of nickel cation complex of both the single and multicomponent catalyst systems of this invention influences the physical properties of the polymers obtained. As discussed previously, we have found that the palladium catalyzed polymers markedly less soluble in common organic solvents than the nickel catalyzed polymers. In general, the palladium catalyzed polymers must be heated in chlorinated solvents such as o-dichlorobenzene or trichlorobezene before any significant solubility is achieved. In sharp contrast, the nickel catalyzed polymers of this invention are generally soluble in common nonhalogenated hydrocarbon solvents such as cyclohexane at room temperature (i.e., 25° C.). We believe that the differences in solubility are due in all probability to differences in microstructure between the two types of polymers.

Reactions utilizing the single and multicomponent catalysts of the present invention are carried out in an organic solvent which does not adversely interfere with the catalyst system and is a solvent for the monomer. Examples of organic solvents are aliphatic (non-polar) hydrocarbons such as pentane, hexane, heptane, octane and decane; alicyclic hydrocarbons such as cyclopentane and cyclohexane; aromatic hydrocarbons such as benzene, chlorobenzene, o-dichlorobenzene, toluene, and xylenes; halogenated (polar) hydrocarbons such as methylene chloride, chloroform, carbon tetrachloride, ethyl chloride, 1,1-dichloroethane, 1,2-dichloroethane, 1,2-dichloroethylene, I-chloropropane, 2-chloropropane, 1-chlorobutane, 2-chlorobutane, 1-chloro-2-methylpropane, and 1-chloropentane.

The choice of reaction solvent is made on the basis of a number of factors including the choice of catalyst and whether it is desired to run the polymerization as a slurry or solution process. For most of the catalysts described in this invention, the preferred solvents are chlorinated hydrocarbons such as methylene chloride and 1,2-dichloroethane and aromatic hydrocarbons such as chlorobenzene, with simple hydrocarbons being less preferred due to the resulting lower conversion of the functional NB-type monomer(s). Surprisingly we have discovered that certain of the catalyst systems, most notably the multicomponent catalysts based on nickel compounds and alkylaluminum halides, specifically, monoalkylaluminum dihalides, (e.g., ethylaluminum dichloride), and the Type II catalysts referred to above also give excellent results (and high monomer conversion) when run in simple hydrocarbons such as heptane, cyclohexane, and toluene.

The molar ratio of total monomer to nickel metal for the single and multicomponent catalysts can run from 20:1 to 100,000:1, preferably 100:1 to 20,000:1, and most preferably 200:1 to 10,000:1.

In the multicomponent catalyst systems, the cocatalyst metal (e.g., aluminum, zinc, magnesium, and lithium) to nickel metal molar ratio ranges from less than or equal to 100:1, preferably less than or equal to 30:1, and most preferably less than or equal to 20:1.

The third component is employed in a molar ratio to nickel metal ranging from 0.25:1 to 20:1. When Brønsted acids are employed as third components, the acid to nickel metal range is less than or equal to 4:1, preferably less than or equal to 2:1.

The temperature at which the polymerization reactions of the present invention are carried out typically ranges from −100° C. to 120° C., preferably −60° C. to 90° C., and most preferably −10° C. to 80° C.

The optimum temperature for the present invention is dependent on a number of variables, primarily the choice of catalyst and the choice of reaction diluent. Thus, for any given polymerization the optimum temperature will be experimentally determined taking these variables into account.

To control the rate of the polymerization reactions carried out with the single or multicomponent catalyst systems of this invention, a suitable monomer to catalyst molar ratio is selected, the reactor can be cooled to slow down the reaction, and the reaction can be carried out in a high boiling solvent. By high boiling solvent is meant that the solvent has a boiling point above the polymerization temperature. If a pressure reaction vessel is employed to contain the polymerization reaction, the foregoing considerations do not have to be taken into account.

The polymers obtained by the process of the present invention are produced in a molecular weight ($M_n$) range from about 10,000 to about 1,000,000, preferably from about 20,000 to about 700,000, and more preferably from about 30,000 to about 500,000.

Molecular weight can be controlled by changing the catalyst to monomer ratio, i.e., by changing the initiator to monomer ratio. Lower molecular weight polymers and oligomers may also be formed in the range from about 500 to about 500,000 by carrying out the polymerization in the presence of a chain transfer agent. Macromonomers or oligomers comprising from 4 to 50 repeating units can be prepared in the presence of a CTA (Chain Transfer Agent) selected from a compound having a terminal olefinic double bond between adjacent carbon atoms, wherein at least one of the adjacent carbon atoms has two hydrogen atoms attached thereto. The CTA is exclusive of styrenes (non-styrenes), vinyl ethers (non-vinyl ether) and conjugated dienes. By non-styrenic, non-vinyl ether is meant that compounds having the following structures are excluded from the chain transfer agents of this invention:

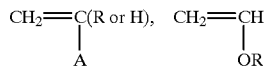

wherein A is an aromatic substituent and R is hydrocarbyl.

The preferred CTA compounds of this invention are represented by the following formula:

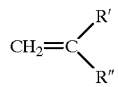

wherein R' and R" independently represent hydrogen, branched or unbranched ($C_1$ to $C_{40}$)alkyl, branched or unbranched ($C_2$ to $C_{40}$)alkenyl, halogen, or the group ——$CH_2(CH_2)_{\overline{n}}$——$OR'''$ ——$Si(OR''')_3$ ——$(CH_2)_{\overline{n}}$——$Si(OR''')_3$ ——$(CH_2)_{\overline{n}}$——$OSi(R''')_3$ ——$CH_2(CH_2)_{\overline{n}}$——$OH$ ——$CH_2(CH_2)_{\overline{n}}$——$NCO$ ——$(CH_2)_{\overline{n}}$——$X$ ——$O$—$\overset{\overset{O}{\|}}{C}$—$CX_3$

——$CO_2$——$R'''$

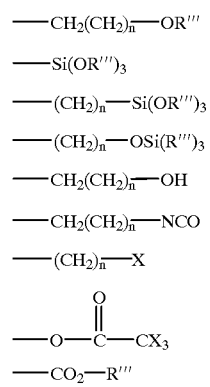

wherein R''' is branched or unbranched ($C_1$ to $C_{10}$)alkyl, preferably methyl or ethyl, branched or unbranched ($C_3$–$C_{90}$)alkenyl, substituted or unsubstituted ($C_6$–$C_{15}$)aryl wherein said substituents if present are selected from branched or unbranched ($C_1$–$C_{10}$)alkyl or haloalkyl, and halogen, X is chlorine, fluorine, bromine or iodine, and n is 0 to 20, preferably 1 to 5.

Of the above chain transfer agents the α-olefins having 2 to 10 carbon atoms are preferred, e.g., ethylene, propylene, 4-methyl-1-pentene, 1-hexene, 1-decene, 1,7-octadiene, and 1,6-octadiene, or isobutylene.

While the optimum conditions for any given result should be experimentally determined by a skilled artisan taking into the account all of the above factors there are a number of general guidelines which can be conveniently utilized where appropriate. We have learned that, in general, α-olefins (e.g., ethylene, propylene, 1-hexene, 1-decene, 4-methyl-1-pentene) are the most effective chain transfer agents with 1,1-disubstituted olefins (e.g., isobutylene) being less efficient. In other words, all other things being equal, the concentration of isobutylene required to achieve a given molecular weight will be much higher than if ethylene were chosen. Styrenic olefins, conjugated dienes, and vinyl ethers are not effective as chain transfer agents due to their propensity to polymerize with the catalysts described herein.

The CTA can be employed in an amount ranging from about 0.10 mole % to over 50 mole % relative to the moles of total NB-type monomer. Preferably, the CTA is employed in the range of 0.10 to 10 mole %, and more preferably from 0.1 to 5.0 mole %. As discussed above, depending on catalyst type and sensitivities, CTA efficiencies and desired end group, the concentration of CTA can be in excess of 50 mole % (based on total NB-functional monomer present), e.g., 60 to 80 mole %. Higher concentrations of CTA (e.g., greater than 100 mole %) may be necessary to achieve the low molecular weight embodiments of this invention such as in oligomer and macromonomer applications. It is important and surprising to note that even such high concentrations the CTA's (with the exception of isobutylene) do not copolymerize into the polymer backbone but rather insert as terminal end-groups on each polymer chain. Besides chain transfer, the process of the present invention affords a way by which a terminal α-olefinic end group can be placed at the end of a polymer chain.

As previously discussed, polymers produced in the presence of a CTA of this invention have an olefinic end group attached to a terminal end thereof as shown in structures IIIa, and IVa above.

Polymers of the present invention that are prepared in the presence of the instant CTA's have molecular weights ($M_n$) ranging from about 5,000 to about 500,000, preferably from about 10,000 to about 300,000, and most preferably from about 20,000 to about 200,000.

The photodefinable compositions of the present invention comprise the foregoing silyl functionalized addition polymerized polycyclic component, a solvent, and a photoinitiator component. Any suitable photoinitiator can be employed so long as it induces the hydrolysis and the subsequent curing and substrate adhesion of the silyl functionalized polycyclic polymer. Aromatic bisazides, diamine generating compounds, and photoacid generating compounds are examples of suitable photoinitiators.

Examples of the aromatic bisazides are 4,4'-diazidocalchone, 2-6-bis(4'-azidobenzyl)4-methylcyclohexanone, 4,4'-diazidodiphenylsulfone, 4,4'diazidobenzophenone, 4,4'diazidodiphenyl, 2,2'-diazidostilbene, 4,4'-diazido-3,3'-dimethyldiphenyl, 2,7-diazidofluorene, 4,4'-diazidodiphenylmethane, 2,6-di-(p-azidobenzyl)-4-tert.amylcyclohexanone, 4,4'-diazidochalcon-2-[N,N-di-(2-ethoxyethyl)sulfonamide], 4,4'-diazidostilbene-2,2'-[N,N-di-(2-ethoxyethyl) sulfonamide], and 2,6-di-(p-azidobenzyl)-4-ethyl cyclohexanone. One or more of the foregoing compositions can be employed.

Examples of diamine generating compounds are aromatic or aliphatic o-nitrobenzyloxycarbonyl carbamate, 2,6-dinitrobenzyloxycarbonyl carbamate, and $\alpha,\alpha$-dimethyl-3,5-dimethoxybenzyloxycarbonyl carbamate are compounds that produce diamines when irradiated with light. Actual examples are aniline, cyclohexylamine, piperidine, hexamethylenediamine, triethylenetetramine, 1,3-(diaminomethyl)cyclohexane, 4,4'-diaminodiphenyl ether, 4,4'-diaminodiphenyl methane, phenylenediamine, o-nitrobenzyloxycarbonyl carbamate, 2,6-dinitrobenzyloxycarbonyl carbamate, and $\alpha,\alpha$-dimethyl-3,5-dimethoxybenzyloxycarbonyl carbamate. One or more of these compositions can be employed as suitable photoinitiators.

Examples of the photoacids are onium salts, halogenated organic compounds, quinone diazide compounds, $\alpha,\alpha$-bis(sulfonyl)diazomethane compounds, $\alpha$-carbonyl-$\alpha$-sulfonyl diazomethane compounds, sulfone compounds, organic acid ester compounds, organic acid amide compounds, organic acid imide compounds, etc. Actual examples of onium salts are unsubstituted or symmetrically or asymmetrically substituted alkyl groups, alkenyl groups, aralkyl groups, aromatic groups, diazonium salts with heterocyclic groups, ammonium salts, iodonium salts, sulfonium salts, phosphonium salts, arsonium salts, oxonium salts, etc. There are no restrictions to the counter anions of these onium salts as long as they are compounds that can form counter anions. Examples are boric acid, arsenic acid, phosphoric acid, antimonic acid, sulfonic acid, carboxylic acid, and their halides. There are no special restrictions to the halogenated organic compound as long as they are halides of organic compounds, and a variety of conventional compounds can be employed. Actual examples include halogen-containing oxadiazole compounds, halogen-containing triazine compounds, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrone compounds, halogen-containing aliphatic hydrocarbon compounds, halogen-containing aliphatic hydrocarbon compounds, other halogen-containing heterocyclic compounds, sulfonyl halide compounds, etc. Halogen-containing flame retarders, such as tris(2,3-dibromopropyl) phosphenate, tris(2,3-dibromo-3-chloropropyl)phosphenate, chlorotetrabromoethane, hexachlorobenzene, hexabromobenzene, hexabromocyclododecane, hexabromobiphenyltribromophenyl aryl ether, tetrachlorobisphenol A, tetrabromobisphenyl A, bis(bromoethyl ether) tetrabromobisphenol A, bis(chloroethyl ether) tetrachlorobisphenol A, tris (2,3-dibromopropyl) isocyanurate, 2,2-bis(4-hydroxy-3,5-dibromophenyl) propane, 2,2-bis(4-hydroxyethoxy-2,4-dibromophenyl) propane, etc.; and organochlorine compounds, such as dichlorodiphenyltrichloroethane, benzene hexachloride, pentachlorophenol, 2,4,6-trichlorophenyl-4-nitrophenyl ether, 2,4-dichlorophenyl-3'-methoxy-4'-nitrophenyl ether, 2,4-dichlorophenoxyacetate, 4,5,6,7-tetrachlorosulfide, 1,1-bis(4-chlorophenyl)ethanol, 1,1-bis(4-chlorophenyl-2,2,2-trichloroethanol, ethyl-4,4-dichlorobenzoate, 2,4,5,4'-tetrachlorodiphenyl sulfide, 2,4,5,4'-tetrachlorodiphenylsulfone. Actual examples of o-quinone diazide compounds are 1,2-benzoquinone diazido-4-sulfonic acid ester, 1,2-naphthoquinone diazido-4-sulfonic acid ester, 1,2-naphthoquinone diazido-5-sulfonic acid ester, 1,2-naphthoquinone diazido-6-sulfonic acid ester, 2,1-naphthoquinone diazido-4-sulfonic acid ester, 2,1-naphthoquinone diazido-5-sulfonic acid ester, 2,1-naphthoquinone diazido-6-sulfonic acid ester, other quinone diazido derivative sulfonic acid esters, 1,2-benzoquinone diazido-4-sulfonic acid chloride, 1,2-naphthoquinone diazido-4-sulfonic acid chloride, 1,2-naphthoquinone diazido-5-sulfonic acid chloride, 1,2-naphthoquinone diazido-6-sulfonic acid chloride, 2,1-naphthoquinone diazido-4-sulfonic acid chloride, 2,1-naphthoquinone diazido-5-sulfonic acid chloride, 2,1-naphthoquinone diazido-6-sulfonic acid chloride, and other quinone diazide derivative sulfonic acid chlorides. Examples of $\alpha,\alpha$-bis(sulfonyl)diazomethane compounds are unsubstituted or symmetrically or asymmetrically substituted $\alpha,\alpha$-bis(sulfonyl)diazomethane with alkyl groups, alkenyl groups, aralkyl groups, aromatic groups, or heterocyclic groups, etc. Actual examples of $\alpha$-carbonyl-$\alpha$-sulfonyl diazomethane compounds are unsubstituted or symmetrically or asymmetrically substituted $\alpha$-carbonyl-$\alpha$-sulfonyl diazomethane with alkyl groups, alkenyl groups, aralkyl groups, aromatic groups, or heterocyclic groups. Actual examples of sulfone compounds are non-substituted or symmetrically or asymmetrically substituted sulfone compounds or disulfone compounds with alkyl groups, alkenyl groups, aralkyl groups, aromatic groups or heterocyclic groups. Actual examples of organic acid esters are unsubstituted or symmetrically or asymmetrically substituted carboxylic acid esters, sulfonic acid esters, etc., with alkyl groups, alkenyl groups, aralkyl groups, aromatic groups or heterocyclic groups. Actual examples of organic acid amide groups are unsubstituted or symmetrically or asymmetrically substituted carboxylic acid amides, sulfonic acid amides, etc., with alkyl groups, alkenyl groups, aralkyl groups, aromatic groups, or heterocyclic groups. Actual examples of organic imides are unsubstituted or symmetrically or asymmetrically substituted carboxylic acid imides, sulfonic acid imides, etc., with alkyl groups, alkenyl groups, aralkyl groups, aromatic groups, or heterocyclic groups. One or more of the photoacid photoinitiators can be utilized in the present compositions.

The photoinitiator component(s) is employed in an amount ranging from about 0.1 part to 100 parts by weight per 100 parts by weight of silyl functionalized polymer, preferably, 0.1 to 10 parts by wieght per 100 parts by weight of polymer.

In one embodiment of the present invention the photodefinable composition is deposited on the desired substrate as a coating from solution. The present polymers (particularly the Type II nickel catalyzed compositions) have good solubility in common organic solvents and can be cast as films using methods known to those skilled in the art, such as spin coating, dip coating, brush coating, roller coating, spray coating, solution casting, fluidized bed deposition, electrocoating, vacuum deposition, extrusion coating, curtain coating, meniscus coating, and the like. Generally, spin coating is preferred due to its simplicity and high uniformity. Cast films have superior properties such as toughness, craze resistance to solvents, and adhesion among other properties.

For spin coating, the polymer is first isolated from the reaction medium and purified to remove spent catalyst system components. The purified polymer is then redissolved in a nonhalogenated organic solvent. It should be noted that the polymers of the present invention can also be dissolved in halogenated solvents, however, these solvents are avoided in the microelectronics industry. Suitable solvents include cyclohexane, toluene, xylene, and decalin. The polymer solution has a preferred solids content of from 5 to 50 wt. % in solvent. Most preferably, the solids content ranges from 5 to 30 wt. %. Solution viscosities can range from 10 to 50,000 centipoise (cp). The photoinitiator and desired additives such as photosensitizers, storage stabilizers and the like can be added to the spin coating solution at this point. Photoinitiator sensitizers include polycyclic aromatics such as pyrene and perlene. The sensitization of photoacid initiators is described in U.S. Pat. Nos. 4,250,053; 4,371,605; and 4,491,628 which are herein incorporated by reference.

The casting solution is then spin coated onto the desired substrate at spin speeds ranging from 200 to 5,000 revolutions per minute (rpm) for periods ranging from 20 to 200 seconds. Film thickness is a function of spin speed and time. Generally, the films have a thickness of 0.2 to 50 microns, although thicker films, up to 500 microns, are possible when employing other coating techniques. The spun film is heated to an elevated temperature of about 90° C. to 150° C. for a short period of time of about 1 to 10 min. The film is imaged through a photomask by electron beam or electromagnetic radiation such as x-ray, ultraviolet or visible radiation. Suitable radiation sources include mercury, mercury/xenon, and xenon lamps, x-ray or e-beam. The radiation is absorbed by the radiation-sensitive photoinitiator which then becomes active inducing hydrolysis of the hydrolyzable substituents on the silicon atom of the silyl group to effect subsequent polymer curing and substrate adhesion. In the case of the preferred photoacid initiators, the photoacid (upon exposure to radiation) produces a free acid in the exposed area of the polymer. The free acid catalyzes the cleavage of the hydrolyzable groups on the silicon atom of the silyl group which induces curing of the polymer converting the polymer from a solvent soluble state to a solvent insoluble state in the exposed areas. The soluble areas (nonexposed areas of the polymer) are easily removed with an appropriate solvent developer. If desired, the film can be post cured at a temperature of about 90° C. to 200° C. for a period of time typically less than 1 hour. Cast films have superior properties such as toughness, craze resistance to solvents, and adhesion among other properties.

The following examples are for illustrative purposes and are not intended to limit the invention in any way.

Molecular Weight Determination

The molecular weights of the exemplified polymers were determined relative to polynorbornene standards made according to the method described in WO 95/14048 (published May 26, 1995) using catalyst A of that publication [$\pi^3$-crotyl)(cycloocta-1,5-diene)nickel] and decene-1 as chain transfer agent to control molecular weight. The absolute molecular weights of the resulting samples were determined by using size exclusion chromatography (SEC) in combination with low angle laser light scattering (LALLS). The resulting molecular weight data was used to construct a calibration curve which was used for the molecular weight determinations herein and which allows comparison to conventional polystyrene standards. Using this procedure the PNB calibrated molecular weights were approximately 1.6 times higher than the polystyrene standard molecular weights. The calibrated molecular weight data is given in the following table:

| Molecular Weight Polystyrene Standard | Molecular Weight Polynorbornene Standard |
| --- | --- |
| 3,040,000 | 5,000,000 |
| 330,000 | 540,000 |
| 66,000 | 103,000 |
| 9,200 | 14,800 |
| 255 | 400 |

Adhesion Test

The following generally describes the adhesion test that is performed to test the adherence of the polymer films/coatings of the invention to common substrates utilized in the microelectronics industry.

Silicon substrates are prepared by the wet oxidation of silicon wafers (4 in. diameter) at 1100° C. for 12 hours to give typically a 1000 to 2000 Å layer of silica. Metal substrates are prepared by applying a metal layer onto the surface of the oxidized silicon wafer. This is accomplished by sputtering the desired metal (e.g., aluminum, copper, silver, gold) onto the surface of the silicon substrate to a thickness of about 1000 to 3000 Å. An appropriate tie layer can be used as desired between the silicon substrate and the metal surface layer to aid in adhesion. For the copper, silver, and gold substrates exemplified herein, a titanium tie layer (60 to 100 Å thick) was utilized between the silicon dioxide substrate and the metal layer.

Solutions of the polymers of the present invention are prepared by dissolving the test polymer in a solvent (e.g., chlorobenzene, mesitylene). The substrate is centered on the vacuum chuck of a spin coating apparatus. A quantity of the polymer solution (approximately 1 to 3 ml) is placed on the center of the substrate. The substrate is then spun at 700 to 3000 rpm for 30 seconds. The coated substrate is heated to 90 to 95° C. for 20 to 30 minutes (air atmosphere) to drive off most of the solvent. The coated substrate is then placed in a nitrogen purged furnace which is gradually heated (5° C./min.) to a final temperature of 250 to 350° C. Once attained, the final temperature is maintained for one hour to cure the polymer. The final cure temperature is dependent upon the degree of cure desired. The cured film is then allowed to cool to room temperature. Cure schedules are non-optimized and other time/temperature combinations are similarly meant to pertain to the present examples.

A small area of the polymer film (approximately 1 cm$^2$) is cross-hatched using a diamond scribe. A piece of Scotch™ brand tape (Magic™ brand No. 810 manufactured and sold by the 3M Company) is affixed to the scribed area and subsequently pulled off. The cross-hatched area is examined under a microscope for film removal. The sample passes the adhesion test if none of the cross-hatched sections are removed by the tape.

Film Thickness and Refractive Index Measurments

Film thickness and index of refraction (transverse electric (TE) and transverse magnetic (TM)) were measured with a prism coupler system (Model 2010 from Metricon Corporation, Pennington, N.J.) with HeNe laser (632.8 nm) and a cubic zirconium prism which simultaneously measures refractive indices (TE and TM) and film thickness. The values reported are the TE mode and Δn. Δn (the difference between TE and TM) is the birefringence value of the sample.

Photolithographic Patterning

To determine if the polymers of the present invention could survive the harsh conditions of photolithographic processes and to measure the dielectric constant of same, polymer coated metal substrates were patterned as describe below.

A cured polymer coated metal substrate (silicon—silicon dioxide-metal-polymer) is prepared as described above per the adhesion test. A desired metal and (e.g., Al, Cu. Ag, Au) is sputtered to a thickness of 1000 to 3000 Å onto the top of the polymer layer (silicon-silicon dioxide-metal-polymer-metal). A photoresist (Microposit® SC 1827 from Shipley Company, Inc.) is then spin coated onto the substrate as per the spin coating procedure set forth above (Step 1 below in the diagram below and developed with Microposit® 354 developer from Shipley). The photoresist coated substrate (silicon—silicon dioxide-metal-polymer-metal-photorisist) is soft baked on a hot plate for 2 minutes at 90 to 95° C. The area of the photoresist that is to be developed (i.e., removed) is exposed to UV light (Step 2 below). Microposit® 354 developer is used to remove the exposed photoresist to expose the underlying metal (Step 3 below). The substrate is then baked on a hot plate for 2 minutes at 115 to 120° C. At this point the exposed metal substrate is etched through to the underlying polymer layer). Each metal has a specific etching solution as follows:

Al—PAN (16 parts phosphoric acid, 1 part acetic acid, and 1 part nitric acid with 1 part water)
Au—$I_2$/KI (equimolar, 1 molar)
Cu—$H_2SO_4/H_2O$ (dilute) (2%, solution)
Ag—$NH_4OH/H_2O_2$ (dilute) (2% peroxide solution, 1 molar $NH_4OH$)
Ti—$HF/NH_4F$ (dilute) (equimolar, 1 molar)

Following the etching step, the remaining photoresist is removed by rinsing the substrate in acetone, methanol, isopropanol, or a commercial photoresist stripper.

A Hewlett-Packard LCR meter (Model No. 4263A) was used to measure capacitance and conductance by probing through the polymer to the underlying metal (ground plane), i.e., one probe is placed on the patterned metal surface and the other probe is placed on the ground plane. The diameter of the capacitor is measured to calculate the permittivity and loss factor from the capacitance reading. These values are often reported as dielectric constant. The frequency of the measurement was 10 kilohertz with a 1 volt bias.

Catalyst A

Hexafluoroantimonic acid ($HSbF_6$, 0.708 g, 3 mmole) was placed in a dry, nitrogen filled Teflon® bottle with a Teflon® cap/valve containing a magnetic stir-bar. The bottle was cooled in alcohol/dry ice and nickel ethylhexanoate (8% w Ni in mineral spirits, 3.8 ml, 3 mmole) was added and the contents were allowed to warm to room temperature. The resulting catalyst component is referred to as "catalyst A". Catalyst A could be stored for several days in a freezer with no apparent deterioration in performance.

Catalyst B

To a flask containing bis(cycloocta-1,5-diene)nickel (2.75 g, 10 mmol), was added a solution of crotyl bromide (1.35 g, 10 mmol) and butadiene (2.5 g) in toluene (24 ml). A deep-red solution of (crotyl)nickelbromide dimer resulted. After 2 hours at ambient temperature the solvent was removed under reduced pressure. To the resulting powder was added a solution of 1,5-cyclooctadiene (3.6 ml) in tetrahydrofuran (32 ml). After cooling to 0° C. thallium hexafluorophosphate (3.5 g, 10 mmol) was added to the resulting mixture which was then allowed to warm to ambient temperature and stir for one hour.

The solvent as stripped off under reduced pressure and dichloromethane (24 ml) was added. The insoluble thallium bromide was removed by filtration (under nitrogen) to afford the product as a solution in dichloromethane. This solution was reduced in volume and then diethylether was added to afford the catalyst, {B, [($\pi^3$-crotyl)(cycloocta-1,5-diene)nickel]hexafluorophosphate} (1.3 g) as orange crystals.

Solution C 10 g polybutadiene from Aldrich Chemical Company (Mn 420,000, 9% vinyl groups due to 1,2 incorporation of the butadiene) was dissolved in 200 ml dichloroethane. The solution was dried over 4 A sieves and stripped with nitrogen.

Solution D

A 1,2-polybutadiene functionalized with triethoxysilane, 50% by weight in toluene, purchased from United Chemical Technologies (Product # PS078.5).

Catalyst E

This synthesis followed the literature method of T. M. G. Carneiro et al., Quimica Nova, 1988, 11, 215. A toluene (150 ml) slurry of $PPh_3$ (5.0 g, 19.1 mmol) and the ylid, PhC(O)$CHPPh_3$, (7.3 g, 19.1 mmol), was added to a chilled (0° C.) toluene (80 ml) slurry of $Ni(COD)_2$ (5.3 g, 19.1 mmol). Upon completion of the addition, the mixture became a red-brown slurry. The mixture was allowed to warm to room temperature and was stirred for a further 21 hours. The mixture was then heated to 50° C. for 2 hours. The mixture was then cooled to room temperature and allowed to stir for a further 16 hours. The mixture was then filtered to give a red-brown filtrate which yielded a brown residue after solvent removal. The residue was dissolved in toluene (50 ml) from which a tan precipitate formed upon addition of hexane (50 ml). The mixture was stored in the freezer overnight to give a gold tan solid (catalyst F) $(PPh_3)(C_6H_5)Ni(Ph_2PCH=C(O)Ph)$ which was filtered, washed with hexane, and dried. Yield 10.5 g (79%).

Catalyst F

To a flask containing bis(cycloocta-1,5-diene)nickel (2.75 g, 10 mmol), was added a solution of crotyl bromide (1.35 g, 10 mmol) and butadiene (2.5 g) in toluene (24 ml). A deep-red solution of (crotyl)nickelbromide dimer resulted. After 2 hours at ambient temperature the solvent was removed under reduced pressure to afford the catalyst as a free-flowing deep red-brown solid.

Catalyst G

Five grams (27 mmol) of 2,2,6,6-tetramethylheptane-3,5-dione (DPM) was dissolved in 13.5 ml of ethanol. To this solution was added 3.9 g (13.5 mmol) $Ni(NO_3)_2.6H_2O$ in 35 ml of 50% aqueous ethanol. To the resultant stirring solution was added 1.1 g (13.5 mmol) sodium hydroxide in 35 ml of 50% ethanol. Immediate precipitation of a mint green solid resulted (the dihydrate of Ni(DPM)$_2$). The solid was filtered, washed with 50% aqueous ethanol, and air dried overnight. To remove water from the complex the solid was dried in a 110° C. oven to constant weight (about 10 hours). A purple powder was obtained. Yield 4.6 g (80%). Recrystallization from dichloroethane gave purple crystals. Yield 1.9 g (33%).

Comparative Example 1

To a 3 L glass polymerization vessel fitted with a mechanical stirrer and baffles was added norbornene (210 g, 2.23 mol) and 1-decene (5.3 ml, 0.28 mol) and dichloroethane (2 L). To this stirred solution at ambient temperature was added the catalyst (catalyst B, 0.205 g, 0.558 mmol). The polymerization ensued immediately with the temperature rising to 54° C.

After 1 hour the polymerization, which was in the form of a polymer "cake", was terminated by addition of methanol. The polymer was isolated by filtration and washed with excess methanol before drying at 80° C. under vacuum overnight to afford the copolymer product (195 g, 93% yield). GPC analysis showed the copolymer to have a molecular weight (M$_w$) of 153,000 (M$_n$ 60,200).

A silicon water with a thermally grown silicon dioxide layer was spin coated at 2,000 rpm with a solution of the polynorbornene polymer of Comparative Example 1 (20.79 weight % in chlorobenzene, ≈80 cp). Following curing a polymer film of 8.2 μm was obtained.

Delamination of the film from the wafer occurred after 1.5 minutes in boiling water followed by immersion in liquid nitrogen for 1.5 minutes. The polymer had a refractive index of 1.521 (TE mode) and a birefringence of Δn=0.0004. Photolithography was impossible because the polymer delaminated upon exposure (for 15 seconds) to photoresist developer (dilute sodium hydroxide). The polymer had a permittivity of 2.5 (softbaked at 90° C. for 30 min. with aluminum shadow mask capacitors).

Comparative Example 2

To a 100 ml glass vial equipped with a Teflon® coated stir bar was added norbornene (4.6 g, 48.8 mmol), chlorobenzene (35 ml) and triethoxysilylnorbornene 1.12 ml, 4.24 mmol). To this stirred solution at ambient temperature was added palladium ethylhexanoate (0.13 ml of a 0.1 M solution in cyclohexane, 13 μmol) followed by tris (pentafluorophenyl)boron (117 μmol in petroleum naphtha). The reaction was allowed to run overnight and then methanol was injected to kill the reaction. The polymer produced was insoluble in cyclohexane and hot o-dichlorobenzene etc.

Comparative Example 3

To a 100 ml glass vial equipped with a Teflon® coated stir bar was added norbornene (5 g, 53.1 mmol), methylene chloride (35 ml) and triethoxysilylnorbornene (5.0 ml, 19.1 mmol). To this stirred solution at ambient temperature was added palladium ethylhexanoate (0.9 ml of an 0.029M palladium solution in dichloroethane, 26 μmol), and diethylaluminumchloride (0.07 ml of a 3.4 molar solution in hexanes, 238 μmol). The reaction was allowed to run for one week and then methanol was injected to kill the reaction. The polymer was washed with excess methanol and dried. The yield of copolymer was 5.8 g. GPC analysis showed the copolymer to have a molecular weight (M$_w$) of 124,000 and a polydispersity of 5.8. The proton NMR data indicated that the copolymer comprised approximately 28 mole % triethoxysilylnorbornene and 72 mole % norbornene.

Solutions of the polymer (7.3 wt. % in chlorobenzene) were spin coated onto silicon dioxide and aluminum substrates (750 rpm, cured film thickness of 4.5 μm). Refractive index 1.506 (TE mode), Δn=0.0024. Permittivity 2.9. The high permittivity value was due to the high level of residual catalyst and large particulate impurities in the polymer. The large particulate impurities were determined to be undissolved polymer which further demonstrates the poor solubility (even in a chloronated solvent) of palladium catalyzed polymers.

EXAMPLES 1–5

To a 100 ml glass vial equipped with a Teflon® coated stir bar was added norbornene (4.0 g, 42.4 mmol), methylene chloride (40 ml), triethoxysilylnorbornene (2.8 ml, 10.6 mmol) and 1-hexene (amount indicated in the following table). To this stirred solution at ambient temperature was added catalyst A (0.012 g, 13 μmol), borontrifluoride.etherate (0.015 ml, 117 mol) and finally triethylaluminum (0.077 ml of a 1.7 molar solution in cyclohexane, 130 μmol). After 18 hours the reaction was terminated by pouring the resulting solution into a large, stirred volume of methanol, filtered, washed with an excess of methanol, and dried overnight in a heated vacuum oven (80° C.) to afford the product.

| Example Number | 1-Hexene (ml, mmol) | 1-Hexene (mole % on monomers) | Conversion (%) | M$_w$ | M$_n$ |
| --- | --- | --- | --- | --- | --- |
| 1 | 0, 0 | 0 | 56 | 462,000 | 136,000 |
| 2 | 0.0165, 0.133 | 0.25 | 61 | 334,000 | 104,000 |
| 3 | 0.066, 0.53 | 1 | 64 | 159,000 | 57,000 |
| 4 | 0.132, 1.06 | 2 | 74 | 102,000 | 39,000 |
| 5 | 0.264, 2.12 | 4 | 59 | 103,000 | 24,000 |

The proton NMR spectra of the polymers recovered from Examples 1 and 5 were recorded in deuterochloroform. A singlet resonance at 3.8 ppm was assigned to the methylene protons (—CH$_2$—) of the ethoxy groups on the triethoxysilylnorbornene monomer, from the integration of this signal it was possible to determine the level of incorporation of the triethoxysilylnorbornene in the resulting copolymer. In Example 1 the copolymer composition was 83:17 norbornene/triethoxysilylnorbornene while in Example 5 the copolymer composition was 82.5:17.5. Furthermore the NMR spectrum of the copolymer resulting from Example 5 exhibited resonances in the region 5.3–6.2 ppm indicative of olefinic end groups derived from the 1-hexene chain transfer agent (these resonances were not present in Example 1 since no chain transfer agent was used).

EXAMPLES 6–10

To a 100 ml glass vial equipped with a Teflon® coated stir bar was added norbornene (4.0 g, 42.4 mmol), methylene chloride (40 ml), triethoxysilylnorbornene (2.8 ml, 10.6 mmol) and 1-hexene (amount indicated in the following table). To this stirred solution at ambient temperature was added nickel ethylhexanoate (0.01 ml of an 8% w nickel solution in mineral spirits, 13 μmol), tris(pentafluorophenyl) boron (117 μmol in petroleum naphtha) and finally triethylaluminum (0.077 ml of a 1.7 molar solution in cyclohexane, 130 μmol). The reaction was allowed to run for 18 hours the reaction was terminated by pouring the resulting solution into a large, stirred volume of methanol, filtered, washed with an excess of methanol, and dried overnight in a heated vacuum oven (80° C.) to afford the product.

| Example Number | 1-Hexene (ml, mmol) | 1-Hexene (mole % on Monomers) | Conversion (%) | $M_w$ | $M_n$ |
|---|---|---|---|---|---|
| 6 | 0, 0 | 0 | 45 | n.d | n.d |
| 7 | 0.0165, 0.133 | 0.25 | 58 | n.d | n.d |
| 8 | 0.066, 0.53 | 1 | 43 | 1,134,000 | 343,000 |
| 9 | 0.132, 1.06 | 2 | 34 | 1,068,000 | 312,000 |
| 10 | 0.264, 2.12 | 4 | 25 | 766,000 | 240,000 |

The proton NMR spectra of the polymer recovered from Example 10 was recorded in deuterochloroform. A singlet resonance at 3.8 ppm was assigned to the methylene protons (—$CH_2$—) of the ethoxy groups on the triethoxysilylnorbornene monomer, from the integration of this signal it was possible to determine the level of incorporation of the triethoxysilylnorbornene in the resulting copolymer. In Example 10 the copolymer composition was 85:15 norbornene/triethoxysilylnorbornene. The copolymers obtained in Examples 6 and 7 formed such viscous solutions that reliable GPC data could not be obtained.

EXAMPLE 11

To a 100 ml glass vial equipped with a Teflon® coated stir bar was added norbornene (4.12 g, 43.8 mmol), dichloroethane (35 ml), ethylidenenorbornene (0.35 ml, 2.65 mmol), triethoxysilylnorbornene (0.35 ml, 1.3 mmol) and decylnorbornene (1.44 ml, 5.3 mmol). To this stirred solution at ambient temperature was added nickel ethylhexanoate (0.01 ml of an 8% nickel solution in mineral spirits, 13.0 μmol), and ethylaluminumdichloride (0.04 ml of a 3.4 molar solution in hexanes, 150 μmol). The reaction was allowed to run for two hours and then methanol was injected to kill the reaction. The polymer was washed with excess methanol and dried. The yield of copolymer was 1.7 g. GPC analysis showed the polymer to have a molecular weight ($M_w$) of 72,000 and a polydispersity of 2.4. Proton NMR confirmed that the product was a copolymer of all four monomers.

EXAMPLE 12

To a 100 ml glass vial equipped with a Teflon® coated stir bar was added norbornene (4.12 g, 43.8 mmol), dichloroethane (35 ml), ethylidenenorbornene (0.35 ml, 2.65 mmol), and triethoxysilylnorbornene (0.35 ml, 1.3 mmol). To this stirred solution at ambient temperature was added a 1:1 mol/mol solution in dichloroethane (0.1 molar) of nickel ethylhexanoate and dimethylanilinium tetrakis (pentafluorophenyl)boron (13.0 μmol), and triethylaluminum (0.09 ml, 0.65 mmol). The reaction was allowed to run for one hour and then methanol was injected to kill the reaction. The polymer was washed with excess methanol and dried. The yield of terpolymer was 1.3 g. GPC analysis showed the polymer to have a molecular weight ($M_w$) of 64,000 and a polydispersity of 2.15. Proton NMR confirmed that the product was a terpolymer of all three monomers.

Solutions of the polymer (17.2 wt. % in chlorobenzene) were spin coated (1250 rpm) onto silicon dioxide and aluminum substrates (cured film thickness 2.5 μm). Refractive index 1.536 (TE mode), Δn=0.0005. The polymer passed the tape test for both substrates. The polymer did not delaminate after exposure in boiling water (1.5 min.) followed by liquid nitrogen (1.5 min). Permittivity of 3.1 was high due to residual catalyst in the polymer.

EXAMPLE 13

To a 100 ml glass vial equipped with a Teflon® coated stir bar was added norbornene (4.7 g, 49.8 mmol), dichloroethane (35 ml) and triethoxysilylnorbornene (0.7 ml, 2.7 mmol). To this stirred solution at ambient temperature was added catalyst A (0.012 g, 13 μmol), borontrifluoride.etherate (0.015 ml, 117 μmol) and finally triethylaluminum (1.3 ml of a 0.1 molar solution in heptane, 130 mol).

After 60 minutes the reaction was terminated by injecting methanol (3 ml). The polymer was then washed with an excess of methanol and dried overnight in a heated vacuum oven to afford the product (4.6 g, 85% conversion). GPC analysis showed the copolymer to have a molecular weight ($M_w$) of 491,000 ($M_n$ of 116,000) and exhibited a glass transition temperature of 373° C. Proton NMR revealed that the copolymer composition was 95:5 norbornene/ triethoxysilylnorbornene.

EXAMPLE 14

To a 100 ml glass vial equipped with a Teflon® coated stir bar was added norbornene (4.6 g, 48.8 mmol), dichloroethane (50 ml) and triethoxysilylnorbornene (0.97 ml, 3.7 mmol). To this stirred solution at 60° C. was added catalyst A (0.012 g, 13 μmol), borontrifluoride.etherate (0.015 ml, 117 μmol) and finally triethylaluminum (0.077 ml of a 1.7 molar solution in heptane, 130 μmol).

After 60 minutes the reaction was terminated by injecting methanol (3 ml). The polymer was then washed with an excess of methanol and dried overnight in a heated vacuum oven to afford the product (3.9 g, 70%). GPC analysis showed the copolymer to have a molecular weight ($M_w$) of 68,100 ($M_n$ 34,900).

EXAMPLE 15

To a 100 ml glass vial equipped with a Teflon® coated stir bar was added norbornene (4.6 g, 48.8 mmol), dichloroethane (50 ml) and triethoxysilylnorbornene (1.12 ml, 4.24 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (4.0 g, 70%). GPC analysis showed the copolymer to have a molecular weight ($M_w$) of 346,000 ($M_n$ 128,000). The proton NMR data indicated that the copolymer comprised 7.2% triethoxysilylnorbornene (13.6 wt. %) and 92.8% norbornene.

Solutions of the polymer were spin coated onto gold, aluminum, and silicon dioxide substrates. The polymers passed the tape test on all substrates. The polymer did not delaminate from the gold substrate after exposure to boiling water for 1.5 hours. Refractive index 1.514 (TE mode), Δn=0.0014. Permittivity 2.4–2.5.

EXAMPLE 16

To a 100 ml glass vial equipped with a Teflon® coated stir bar was added norbornene (4.6 g, 48.8 mmol), dichloroethane (50 ml), triethoxysilylnorbornene (1.12 ml, 4.24 mmol) and ethylidenenorbornene (0.35 ml, 2.65 mmol). To this stirred solution at ambient temperature was added catalyst A (0.012 g, 13 μmol), borontrifluoride.etherate (0.015 ml, 117 mol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (2.8 g).

EXAMPLE 17

To a 100 ml glass vial equipped with a Teflon® coated stir bar was added norbornene (4.6 g, 48.8 mmol), monochlorobenzene (50 ml) and triethoxysilylnorbornene (1.12 ml, 4.24 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (4.1 g, 71%).

EXAMPLE 18

To a 100 ml glass vial equipped with a Teflon® coated stir bar was added norbornene (4.6 g, 48.8 mmol), monochlorobenzene (50 ml) and triethoxysilylnorbornene (1.12 ml, 4.24 mmol). To this stirred solution at 60° C. was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (4.0 g, 70%).

EXAMPLE 19

To a 500 ml glass vial equipped with a Teflon® coated stir bar was added norbornene (18.4 g, 195 mmol), dichloroethane (163 ml) and triethoxysilylnorbornene (4.44 ml, 16.9 mmol). To this stirred solution at 50° C. was added a mixture of catalyst A (0.048 g, 52 μmol), borontrifluoride.etherate (0.06 ml, 468 μmol) and finally triethylaluminum (0.31 ml of a 1.7 molar solution in cyclohexane, 520 μmol), that had been premixed in dichloroethane (2 ml) for 30 seconds.

After 60 minutes the reaction was terminated by injecting methanol (10 ml). The polymer was then washed with an excess of methanol and dried overnight in a heated vacuum oven to afford the product (8.1 g).

EXAMPLE 20

To a 100 ml glass vial equipped with a Teflon® coated stir bar was added norbornene (91 g, 0.96 mol), triethoxysilylnorbornene (21.8 ml, 83.2 mmol) and monochlorobenzene (405 ml). To this stirred solution at ambient temperature was added catalyst A (0.17 g, 0.104 mmol), borontrifluoride.etherate (0.12 ml, 0.936 mmol) and finally triethylaluminum (0.62 ml of a 1.7 molar solution in cyclohexane, 1.04 mmol).

After 60 minutes the reaction was terminated by injecting methanol (30 ml). The viscous polymer cement was diluted with 1 liter of cyclohexane and then precipitated into excess acetone and then the polymer was washed with an excess of acetone and dried overnight in a heated vacuum oven (90° C.) to afford the product (81.0 g, 72%). GPC analysis showed the copolymer to have a molecular weight ($M_w$) of 955,000 ($M_n$ 298,000). The proton NMR data indicated that the copolymer comprised 7.8% triethoxysilylnorbornene and 92.2% norbornene.

EXAMPLE 21

To a 100 ml glass vial equipped with a Teflon® coated stir bar was added norbornene (4.6 g, 48.8 mmol), monochlorobenzene (50 ml) triethoxysilylnorbornene (1.12 ml, 4.24 mmol) and isobutylene (0.3 g, 5.3 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (4.9 g). GPC analysis showed the copolymer to have a molecular weight ($M_w$) of 107,500 ($M_n$ 46,100). The proton NMR data indicated that the polymer contained approximately 6.7% triethoxysilylnorbornene.

EXAMPLE 22

To a 100 ml glass vial equipped with a Teflon® coated stir bar was added norbornene (4.6 g, 48.8 mmol), monochlorobenzene (50 ml), triethoxysilylnorbornene (1.12 ml, 4.24 mmol) and butadiene (0.3 g, 5.3 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (5.0 g). GPC analysis showed the copolymer to have a molecular weight ($M_w$) of 26,100 ($M_n$ 12,200).

EXAMPLE 23

To a 100 ml glass vial equipped with a Teflon® coated stir bar was added norbornene (4.6 g, 48.8 mmol), monochlorobenzene (40 ml), triethoxysilylnorbornene (1.12 ml, 4.24 mmol) and solution D (0.67 ml). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (5.6 g, 93% conversion). GPC analysis showed the copolymer to have a molecular weight ($M_w$) of 384,000 ($M_n$ 103,000).

EXAMPLE 24

To a 100 ml glass vial equipped with a Teflon® coated stir bar was added norbornene (9.2 g, 97.6 mmol), monochlorobenzene (50 ml), triethoxysilylnorbornene (2.2 ml, 8.48 mmol) and solution E (1.36 g). To this stirred solution at ambient temperature was added catalyst A (0.012 g, 13 μmol), borontrifluoride.etherate (0.015 ml, 117 ,mol) and finally triethylaluminum (0.077 ml of a 1.7 molar solution in cyclohexane, 130 μmol).

After 60 minutes the reaction was terminated by injecting methanol (3 ml). The polymer was then washed with an excess of methanol and dried overnight in a heated vacuum oven to afford the product (11.7 g). GPC analysis showed the copolymer to have a molecular weight ($M_w$) of 369,000 ($M_n$ 84,000).

EXAMPLE 25

To a 100 ml glass vial equipped with a Teflon® coated stir bar was added norbornene (5 g, 53.1 mmol), toluene (35 ml)

and triethoxysilylnorbornene (1.24 ml, 4.7 mmol). To this stirred solution at ambient temperature was added catalyst A (0.012 g, 13 μmol), tris(pentafluorophenyl)boron (117 μmol in petroleum naphtha) and finally triethylaluminum (0.077 ml of a 1.7 molar solution in cyclohexane, 130 μmol). Upon addition of the trialkylaluminum there ensued an exothermic reaction. The reaction was allowed to run for 60 minutes and then methanol was injected to kill the reaction. The polymer was washed with excess methanol and dried. The yield of copolymer was 6.2 g. GPC analysis showed the copolymer to have a molecular weight ($M_w$) of 2,550,000 ($M_n$ 222,000).

EXAMPLE 26

To a 100 ml glass vial equipped with a Teflon® coated stir bar was added norbornene (4.6 g, 48.8 mmol), toluene (35 ml) and triethoxysilylnorbornene (1.12 ml, 4.24 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). Upon addition of the trialkylaluminum there ensued an exothermic reaction resulting in a very viscous solution. The reaction was allowed to run for 60 minutes and then methanol was injected to kill the reaction. The polymer was washed with excess methanol and dried. The yield of copolymer was 6.0 g. GPC analysis showed the copolymer to have a molecular weight ($M_w$) of 1,440,000 ($M_n$ 201,000).

EXAMPLE 27

To a 100 ml glass vial equipped with a Teflon® coated stir bar was added norbornene (4.6 g, 48.8 mmol), cyclohexane (30 ml) and triethoxysilylnorbornene (1.12 ml, 4.24 mmol). To this stirred solution at ambient temperature was added nickel ethylhexanoate (0.01 ml of an 8% w nickel solution in mineral spirits, 13 μmol), tris(pentafluorophenyl)boron (13 μmol in petroleum naphtha) and finally triethylaluminum (0.077 ml of a 1.7 molar solution in cyclohexane, 130 μmol). Upon addition of the trialkylaluminum there ensued an exothermic reaction. The reaction was allowed to run for 60 minutes and then methanol was injected to kill the reaction. The polymer was washed with excess methanol and dried. The yield of copolymer was 1.2 g (21% conversion). GPC analysis showed the copolymer to have a molecular weight ($M_w$) of 1,856,000.

EXAMPLE 28

To a 100 ml glass vial equipped with a Teflon® coated stir bar was added norbornene (4.6 g, 48.8 mmol), cyclohexane (30 ml) and triethoxysilylnorbornene (1.12 ml, 4.24 mmol). To this stirred solution at ambient temperature was added nickel ethylhexanoate (0.01 ml of an 8% w nickel solution in mineral spirits, 13 μmol), tris(pentafluorophenyl)boron (13 μmol in petroleum naphtha) and finally triethylaluminum (0.023 ml of a 1.7 molar solution in cyclohexane, 40 μmol). The reaction was allowed to run for 60 minutes and then methanol was injected to kill the reaction. The polymer was washed with excess methanol and dried. The yield of copolymer was 0.8 g (14% conversion). GPC analysis showed the copolymer to have a molecular weight ($M_w$) of 2,934,000.

EXAMPLE 29

To a 100 ml glass vial equipped with a Teflon® coated stir bar was added norbornene (4.6 g, 48.8 mmol), toluene (30 ml), triethoxysilylnorbornene (1.12 ml, 4.24 mmol) and solution D (0.77 ml). To this stirred solution at ambient temperature was added nickel ethylhexanoate (0.01 ml of an 8% w nickel solution in mineral spirits, 13 μmol), tris (pentafluorophenyl)boron (117 μmol in petroleum naphtha) and finally triethylaluminum (0.077 ml of a 1.7 molar solution in cyclohexane, 130 μmol). Upon addition of the trialkylaluminum there ensued an exothermic reaction. The reaction was allowed to run for 60 minutes and then methanol was injected to kill the reaction. The polymer was washed with excess methanol and dried. The yield of copolymer was 4.5 g.

EXAMPLE 30

To a 100 ml glass vial equipped with a Teflon® coated stir bar was added norbornene (5 g, 53.1 mmol), cyclohexane (35 ml), triethoxysilylnorbornene (1.24 ml, mmol) and solution C, (0.77 ml). To this stirred solution at ambient temperature was added nickel ethylhexanoate (0.01 ml of an 8% w nickel solution in mineral spirits, 13 μmol), tris (pentafluorophenyl)boron (117 μmol in petroleum naphtha) and finally triethylaluminum (0.077 ml of a 1.7 molar solution in cyclohexane, 130 μmol). Upon addition of the trialkylaluminum there ensued an exothermic reaction. The reaction was allowed to run for 60 minutes and then methanol was injected to kill the reaction. The polymer was washed with excess methanol and dried. The yield of copolymer was 5.1 g.

EXAMPLE 31

To a 100 ml glass vial equipped with a Teflon® coated stir bar was added norbornene (4.6 g, 48.9 mmol), cyclohexane (30 ml), isobutylene (0.3 g, 5.37 mmol) and triethoxysilyl-norbornene (1.12 ml, 4.2 mmol). To this stirred solution at ambient temperature was added nickel ethylhexanoate (0.01 ml of an 8% w nickel solution in mineral spirits, 13 μmol), tris(pentafluorophenyl)boron (1 17 μmol in petroleum naphtha) and finally triethylaluminum (0.077 ml of a 1.7 molar solution in cyclohexane, 130 μmol). The reaction was allowed to run for 60 minutes and then methanol was injected to kill the reaction. The polymer was washed with excess methanol and dried. The yield of terpolymer was 2.7 g.

EXAMPLE 32

To a 100 ml glass vial equipped with a Teflon® coated stir bar was added norbornene (4.6 g, 48.8 mmol), chlorobenzene (35 ml), triethoxysilylnorbornene (1.12 ml, 4.24 mmol) and 5-decylnorbornene (1.6 ml, 5.9 mmol). To this stirred solution at ambient temperature was added catalyst A (0.0 12 g, 13 μmol), borontrifluoride.etherate (0.0ml, 117 μmol) and finally triethylaluminum (0.077 ml of a 1.7 molar solution in cyclohexane, 130 μmol). Upon addition of the trialkylaluminum there ensued an exothermic reaction. The reaction was allowed to run for one hour and then methanol was injected to kill the reaction. The polymer was washed with excess methanol and dried. The yield of copolymer was 6.3 g. GPC analysis showed the polymer to have a molecular weight ($M_w$) of 681,000 and a polydispersity of 3.1.

EXAMPLE 33

To a 100 ml glass vial equipped with a Teflon® coated stir bar was added norbornene (4.6 g, 48.8 mmol), chlorobenzene (35 ml), triethoxysilylnorbornene (1.12 ml, 4.24 mmol) and triisobutylene (0.5 g, 3.6 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol). Upon addition of the trialkylaluminum there ensued an exothermic reaction. The reaction was allowed to run for one hour and then methanol was injected to kill the reaction. The polymer was washed with excess methanol and dried. The yield of copolymer was 4.5 g. GPC analysis showed t he polymer t o have a molecular weight ($M_w$) of 681,000 and a polydispersity of 3.6.

EXAMPLE 34

To a 100 ml glass vial equipped with a Teflon® coated stir bar was added norbornene (4.6 g, 48.8 mmol), chlorobenzene (35 ml), triethoxysilylnorbornene (1.12 ml, 4.24 mmol) and triisobutylene (0.5 g, 3.6 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). Upon addition of the trialkylaluminum there ensued an exothermic reaction. The reaction was allowed to run for 60 minutes and then methanol was injected to kill the reaction. The polymer was washed with excess methanol and dried. The yield of copolymer was 5.1 g. GPC analysis showed the polymer to have a molecular weight ($M_w$) of 589,000 and a polydispersity of 2.1.

EXAMPLE 35

To a 100 ml glass vial equipped with a Teflon® coated stir bar was added norbornene (4.6 g, 48.8 mmol), chorobenzene (35 ml), butadiene (0.15 g, 2.8 mmol) and triethoxysilylnorbornene (1.12 ml, 4.24 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). The reaction was allowed to run for 60 minutes and then methanol was injected to kill the reaction. The polymer was washed with excess methanol and dried. The yield of copolymer was 3.5 g.

GPC analysis showed the copolymer to have a molecular weight ($M_w$) of 120,000 ($M_n$ 18,900). The GPC data showed the terpolymer to be distinctly bimodal in character.

EXAMPLE 36

To a 100 ml glass vial equipped with a Teflon® coated stir bar was added norbornene (1.8 g, 19.1 mmol), cyclohexane (20 ml) and triethoxysilylnorbornene (3.00 ml, 11.5 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). The reaction was allowed to run for 18 hours and then methanol was injected to kill the reaction. The polymer was washed with excess methanol and dried. The yield of copolymer was 3.3 g.

EXAMPLE 37

To a 100 ml glass vial equipped with a Teflon® coated stir bar was added norbornene (1.25 g, 13.3 mmol), monochlorobenzene (30 ml) and triethoxysilylnorbornene (10.4 ml, 40.0 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol). The reaction was allowed to run for 18 hours and then methanol was injected to kill the reaction. The polymer was washed with excess methanol and dried. The yield of copolymer was 2.4 g. Proton NMR revealed the resulting copolymer to comprise 58 mol % norbornene units and 42 mol % triethoxysilylnorbornene units.

EXAMPLE 38

To a 100 ml glass vial equipped with a Teflon® coated stir bar was added norbornene (2.5 g, 26.6 mmol), monochlorobenzene (30 ml) and triethoxysilylnorbornene (7.0 ml, 26.6 mmol). To this stirred solution at ambient temperature was added nickel ethylhexanoate (0.01 ml of an 8% w nickel solution in mineral spirits, 13 μmol), tris(pentafluorophenyl) boron (117 μmol in petroleum naphtha) and finally triethylaluminum (0.077 ml of a 1.7 molar solution in cyclohexane, 130 μmol). The reaction was allowed to run for 18 hours and then methanol was injected to kill the reaction. The polymer was washed with excess methanol and dried. The yield of copolymer was 0.8 g. Proton NMR revealed the resulting copolymer to comprise 58 mol % norbornene units and 42 mol % triethoxysilylnorbornene units.

EXAMPLE 39

To a 100 ml glass vial equipped with a Teflon® coated stir bar was added norbornene (4.6 g, 48.8 mmol), dichloroethane (20 ml), triethoxysilylnorbornene (1.12 ml, 4.24 mmol) and vinylcyclohexeneepoxide (1.0 ml, 7.7 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). The reaction was allowed to run for 60 minutes and then methanol was injected to kill the reaction. The polymer was washed with excess methanol and dried. The yield of copolymer was 2.4 g. GPC analysis showed the polymer to have a molecular weight ($M_w$) of 1,120,000. Proton NMR showed the product to be a terpolymer containing all three monomers.

EXAMPLE 40

To a 100 ml glass vial equipped with a Teflon® coated stir bar was added norbornene (4.6 g, 48.8 mmol), cyclohexane (25 ml), triethoxysilylnorbornene (1.12 ml, 4.24 mmol) and vinylcyclohexeneepoxide (1.0 ml, 7.7 mmol). To this stirred solution at ambient temperature was added nickel ethylhexanoate (0.01 ml of an 8% w nickel solution in mineral spirits, 13 μmol), tris(pentafluorophenyl)boron (117 μmol in petroleum naphtha) and finally triethylaluminum (0.077 ml of a 1.7 molar solution in cyclohexane, 130 μmol). The reaction was allowed to run for 60 minutes and then methanol was injected to kill the reaction. The polymer was washed with excess methanol and dried. The yield of copolymer was 2.6 g. GPC analysis showed the polymer to have a molecular weight ($M_w$) of 477,000. ($M_n$ 19,000). Proton NMR showed the product to be a terpolymer containing all three monomers.

EXAMPLE 41

To a 100 ml glass vial equipped with a Teflon® coated stir bar was added norbornene (4.6 g, 48.8 mmol), cyclohexane (35 ml), triethoxysilylnorbornene (1.12 ml, 4.24 mmol) and ethylvinylether (2.0 ml, 20.9 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 60 minutes and then methanol was injected to kill the reaction. The polymer was washed with excess methanol and dried. The yield of copolymer was 4.2 g. GPC analysis showed the polymer to have a molecular weight ($M_w$) of 1,146,000 and a broad polydispersity.

EXAMPLE 42

To a 100 ml glass vial equipped with a Teflon® coated stir bar was added norbornene (4.6 g, 48.8 mmol), cyclohexane (35 ml), triethoxysilylnorbornene (1.12 ml, 4.24 mmol) and ethylvinylether (0.5 ml, 5.2 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 60 minutes and then methanol was injected to kill the reaction. The polymer was washed with excess methanol and dried. The yield of copolymer was 6.1 g. GPC analysis showed the polymer to have a molecular weight ($M_w$) of 69,400 and a polydispersity of 2.8.

EXAMPLE 43

To a 100 ml glass vial equipped with a Teflon® coated stir bar was added norbornene (4.6 g, 48.8 mmol), chlorobenzene (30 ml), triethoxysilylnorbornene (1.12 ml, 4.24 mmol) and n-butylvinylether (0.5 ml, 3.9 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 60 minutes and then methanol was injected to kill the reaction. The polymer was washed with excess methanol and dried. The yield of terpolymer was 3.1 g.

EXAMPLE 44

To a 100 ml glass vial equipped with a Teflon® coated stir bar was added norbornene (4.6 g, 48.8 mmol), chlorobenzene (35 ml), triethoxysilylnorbornene (1.12 ml, 4.24 mmol) and n-butylvinylether (2.5 ml, 19.3 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 60 minutes and then methanol was injected to kill the reaction. The polymer was diluted with excess dichlorobenzene, precipitated into excess methanol, washed with excess methanol and dried. The yield of terpolymer was 1.9 g.

EXAMPLE 45

To a 100 ml glass vial equipped with a Teflon® coated stir bar was added norbornene (2.0 g, 21.2 mmol), cyclohexane (40 ml) and triethoxysilylnorbornene (3.00 ml, 11.5 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 18 hours and then methanol was injected to kill the reaction. The polymer was washed with excess methanol and dried. The yield of copolymer was 2.8 g (57%). GPC analysis showed the polymer to have a molecular weight ($M_w$) of 610,000. Proton NMR revealed the copolymer to contain 30.5 mol % triethoxysilylnorbornene units.

EXAMPLE 46

To a 100 ml glass vial equipped with a Teflon® coated stir bar was added norbornene (2.0 g, 21.2 mmol), chlorobenzene (40 ml) and triethoxysilylnorbornene (3.00 ml, 11.5 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 18 hours and then methanol was injected to kill the reaction. The polymer was washed with excess methanol and dried. The yield of copolymer was 1.6 g. GPC analysis showed the polymer to have a molecular weight ($M_w$) of 368,000 and a polydispersity of 4.4.

EXAMPLE 47

To a 100 ml glass vial equipped with a Teflon® coated stir bar was added norbornene (4.6 g, 48.8 mmol), chlorobenzene (40 ml), triethoxysilylnorbornene (1.12 ml, 4.24 mmol) and 1-hexene (0.066 ml, 0.53 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). Upon addition of the trialkylaluminum there ensued an exothermic reaction. The reaction was allowed to run for 60 minutes and then 2,4-pentanedione was injected to kill the reaction. The polymer was washed with excess methanol and dried. The yield of copolymer was 5.9 g, 95%. GPC analysis showed the copolymer to have a molecular weight ($M_w$) of 359,500 and a polydispersity of 3.7.

EXAMPLE 48

To a 100 ml glass vial equipped with a Teflon® coated stir bar was added norbornene (2.5 g, 26.5 mmol), cyclohexane (35 ml) and triethoxysilylnorbornene (6.9 ml, 26.5 mmol). To this stirred solution at ambient temperature was added nickel ethylhexanoate (0.01 ml of an 8% w nickel solution in mineral spirits, 13 µmol), tris(pentafluorophenyl)boron (117 µmol in petroleum naphtha) and finally triethylaluminum (0.077 ml of a 1.7 molar solution in cyclohexane, 130 µmol). The reaction was allowed to run for 48 hours and then methanol was injected to kill the reaction. The polymer was washed with excess methanol and dried. The yield of copolymer was 0.9 g.

EXAMPLE 49

To a 100 ml glass vial equipped with a Teflon® coated stir bar was added norbornene (4.6 g, 48.8 mmol), monochlorobenzene (35 ml) and triethoxysilylnorbornene (112 ml, 4.24 mmol). To this stirred solution at ambient temperature was added catalyst B (4.6 mg, 13 µmol). The reaction was allowed to run for 24 hours and then methanol was injected to kill the reaction. The copolymer was washed with excess methanol and dried. The yield of copolymer was 0.7 g. Proton NMR revealed the copolymer to contain 8 mol % triethoxysilylnorbornene units. GPC indicated the molecular weight ($M_w$) to be 330,000 with a polydispersity of 2.5.

EXAMPLE 50

To a 100 ml glass vial equipped with a Teflon® coated stir bar was added norbornene (4.0 g, 42.4 mmol), cyclohexane (35 ml) and triethoxysilylnorbornene (2.8 ml, 10.6 mmol). To this stirred solution at ambient temperature was added nickel ethylhexanoate (0.02 ml of an 8% w nickel solution in mineral spirits, 26 µmol) followed by tris (pentafluorophenyl)boron (234 µmol in petroleum naphtha) and diethylzinc (260 µmol) which had been premixed at ambient temperature for 5 minutes in hydrocarbon diluent. The reaction was allowed to run for 24 hours and then methanol was injected to kill the reaction. The polymer was washed with excess methanol and dried. The yield of copolymer was 1.6 g. GPC studies showed the copolymer to have a high molecular weight ($M_w$ 1,274,000)

EXAMPLE 51

To a 100 ml glass vial equipped with a Teflon® coated stir bar was added norbornene (4.0 g, 42.4 mmol), cyclohexane (35 ml) and triethoxysilylnorbornene (2.8 ml, 10.6 mmol). To this stirred solution at ambient temperature was added nickel ethylhexanoate (0.02 ml of an 8% w nickel solution in mineral spirits, 26 µmol) followed by tris (pentafluorophenyl)boron (234 µmol in petroleum naphtha), triethylaluminum (130 µmol) and diethylzinc (130 µmol) the latter three components having been premixed at ambient temperature in a small amount of hydrocarbon diluent. There ensued a rapid and exothermic reaction. The reaction was allowed to run for 60 minutes and then methanol was injected to kill the reaction. The polymer was washed with excess methanol and dried. The yield of copolymer was 5.2 g. GPC studies showed the copolymer to have a high molecular weight ($M_w$ 1,241,000).

EXAMPLE 52

To a 100 ml glass vial equipped with a Teflon® coated stir bar was added norbornene (4.0 g, 42.4 mmol), cyclohexane (35 ml) and triethoxysilynorbornene (2.8 ml, 10.6 mmol). To this stirred solution at ambient temperature was added nickel ethylhexanoate (0.02 ml of an 8% w nickel solution in mineral spirits, 26 µmol) followed by tris (pentafluorophenyl)boron (234 µmol in petroleum naphtha), triethylaluminum (33 µmol) and diethylzinc (97 µmol) the latter three components having been premixed at ambient temperature in a small amount of hydrocarbon diluent. There ensued a rapid and exothermic reaction. The reaction was allowed to run for 60 minutes and then methanol was injected to kill the reaction. The polymer was washed with excess methanol and dried. The yield of copolymer was 4.6 g. GPC studies showed the copolymer to have a high molecular weight ($M_w$ 1,213,000) with a polydispersity of 3.2.

EXAMPLES 53–54

To a 100 ml glass vial equipped with a Teflon® coated stir bar was added norbornene (4.0 g, 42.4 mmol), cyclohexane (35 ml), triethoxysilylnorbornene (2.8 ml, 10.6 mmol) and ethylene (amount indicated in the following table, ethylene gas introduced at atmospheric pressure and ambient temperature as a gas using a glass syringe). To this stirred solution at ambient temperature was added nickel ethylhexanoate (0.02 ml of an 8% w nickel solution in mineral spirits, 26 µmol) and a mixture of tris(pentafluorophenyl)boron (234 µmol in petroleum naphtha) and triethylaluminum (0.16 ml of a 1.7 molar solution in cyclohexane, 260 µmol). The reaction was allowed to run for 18 hours the reaction was terminated by pouring the resulting solution into a large, stirred volume of 20 methanol, filtered, washed with an excess of methanol, and dried overnight in a heated vacuum oven (80° C.) to afford the product.

| Example Number | Ethylene (gas-ml) | Yield (g) | $M_w$ | $M_n$ |
|---|---|---|---|---|
| 53 | 10 | 2.3 | 233,000 | 41,400 |
| 54 | 5 | 2.8 | 359,000 | 83,100 |

EXAMPLES 55–56

To a 100 ml glass vial equipped with a Teflon® coated stir bar was added norbornene (4.0 g, 42.4 mmol), diluent (35 ml) and triethoxysilylnorbornene (2.8 ml, 10.6 mmol). To this stirred solution at ambient temperature was added catalyst A (0.024 g, 26 µmol), borontrifluoride.etherate (0.03 ml, 234 µmol) and finally triethylaluminum (0.16 ml of a 1.7 molar solution in cyclohexane, 260 µmol). After 60 minutes the reactions were terminated by pouring the resulting solution (in the case of Example 55 the polymer was first dissolved in THF to form a homogeneous solution) into a large, stirred volume of methanol, filtered, washed with an excess of methanol, and dried overnight in a heated vacuum oven (80° C.) to afford the product.

| Example Number | Diluent | Polymerization Type | Conversion % | $M_w$ | $M_n$ |
|---|---|---|---|---|---|
| 55 | dichloroethane | Heterogeneous (product precipitated) | 79 | 244,100 | 52,100 |
| 56 | methylene chloride | Solution | 67 | 271,000 | 97,300 |

EXAMPLE 57

To a 100 ml glass vial equipped with a Teflon® coated stir bar was added norbornene (4.0 g, 42.4 mmol), dichloroethane (40 ml) and triethoxysilylnorbornene (2.8 ml, 10.6 mmol). To this stirred solution at ambient temperature was added the reaction product of nickel ethylhexanoate (0.01 ml of an 8% w nickel solution in mineral spirits, 13 µmol) and trifluoroacetic acid (13 µmol), followed by a mixture of tris(pentafluorophenyl)boron (117 µmol in petroleum naphtha) and triethylaluminum (0.077 ml of a 1.7 molar solution in cyclohexane, 130 µmol). The reaction was allowed to run for 18 hours and then methanol was injected to kill the reaction. The polymer was washed with excess methanol and dried. The yield of copolymer was 2.3 g. GPC showed the copolymer to exhibit a high molecular weight ($M_w$ 392,000) and a polydispersity of 4.2.

EXAMPLES 58–59

To a 100 ml glass vial equipped with a Teflon® coated stir bar was added norbornene (4.0 g, 42.4 mmol), diluent (35 ml) and triethoxysilylnorbornene (2.8 ml, 10.6 mmol). To this stirred solution at ambient temperature was added catalyst A (0.012 g, 13 μmol), borontrifluoride.etherate (0.015 ml, 117 μmol) and finally triethylaluminum (0.077 ml of a 1.7 molar solution in cyclohexane, 130 μmol). After 60 minutes the reactions were terminated by pouring the resulting homogeneous solution into a large, stirred volume of methanol, filtered, washed with an excess of methanol, and dried overnight in a heated vacuum oven (80° C.) to afford the product.

| Example Number | Diluent | Yield (g) | Level of Triethoxysilyl-norbornene in Copolymer (¹H-NMR) | $M_w$ | $M_n$ |
|---|---|---|---|---|---|
| 58 | toluene | 4.5 | 19.2 | 1,335,000 | 401,100 |
| 59 | monochloro-benzene | 5.3 | 17.9 | n.d. | n.d. |

EXAMPLE 60

To a 100 ml glass vial equipped with a Teflon® coated stir bar was added norbornene (4.0 g, 42.4 mmol), monochlorobenzene (35 ml) and triethoxysilylnorbornene (2.8 ml, 10.6 mmol). To this stirred solution at ambient temperature was added catalyst A (0.012 g, 13 μmol), borontrifluoride.etherate (0.015 ml, 117 μmol) and finally diethylzinc (0.195 ml of a 1.0 molar solution in cyclohexane, 195 μmol). The reaction was allowed to run for 18 hours and then methanol was injected to kill the reaction. The polymer was washed with excess methanol and dried. The yield of copolymer was 1.2 g.

EXAMPLES 61–66

To a 100 ml glass vial equipped with a Teflon® coated stir bar was added norbornene (4.0 g, 42.4 mmol), diluent (35 ml) and triethoxysilylnorbornene (2.8 ml, 10.6 mmol). To this stirred solution at ambient temperature was added the catalyst (26 μmol) followed by the second component indicated in the following table. After the stated time the reactions were terminated by diluting the reaction mixtures with excess methylene chloride of dichlorobenzene (to afford a homogeneous solution) and pouring the resulting solution into a large, stirred volume of acetone, filtered, washed with an excess of acetone, and dried overnight in a heated vacuum oven (80° C.) to afford the product.

(35 ml), triethoxysilylnorbornene (2.8 ml, 10.6 mmol) and hydrogen (in Example 67, 10 psig over-pressure, in Example 68, the solution was first saturated with hydrogen and then 10 psig over pressure was applied). To this stirred solution at ambient temperature was added nickel ethylhexanoate (0.02 ml of an 8% w nickel solution in mineral spirits, 26 μmol) and a mixture of tris(pentafluorophenyl)boron (234 μmol in petroleum naphtha) and triethylaluminum (0.16 ml of a 1.7 molar solution in cyclohexane, 260 μmol). The reaction was allowed to run for 2 hours (Example 67) or 18 hours (Example 68) the reaction was terminated by pouring the resulting solution into a large, stirred volume of methanol, filtered, washed with an excess of methanol, and dried overnight in a heated vacuum oven (80° C.) to afford the product. The yields of copolymer were 2.5 g (Example 67) and 4.6 g (Example 68).

EXAMPLE 69

To a 250 ml round-bottomed flask equipped with a Teflon® coated stir bar was added norbornene (18.4 g, 195 mmol), monochlorobenzene (100 ml) and triethoxysilylnorbornene (4.44 ml, 16.9 mmol). To this stirred solution at ambient temperature was added catalyst A (0.085 g, 52 μmol), borontrifluoride.etherate (0.06 ml, 468 μmol) and finally triethylaluminum (0.31 ml of a 1.7 molar solution in cyclohexane, 520 μmol).

After 60 minutes the reaction mixture was diluted with toluene (300 ml) and then precipitated in an excess of acetone and filtered. The polymer was then washed with an excess of glacial acetic acid and then acetone and dried overnight in a heated vacuum oven (120° C.) to afford the product (21.2 g, 94%). GPC analysis showed the copolymer to have a molecular weight ($M_w$) of 690,560 ($M_n$ 156,330). The proton NMR data indicated that the polymer contained approximately 7.8% triethoxysilylnorbornene.

Adhesion to Gold

Three commercial high performance polymers, Pyralin 2540 polyimide (DuPont), Ultradel 7501 polyimide (Amoco) and Cyclotene CY3022-57 BCB (Dow Chemical Company) were compared to the polymer prepared in the present example for adhesion to gold. Spin coated substrates of each polymer were prepared as follows:

Silicon wafers were sputtered with an adhesion layer of titanium. To the titanium layer a layer of approximately 2400 Å of gold was sputtered to give a gold covered substrate. The gold substrates were stored in a cleanroom dry box until needed.

Polyimide (Pyralin 2540)

An amino functional silane adhesion promoter solution (VM-651 available from DuPont) was prepared by mixing 3

| Example Number | Catalyst Type | Second Component (Type, Micromoles) | Diluent (Type, ml) | Time (hr) | Yield (g) | $M_w$ |
|---|---|---|---|---|---|---|
| 61 | E | B(C₆F₅)₃, 234 | toluene, 35 | 22 | 4 | 732,600 |
| 62 | F | AgSbF₆, 30 | dichloroethane, 35 | 1 | 1.2 | |
| 63 | F | B(C₆F₅)₃, 117 | dichloroethane, 35 | 1 | 4.3 | |
| 64 | F | B(C₆F₅)₃, 117 | methylene chloride, 35 | 3 | 3.0 | |
| 65 | Nickel ethylhexanoate | B(C₆F₅)₃, 234 | cyclohexane, 35 | 18 | 1.9 | |
| 66 | Nickel ethylhexanoate | B(C₆F₅)₃, 234 | dichloroethane, 35 | 18 | 4.3 | |

EXAMPLES 67–68

To a 100 ml glass vial equipped with a Teflon® coated stir bar was added norbornene (4.0 g, 42.4 mmol), cyclohexane drops of the VM-651 in 100 ml of deionized water. Three ml of the solution was placed in one of the gold substrates prepared above and spun at 5,000 rpm for 30 seconds. A 3 ml solution of the polyimide (15 wt. % in n-methyl pyrrolidone solvent, 4000 to 7000 cp) was placed on the adhesion promoter coated substrate and spun at 4,800 rpm for 30 sec. The coated substrate was then soft baked for 30 minutes at 120° C. in air. The polyimide coated substrate was then placed in a nitrogen purged furnace and cured according to the following schedule:

a. 2° C./min. to 200° C., hold for 1 hour
b. 2° C./min. to 365° C., hold for 1 hour
c. Cool to 25° C.

Polyimide (Ultradel 7501)

An amino functional silane (A/B 2000 available from Amoco) was prepared by mixing 5 ml of 3-aminopropyl triethoxysilane with 750 ml of xylene. After 24 hours 1 to 3 ml of the adhesion promoter was placed on a gold substrate prepared above. The substrate was then spun at 4,000 rpm for 30 sec. The coated substrate was baked on a hot plate at 100° C. for 30 sec. Three ml of a solution of the polyimide (12 wt. % in γ-butyrolactone solvent) and spun at 2,700 rpm for 60 seconds. The polymer coated substrate was soft baked on a hot plate at 100° C. for 10 minutes. The polymer coated substrate was exposed to UV light, baked on a hot plate at 100° C. for 10 minutes and developed using ULTRADEL B 760D developer. The polymer coated substrate was then placed in a nitrogen purged furnace and cured as follows:

a. 5° C./min. to 80° C., hold for 1 hour
b. 5° C./min. to 160° C., hold for 1 hour
c. 5° C./min. to 200° C., hold for 1 hour
d. 5° C./min. to 300° C., hold for 1 hour
e. Cool to 25° C.

BCB (Cyclotene CY3022-57)

Three ml of a solution of the BCB (55 wt. % in mesitylene, 259 cp solvent) was placed on a gold substrate prepared above. The substrate was then spun at 1,500 rpm for 30 seconds. The polymer coated substrate was placed in a nitrogen purged furnace and cured according to the following schedule:

a. 5° C./min. to 250° C.
b. Cool to 25° C.

Five ml of a solution of the present polymer (9.9 wt. % in mesitylene) was placed on a gold substrate prepared above. The substrate was spun at 1,500 rpm for 30 seconds. The coated substrate was then placed in a nitrogen purged furnace and cured at 5° C./min. to 250° C. and held for 1 hour. The cured substrated was then allowed to cool to 25° C.

The thickness of each film was measured and recorded. Each of the coated substrates were subjected to the tape test. The coated substrates were also subjected to a peel test. In this test the coated substrates are scribed in order to create an edge where the film could be peeled from the substrate surface. If the film could not be removed, it was noted as a "pass". If any polymer was removed, the sample was noted as "fail". Results are reported below:

| Polymer | Film Thickness (μm) | Tape Test | Peel Test |
|---|---|---|---|
| Polyimide - 2540* | 4.202 ± 0.059 | Fail | Fail |
| Polyimide - 7501* | 4.667 ± 0.027 | Pass | Fail |
| BCB* | 5.332 ± 0.052 | Fail | Fail |
| Polymer of the invention | 3.213 ± 0.032 | Pass | Pass |

*Commercial polymer

EXAMPLE 70

To a 1 L round-bottomed flask equipped with a Teflon® coated stir bar was added norbornene (91.94 g, 977 mmol), dichloroethane (350 ml) and triethoxysilylnorbornene (22.24 ml, 85 mmol). To this stirred solution at ambient temperature was added catalyst A (0.40 g, 260 μmol) premixed with borontrifluoride-etherate (0.30 ml, 2.34 mmol) and finally triethylaluminum (1.54 ml of a 1.7 molar solution in cyclohexane, 2.60 mmol).

After 60 minutes the reaction was terminated using methanol (5 ml). The polymer was divided into several portions to allow a variety of different work-up procedures to be evaluated. First the slurry was poured into methanol, filtered and washed with excess methanol and dried to allow the NMR and GPC data to be measured. GPC analysis showed the copolymer to have a molecular weight ($M_w$) of 828,000 ($M_n$ 168,600). The proton NMR data indicated that the polymer contained approximately 8.3% triethoxysilylnorbornene. The polymer was divided into several portions and redissolved in toluene. One portion of this solution was simply reprecipitated into an excess of ethanol and filtered. Two other toluene solutions were first filtered through microfilters prior to reprecipitation, while the final samples were filtered through various grades of alumina.

Polymer solutions (12.3 wt. % in mesitylene) were spin coated (1,250 rpm, cured film thickness 6.5 μm) onto gold, copper, and aluminum substrates. The polymer solutions contained 250 ppm and 55 ppm of residual Al and Ni (as measured by x-ray fluorescence). The polymer passed the tape test. The polymer treated gold and copper substrates were exposed to boiling water for 1.5 hours without delamination (passed the tape test). Refractive index 1.516 (TE mode), Δn=0.0005. Permittively 2.5.

Two film samples were prepared from the polymer sample cast from the above mesitylene solution onto glass plates. One film sample was dried at 250° C. and the other at 300° C. Each film was exposed to various solvents and photolithographic solutions and evaluated for crazing, i.e., stress cracks induced from solvent sorption. The film dried at 250° C. did not craze in acetone, methanol, isopropanol, aqueous base (pH 14), 2% HCl, 15% HCl, PAN etching solution, or dilute ammonium hydroxide solution. The film dried at 300° C. did not craze in acetone, methanol, isopropanol, or dilute hydrogen fluoride solution.

A second sample of the polymer was reprecipitated from toluene. Solutions of the precipitated polymer were prepared (9.3 wt. %) in chlorobenzene) and spin coated onto aluminum, gold, and silver substrates (1,800 rpm, cured film thickness was 2.2 μm). The polymer solution had a residual aluminum and nickel content of 33 ppm and 4 ppm, respectively (determined by x-ray fluorescence). The polymer film passed the tape test for all substrates. Refractive index 1.518 (TE mode), Δn=0.0008. Permittivity 2.5.

A third sample of the polymer was twice reprecipated from toluene. Solutions of the twice reprecipitated polymer were prepared (9.7 wt. % in chlorobenzene) and spin coated onto aluminum, silver, and gold substrates (700 rpm, cured film thickness 4.3 μm). The polymer solution contained residual aluminum and nickel of 35 ppm and 7 ppm, respectively (determined by x-ray fluorescence). All coated substrates passed the tape test. Refractive index 1.518 (TE mode), Δn=0.0008. Permittivity 2.5.

A fourth sample of the polymer was acid washed in acetic acid. Solutions of the polymer were prepared in chlorobenzene (10.9 wt. %) and mesitylene (10.0 wt. %). The solutions were each spin coated onto aluminum, silver, gold, and copper substrates (chlorobenzene solution spun at 1,250 rpm, cured film thickness of 3.1 µm, mesitylene solution spun at 1,000 rpm, cured film thickness of 2.1 µm). The film prepared from the mesitylene solution appeared to have a better surface uniformly than the film prepared from the chlorobenzene solution. The polymer solutions contained 33 ppm and 4 ppm of residual aluminum and nickel, respectively. All of the coated substrates passed the tape test. Refractive index 1.516 (TE mode), Δn=0.0030. Permittivity 2.5.

EXAMPLE 71

To a 100 ml glass vial equipped with a Teflon® coated stir bar was added norbornene (4.7 g, 49.8 mmol), dichloroethane (30 ml) and triethoxysilylnorbornene (0.7 ml, 2.66 mmol). To this stirred solution at ambient temperature was added the catalyst (an equimolar mixture of nickel ethylhexanoate and dimethylaniliniumtetrakis (pentafluorophenyl)borate (13 µmol)) followed by triethylaluminum (650 µmol, neat). After 60 minutes the reaction was terminated by adding methanol, the polymer was then filtered, washed with an excess of methanol, and dried overnight in a heated vacuum oven (80° C.) to afford the product (1.15 g). The proton NMR data indicated that the polymer contained approximately 3% triethoxysilylnorbornene. The refractive index was measured to be 1.52 (TE mode).

EXAMPLE 72

To a 100 ml glass vial equipped with a Teflon® coated stir bar was added norbornene (4.7 g, 49.8 mmol), dichloroethane (40 ml) and triethoxysilylnorbornene (0.7 ml, 2.66 mmol). To this stirred solution at ambient temperature was added catalyst A (0.012 g, 13 µmol), borontrifluoride.etherate (0.15 ml, 1.17 mmol) and finally triethylaluminum (0.077 ml of a 1.7 molar solution in cyclohexane, 130 µmol).

After 60 minutes the polymer slurry was diluted with chlorobenzene (100 ml), the resulting solution filtered and reprecipitated into an excess of methanol. The resulting copolymer was washed with excess methanol and dried overnight in a heated vacuum oven (80° C.) to afford the product (4.0 g). GPC analysis showed the copolymer to have a molecular weight ($M_w$) of 470,000 ($M_n$ 184,400).

Polymer solutions (12.8 wt. % in chlorobenzene) were spin coated (800 rpm, cured film thickness of 5.4 µm) onto gold, aluminum, and silicon dioxide substrates. The polymer passed the tape test on all substrates. The polymer could not be removed from any of the substrates after the termal shock test in boiling water (1.5 mins. exposure) followed by liquid nitrogen (2 mins. exposure). Permittivity 2.4. Refractive index 1.516 (TE mode), Δn=0.0012.

EXAMPLE 73

To a dry 100 ml glass vial containing a magnetic stirrer and a mixture of norbornene (4.49 g, 0.0478 mol), and triethoxysilyl norbornene (1.39 ml, 0.00531 mol) was added cyclohexane (50 ml) followed by nickel ethylhexanoate (0.013 mmol), tris-pentafluorophenyl boron (0.117 mmol) and triethylaluminum (0.130 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 3.8 g. The polymer was further characterized using GPC to obtain molecular weight information and using $^1$H-NMR for the copolymer composition. These results are provided in Table 1.

EXAMPLE 74

To a dry 100 ml glass vial containing a magnetic stirrer and a mixture of norbornene (8.49 g, 0.090 mol), and triethoxysilyl norbornene (5.56 ml, 0.0159 mol) was added cyclohexane (75 ml) followed by nickel ethylhexanoate (0.026 mmol), tris-pentafluorophenyl boron (0.234 mmol) and triethylaluminum (0.260 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.8 g. The polymer was further characterized using GPC to obtain molecular weight information and using $^1$H-NMR for the copolymer 5 composition. These results are provided in Table 1.

EXAMPLE 75

To a dry 100 ml glass vial containing a magnetic stirrer and a mixture of norbornene (7.99 g, 0.0848 mol), and triethoxysilyl norbornene (5.6 ml, 10 0.0212 mol) was added cyclohexane (75 ml) followed by nickel ethylhexanoate (0.026 mmol), tris-pentafluorophenyl boron (0.234 mmol) and triethylaluminum (0.260 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.3 g. The polymer was further characterized using GPC to obtain molecular weight information and using $^1$H-NMR for the copolymer composition. These results are provided in Table 1.

EXAMPLE 76

To a dry 100 ml glass vial containing a magnetic stirrer and a mixture of norbornene (7.49 g, 0.0796 mol), and triethoxysilyl norbornene (6.95 ml, 0.0265 mol) was added cyclohexane (75 ml) followed by nickel ethylhexanoate (0.026 mmol), tris-pentafluorophenyl boron (0.234 mmol) and triethylaluminum (0.260 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 4.5 g. The polymer was further characterized using GPC to obtain molecular weight information and using $^1$H-NMR for the copolymer composition. These results are provided in Table 1.

EXAMPLE 77

To a dry 100 ml glass vial containing a magnetic stirrer and a mixture of norbornene (3.99 g, 0.0424 mol ), 1-hexene (0.18 g, 2.12 mmol) and triethoxysilyl norbornene (2.78 ml, 0.0106 mol) was added cyclohexane (75 ml) followed by nickel ethylhexanoate (0.013 mmol), tris-pentafluorophenyl boron (0.117 mmol) and triethylaluminum (0.130 mmol)

under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 2.9 g. The polymer was further characterized using GPC to obtain molecular weight information and using $^1$H-NMR for the copolymer composition. These results are provided in Table 1.

EXAMPLE 78

To a dry 100 ml glass vial containing a magnetic stirrer and a mixture of norbornene (3.99 g, 0.0424 mol), 1-hexene (0.18 g, 2.12 mmol) and triethoxysilyl norbornene (2.78 ml, 0.0106 mol) was added cyclohexane (75 ml) followed by nickel ethylhexanoate (0.026 mmol), tris-pentafluorophenyl boron (0.234 mmol) and triethylaluminum (0.260 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 5.4 g. The polymer was further characterized using GPC to obtain molecular weight information and using $^1$H-NMR for the copolymer composition. These results are provided in Table 1.

TABLE 1

| Example Number | Moles Added (%) NB | Moles Added (%) TESNB | Moles Found in Polymer (%) From $^1$H-NMR TESNB | GPC molecular weight (g/mole) at 25° C., chlorobenzene $M_n$ (1000) | $M_w$ (1000) | Polydispersity |
|---|---|---|---|---|---|---|
| 73 | 90 | 10 | 10.4 | 344 | 1177 | 3.4 |
| 74 | 85 | 15 | 14.9 | 185 | 1173 | 6.3 |
| 75 | 80 | 20 | 18.8 | 265 | 1164 | 4.3 |
| 76 | 75 | 25 | 22.4 | 456 | 1205 | 2.6 |
| 77 | 80 | 20 | 18.0 | 391 | 1204 | 3.0 |
| 78 | 80 | 20 | 18.5 | 148 | 478 | 3.2 |

Dilute solutions (10% in chloroform) of the polymers of Examples 73 through 78 in chloroform were cast onto glass plates and allowed to dry slowly at room temperature for 15 hours. The cast polymer films (100 to 200 μm thick) were then removed from the glass plate and heated to 180° C. for 1 hour followed by heating the films to 300° C. by increasing the temperature by 5° C./min. The 300° C. temperature was maintained for 1 hour in a nitrogen atmosphere for complete removal of solvent. The films were then cooled to room temperature and samples were then cut for Dynamic Mechanical Analysis (DMA).

Examples 77 and 78 demonstrate the effect of controlling the molecular weight of the polymer using 1-hexene as a chain transfer agent. It can be clearly observed that under the same reaction conditions, increase in the concentration of the catalyst in combination with 1-hexene, results in a decrease in the molecular weight of the polymer formed. Also the yield of the polymer obtained has been observed to be higher with a decrease in the monomer/catalyst ratio as observed in Examples 77 and 78.

Dynamic mechanical analysis was performed on the above polymers using a Rheometrics solid analyzer (RSA II) at a temperature range from −150° C. to 400° C. (heating rate of 2° C./min) at a constant frequency of 1 Hz under nitrogen atmosphere. A single glass temperature transition at around 355° C. was observed for each of the examples according to the peak in the tan $\partial$ and was observed to be independent of the silane amount. The glassy modulus for the samples were observed to range from 2 to 3 GPa.

EXAMPLE 79

To a dry 100 ml glass vial containing a magnetic stirrer and a mixture of norbornene (3.99 g, 0.0424 mol), 1-hexene (0.134 g, 1.54 mmol) and triethoxysilyl norbornene (2.78 ml, 0.0106 mol) was added cyclohexane (75 ml) followed by nickel ethylhexanoate (0.026 mmol), tris-pentafluorophenyl boron (0.234 mmol) and triethylaluminum (0.260 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.1 g. The polymer was further characterized using GPC to obtain molecular weight information, Mn=156,000, Mw=641,000 with a polydispersity of 4.1.

Polymer films of the polymer samples have a permittivity of 2.59±0.08.

EXAMPLE 80

To a dry 100 ml glass vial containing a magnetic stirrer and a mixture of norbornene (11.99 g, 0.1273 mol), 1-hexene (0.804 g, 9.56 mmol) and triethoxysilyl norbornene (8.4 ml, 0.0318 mol) was added cyclohexane (175 ml) followed by nickel ethylhexanoate (0.078 mmol), tris-pentafluorophenyl boron (0.702 mmol) and triethylaluminum (0.780 mmol) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 11.2 g. The polymer was further characterized using GPC to obtain molecular weight information, $M_n$=45,000, $M_w$=273,000 with a polydispersity of 5.9.

Moisture absorption was measured by creating capacitor structures on a substrate and measuring the capacitance immediately after a bake at 150° C. under nitrogen. The capacitance values were again measured after 12 hours and 1 month after storage at 25° C. and 45% relative humidity. After 1 month capacitance values only changed 0.6±0.3%. Since the dielectric constant of this polymer was measured at 2.6 and the dielectric constant of water is approximately 78, a 1% change in capacitance corresponds to 0.013 wt. % moisture absorption. Polyimides typically ranged from 0.5 to 3 wt. % moisture absorption.

EXAMPLE 81

To a dry 100 ml glass vial containing a magnetic stirrer and a mixture of norbornene (119.6 g, 1.27 mol) and triethoxysilyl norbornene (81.6 g, 0.3182 mol) was added methylene chloride (1000 ml) followed by catalyst A (1.199 g, 1.2 mmol), borontrifluoride-etherate (0.90 ml, 6.99 mmol) and triethylaluminum (4.78 ml of a 1.7 molar solution in cyclohexane, 8.0 mmol) under argon atmosphere. The reaction was allowed to stir for 15 hours at room temperature after which it was terminated by injecting 25 ml of ethanol into the solution. The polymer solution was then diluted with cyclohexane and precipitated with excess acetone. The precipitated polymer was filtered, washed with acetone, and dried overnight under vacuum. Polymer yield was found to be 124.1 g (62% conversion). The polymer was further characterized using GPC to obtain molecular weight information, $M_n$=65,000, $M_w$=306,000 with a polydispersity of 4.6.

EXAMPLE 82

To a dry 5 L glass reactor containing a magnetic stirrer and a mixture of norbornene (59.44 g, 0.631 mol), 1-hexene (5.93 ml, 9.56 mmol) and triethoxysilyl norbornene (40.57 g, 0.159 mol) was added cyclohexane (1.1 L) followed by nickel ethylhexanoate (2.6 mmol), tris-pentafluorophenyl boron (27 mmol) and triethylaluminum (19.9 mmol) under argon atmosphere. The reaction was allowed to stir for 15 hours at room temperature after which in order to remove the catalyst 8-hydroxy quinolin (11.0 g) dissolved in 100 ml chloroform was added via syringe and the solution was allowed to stir for 15 hours. The reaction was terminated by injection 5 ml of ethanol into the solution. The polymer solution was then diluted with cyclohexane and filtered through celite and precipitated into excess (10 times by volume of polymer solution) acetone. The precipitated polymer was filtered, washed with acetone, and dried overnight under vacuum. The polymer was redissolved in cyclohexane and reprecipitated into methanol. The precipitated polymer was dried at room temperature under vacuum for 24 hours. Polymer yield was found to be 32 g. The polymer was further characterized using GPC to obtain molecular weight information, $M_n$=156,000, $M_w$=434,000 with a polydispersity of 2.8. The residual nickel and aluminum in the polymer was analyzed using atomic absorption spectroscopy and these were observed to be as follows:

| Metals Analyzed | Amount of Metal Before Treatment (ppm) | Amount of Metal After 8-Hydroxyquinoline Treatment (ppm) |
|---|---|---|
| Nickel | 320 | 2.6 |
| Aluminum | 2217 | 35 |

The dried polymer (32 g) was dissolved in 400 ml of mestylene, and filtered through 0.5 μmillipore filter capsules and later through 0.2 μfilter.

A polymer solution (8 wt. % in mesitylene) was prepared and spin coated onto silicon dioxide wafers (1,000 rpm, cured thickness of 2.65 μm and 2,000 rpm, cured thickness of 1.47 μm). The substrates were cured at 250° C. and 300° C. After curing the coated substrates at 250° C. for 1 hour in a nitrogen purged furnace the permittivity was measured to be 2.57±0.03 and the loss is 0.001±0.001. The permittivity for the 300° C. cured substrates (1 hour in a nitrogen pured furnace) was 2.60±0.04 and the less 0.002±0.002. The refractive index was measured at 1.505±0.0001 (TE mode) and Δn of 0.0031±0.0001 indicating extremely low birefringence and hence good uniformity. The best of the polyimides exhibit birefringence values on the order of 0.080 under similar conditions (Colburn et al., *J. Polym. Sci. B.*, 32, 1271 (1994)).

The above described polymer solution was also used to coat aluminum, gold, silver, and copper substrates.

Polymer adhesion to aluminum was measured as excellent using the tape test for films cured at 250° and 300° C., both with polymer spun on top of aluminum and aluminum sputtered onto the polymer. Even after 2 hours in boiling water, there was no evidence of any delamination and all samples again passed the tape test. These samples also survived a thermal shock test by exposing the polymer/aluminum substrates to boiling water for 1 minute, then immediately placing them in liquid nitrogen for I minute and repeating this cycle 10 times. No delamination occurred and all thermally shocked samples passed the tape test.

Adhesion of the polymer to gold substrates was measured to be excellent using the tape test for films cured at 250°, 300°, 350°, and 400° C. Gold sputtered coated onto polymer films cured at 250° and 300° C. also survived the tape test. Polymer films spun onto gold immediately after the sputtering process survived exposure to 2 hours of boiling water without delamination and passed the tape test. There is no reported example of polyimide or benzocyclobutene maintaining adhesion to gold following exposure to boiling water.

Adhesion of this polymer to silver was excellent (passed the tape test for films cured at 350° C.) and continued to pass the tape test even after 1 hour in boiling water.

Adhesion to copper was determined after cleaning sputtered copper with a 10% sulfuric acid solution for I minute, then rinsing for 1 minute with deionized water. The copper was then dried with a dry nitrogen stream and the polymer was spin coated thereon. The sample was then cured at 300° C. for 1 hour. The film passed the tape test, and continued to pass the tape test after exposure to boiling water for 2 hours.

Films spun from the mesitylene solution and dried at 250° and 300° C. did not craze in acetone, methanol, isopropanol, developer (aqueous base, pH =14), 2% HCl, 15% HCl, PAN etch, hydrofluoric acid solution (dilute), and ammonium hydroxide solution (dilute).

Excellent crosslinking was observed for films treated at 300° C. and above.

Free standing films cured at 300° C. would not re-dissolve in solvent. Multi-layer processing depends on cure temperature of first layer. The deposition of subsequent layers having a thickness approaching that of the underlying layer appears to be related to the crosslink density of the underlying layer.

| Curing Temperature of First Layer | Thickness (layer 1) | Thickness (layer 1 + 2) | (layer 1 + 2)/ (layer 1) |
|---|---|---|---|
| RT (approx. 25° C.) | 3.04 μm | 3.4 μm | 1.12 |
| 100° C., hot plate | 1.99 μm | 2.93 μm | 1.47 |
| 150° C., hot plate | 1.25 μm | 2.36 μm | 1.89 |
| 300° C., $N_2$ | 3.04 μm | 5.97 μm | 1.96 |

Perfect layer additivity would give 2× total thickness, and this is closest for the 300° C. cure under nitrogen.

EXAMPLE 83

To a dry 5 L glass reactor containing a stirring paddle, a mixture of norbornene (147 g, 2.03 mol), and triethoxysilyl norbornene (35.5 ml, 0.128 mol) was added dichloroethane (1300 ml) followed by catalyst A (0.65 g, 1.2 mmol), borontrifluoride-etherate (0.63 ml, 4.9 mmol) and triethylaluminum (3.2 ml of a 1.7 molar solution in cyclohexane, 8.0 mmol) under argon atmosphere. The reaction was allowed to stir for 3 hours at room temperature after which it was terminated by injecting 25 ml of ethanol into the solution. The polymer solution was then diluted with cyclohexane and precipitated with excess acetone. The precipitated polymer was filtered, washed with acetone, and dried overnight under vacuum. Polymer yield was found to be 133.8 g (75% conversion). The polymer was further characterized using GPC to obtain molecular weight information, $M_w$=550,000.

A solution of the polymer (12.5 wt. % in mesitylene, 50 cp) was spin coated onto gold (2,000 rpm, cured thickness 1.1 5 µm), aluminum (2,000 rpm, cured thickness 1.13 µm) and copper 1,000 rpm, cured thickness 1.60 µm). All samples were cured to 250° C. in a furnace under nitrogen atmosphere. Each coated substrate was subjected to photolithography. The measured permittivity values were measured as follows:

| | |
|---|---|
| gold | 2.48 ± 0.03 and loss 0.001 ± 0.0007 |
| aluminum | 2.45 ± 0.06 and loss 0.004 ± 0.0003 |
| copper | 2.50 ± 0.15 and loss 0.002 ± 0.0002 |

EXAMPLE 84

To a dry 100 ml glass vial containing a magnetic stirrer and a mixture of norbornene (3.99 g, 0.0424 mol) triethoxysilyl norbornene (2.78 ml, 0.0106 mol) was added cyclohexane (75 ml) and the solution was stirred at room temperature. To this was added nickel ethylhexanoate (0.026 mmol), tris-pentafluorophenyl boron (0.234 mmol) and triethylaluminum (0.260 mmol) under argon atmosphere. The reaction was allowed to stir for 3 hours, after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 5.0 g. The polymer was further characterized using GPC to obtain molecular weight information and using $^1$H-NMR for the copolymer composition. These results are provided in Table 2.

EXAMPLE 85

To a dry 100 ml glass vial containing a magnetic stirrer and a mixture of norbornene (3.99 g, 0.0424 mol) triethoxysilyl norbornene (2.78 ml, 0.0106 mol) was added cyclohexane (75 ml) and the solution was heated to 40° C. To this was added nickel ethylhexanoate (0.026 mmol), tris-pentafluorophenyl boron (0.234 mmol) and triethylaluminum (0.260 mmol) under argon atmosphere. The reaction was allowed to stir for 3 hours at 40° C., after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 5.3 g. The polymer was further characterized using GPC to obtain molecular weight information and using $^1$H-NMR for the copolymer composition. These results are provided in Table 2.

EXAMPLE 86

To a dry 100 ml glass vial containing a magnetic stirrer and a mixture of norbornene (3.99 g, 0.0424 mol) triethoxysilyl norbornene (2.78 ml, 0.0106 mol) was added cyclohexane (75 ml) and the solution was heated to 55 ° C. To this was added nickel ethylhexanoate (0.026 mmol), tris-pentafluorophenyl boron (0.234 mmol) and triethylaluminum (0.260 mmol) under argon atmosphere. The reaction was allowed to stir for 3 hours at 55 ° C., after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.0 g. The polymer was further characterized using GPC to obtain molecular weight information and using $^1$H-NMR for the copolymer composition. These results are provided in Table 2.

EXAMPLE 87

To a dry 100 ml glass vial containing a magnetic stirrer and a mixture of norbornene (3.99 g, 0.0424 mol) triethoxysilyl norbornene (2.78 ml, 0.0106 mol) was added cyclohexane (75 ml) and the solution was heated to 70° C. To this was added nickel ethylhexanoate (0.026 mmol), tris-pentafluorophenyl boron (0.234 mmol) and triethylaluminum (0.260 mmol) under argon atmosphere. The reaction was allowed to stir for 3 hours at 70° C., after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.55 g. The polymer was further characterized using GPC to obtain molecular weight information and using $^1$H-NMR for the copolymer composition. These results are provided in Table 2.

EXAMPLE 88

To a dry 100 ml glass vial containing a magnetic stirrer and a mixture of norbornene (3.99 g, 0.0424 mol ), 1-hexene (0.22 g, 2.65 mmol), triethoxysilyl norbornene (2.78 ml, 0.0106 mol) was added cyclohexane (75 ml) and the solution was heated to 70° C. To this was added nickel ethylhexanoate (0.026 mmol), tris-pentafluorophenyl boron (0.234 mmol) and triethylaluminum (0.260 mmol) under argon atmosphere. The reaction was allowed to stir for 3 hours at 70° C., after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.55 g. The polymer was further characterized using GPC to obtain molecular weight information and using $^1$H-NMR for the copolymer composition. These results are provided in Table 2.

In order to prepare polynorbornene copolymer films, samples of polynorbornene/triethoxysilyl norbornene copolymers were dissolved in chloroform and the solutions were filtered through 3 micron filter. The filtered solution was casted on a glass plate and allowed to dry at room temperature for 48 hours. The films were heated for 5 hours at 130° C. in a vacuum oven. The samples were further dried for 1 hour at 300° C. in a hot tube under nitrogen atmosphere. All films were observed to be tough, creasable, and transparent.

TABLE 2

| Example Number | Reaction Temperature | Polymer Yield (%) | Moles Found in Polymer (%) From $^1$H-NMR | GPC Molecular Weight (g/mole) at 25° C. in chlorobenzene | | |
|---|---|---|---|---|---|---|
| | | | | $M_n$ (1000) | $M_w$ (1000) | PD. |
| 74 | 25° C. | 74 | 22.4 | 177 | 761 | 4.2 |
| 75 | 40 | 79 | — | 201 | 731 | 3.6 |
| 76 | 55 | 90 | 23 | 77 | 576 | 7.4 |
| 77 | 70 | 96 | 24 | 75 | 438 | 5.9 |
| 78 | 70 | 80 | 23.4 | 71 | 324 | 4.5 |

The effect of reaction temperature on polymer yield and molecular weight is shown above in Table 2. The data clearly shows that the yield of the reaction is controlled by temperature. Almost quantitative conversion can be obtained at around 70° C.

Thin film stress-strain analyses was performed on the polymers obtained in Examples 75 to 78. Polymer films were cast as in Examples 73 to 78. The stress-strain analyses were conducted on a BFGoodrich Portable Universal Tester™ at a strain rate of 0.1 inches/min. The elongation at break was observed to range from 4 to 10%, and was observed to increase with increasing mole % of triethoxysilyl norbornene in the copolymer as shown in Table 3.

TABLE 3

| Example Number | Mole % of TESNB in copolymer | % Elongation at break |
|---|---|---|
| 85 | 10.5 | 4 |
| 86 | 14.9 | 7 |
| 87 | 18.8 | 8 |
| 88 | 22.4 | 10 |

Coefficient of thermal expansion was measured for the polymers obtained in Examples 85 to 88 in the expansion mode using Perkin Elmer Thermomechanical Analyzer from 50 to 300° C. at a heating rate of 3° C./min. under a nitrogen atmosphere. The coefficient of thermal expansion was observed to be approximately 50±15 ppm/° C.($10^{-6}$/° C.).

EXAMPLE 89

To a dry 100 ml glass vial containing a magnetic stirrer and a mixture of decylnorbornene (11.16 g, 0.0477 mol), and trimethylsilyl norbornene (1.36 g, 0.00531 mol) was added cyclohexane (50 ml) followed by nickel ethylhexanoate (0.026 mmol). The sample was heated to 70° C. at which point, tris-pentafluorophenyl boron (0.234 mmol) and triethylaluminum (0.260 mmol) was added under an argon atmosphere. The reaction was allowed to stir for 24 hours at room temperature after which it was terminated by injecting 5 ml of ethanol into the polymer solution. The polymer solution was then diluted with cyclohexane and precipitated with excess acetone. The precipitated polymer was filtered, washed with acetone, and dried overnight under vacuum. Polymer yield was found to be 10.1 g. The polymer was further characterized using GPC to obtain molecular weight information. The molecular weight of the polymer was found to be 51,800 g/mol ($M_n$) and 1,401,00 g/mole ($M_w$), with a polydispersity of 2.7.

Dynamic mechanical analysis was performed on the polymer using a Rheometrics solid analyzer (RSA II) at a temperature range from –1 50° C. to 200° C. (heating rate of 2° C./min.) at a constant frequency of 1 Hz under nitrogen atmosphere. Two transitions were observed, a high temperature glass transition at around 140° C. and a low temperature transition at –50° C. By copolymerizing a polycyclic monomer with a long aliphatic substituent or side chain, the Tg of the polymer can be controlled.

EXAMPLE 90

To a dry 100 ml glass vial containing a magnetic stirrer and a mixture of decylnorbornene (9.923 g, 0.0424 mol ), and trimethylsilyl norbornene (2.8 ml, 0.0106 mol) was added cyclohexane (50 ml) followed by nickel ethylhexanoate (0.026 mmol). The sample was heated to 70° C. at which point, tris-pentafluorophenyl boron (0.234 mmol) and triethylaluminum (0.260 mmol) was added under an argon atmosphere. The reaction was allowed to stir for 12 hours at room temperature after which it was terminated by injecting 5 ml of ethanol into the polymer solution. The polymer solution was then diluted with cyclohexane and precipitated with excess acetone. The precipitated polymer was filtered, washed with acetone and dried overnight under vacuum. Polymer yield was found to be 7.3 g. The polymer was further characterized using GPC to obtain molecular weight information and using $^1$H-NMR for the copolymer composition. The molecular weight of the polymer was found to be 40,000 g/mol ($M_n$) and 109,000 g/mole ($M_w$), with a polydispersity of 2.7.

EXAMPLE 91

To a dry 100 ml glass vial containing a magnetic stirrer and a mixture of norbornene (7.99 g, 0.0848 mol), bis(2,2, 6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by tris-pentafluorophenyl boron (0.13 mmol, 2.25 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.6 g. The polymer was further characterized using GPC to obtain molecular weight information, and these results are provided in the table below.

EXAMPLE 92

To a dry 100 ml glass vial containing a magnetic stirrer and a mixture of norbornene (7.99 g, 0.0848 mol), bis(2,2, 6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by 1-hexene (0.045 g, 0.53 mmol) and tris-pentafluorophenyl boron (0.13 mmol, 2.25 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 4.0 g. The polymer was further characterized using GPC to obtain molecular weight information, and these results are provided in the table below.

EXAMPLE 93

To a dry 100 ml glass vial containing a magnetic stirrer and a mixture of norbornene (7.99 g, 0.0848 mol), bis(2,2,6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by 1-hexene (0.13 g, 1.59 mmol) and tris-pentafluorophenyl boron (0.13 mmol, 2.25 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 3.7 g. The polymer was further characterized using GPC to obtain molecular weight information, and these results are provided in the table below.

EXAMPLE 94

To a dry 100 ml glass vial containing a magnetic stirrer and a mixture of norbornene (7.99 g, 0.0848 mol), bis(2,2,6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by 1-hexene (0.61 g, 7.3 mmol) and tris-pentafluorophenyl boron (0.13 mmol, 2.25 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 3.0 g. The polymer was further characterized using GPC to obtain molecular weight information, and these results are provided in the table below.

EXAMPLE 95

To a dry 100 ml glass vial containing a magnetic stirrer and a mixture of norbornene (7.99 g, 0.0848 mol), bis(2,2,6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by tris-pentafluorophenyl boron (0.13 mmol, 0.2 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 0.9 g. The polymer was further characterized using GPC to obtain molecular weight information, and these results are provided in the table below.

EXAMPLE 96

To a dry 100 ml glass vial containing a magnetic stirrer and a mixture of norbornene (7.99 g, 0.0848 mol), bis(2,2,6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by tris-pentafluorophenyl boron (0.039 mmol, 0.7 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 4.5 g. The polymer was further characterized using GPC to obtain molecular weight information, and these results are provided in the table below.

EXAMPLE 97

To a dry 100 ml glass vial containing a magnetic stirrer and a mixture of norbornene (7.99 g, 0.0848 mol), bis(2,2,6,6-tetramethyl-3,5-heptanedionate) nickel (II) (5.6 mg, 0.013 mmol), and triethoxysilyl norbornene (5.6 ml, 0.0212 mol) was added cyclohexane (75 ml) followed by tris-pentafluorophenyl boron (0.078 mmol, 1.35 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 5.3 g. The polymer was further characterized using GPC to obtain molecular weight information, and these results are provided in the table below.

EXAMPLE 98

To a dry 100 ml glass vial containing a magnetic stirrer and a mixture of norbornene (7.99 g, 0.0848 mol), bis(2,2,6,6-tetramethyl-3,5-heptanedionate) nickel (II) (11 mg, 0.026 mmol), and triethoxysilyl norbornene (5.6 ml, 0.0212 mol) was added cyclohexane (75 ml) followed by tris-pentafluorophenyl boron (0.26 mmol, 5.5 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.4 g. The polymer was further characterized using GPC to obtain molecular weight information, and these results are provided in the table below.

EXAMPLE 99

To a dry 100 ml glass vial containing a magnetic stirrer and a mixture of norbornene (7.99 g, 0.0848 mol), bis(2,2,6,6-tetramethyl-3,5-heptanedionate) nickel (II) (7.65 mg, 0.018 mmol), and triethoxysilyl norbornene (5.6 ml, 0.0212 mol) was added cyclohexane (75 ml) followed by tris-pentafluorophenyl boron (0.18 mmol, 3.8 ml of 3 wt. % solution in isopar E) under argon atmosphere. The reaction was allowed to stir for 15 hours at room temperature after which it was terminated by injecting 5 ml of ethanol into the solution. The polymer solution was then diluted with cyclohexane and precipitated with excess acetone. The precipitated polymer was filtered, washed with acetone, and dried overnight under vacuum. Polymer yield was found to be 6.1 g. The polymer was further characterized using GPC to obtain molecular weight information, and these results are provided in the table below.

EXAMPLES 91–99

| Example | Moles of norbornene | Moles of triethoxysilyl norbornene | Moles of 1-Hexene | Monomer/ Ni/B | $M_n\ 10^3$ | $M_2\ 10^3$ | Poly-dispersity |
|---|---|---|---|---|---|---|---|
| 91 | 80 | 20 | 0 | 4000/1/10 | 650 | 1500 | 2.3 |
| 92 | 80 | 20 | 1 | 4000/1/10 | 470 | 1060 | 2.2 |
| 93 | 80 | 20 | 3 | 4000/1/10 | 275 | 650 | 2.3 |
| 94 | 80 | 20 | 5 | 4000/1/10 | 206 | 505 | 2.4 |
| 95 | 80 | 20 | 0 | 4000/1/1 | 413 | 990 | 2.3 |
| 96 | 80 | 20 | 0 | 4000/1/3 | 473 | 1130 | 2.4 |
| 97 | 80 | 20 | 0 | 4000/1/6 | 441 | 1275 | 2.8 |
| 98 | 80 | 20 | 0 | 2000/1/10 | 245 | 898 | 3.4 |
| 99 | 80 | 20 | 0 | 3000/1/1 | 263 | 920 | 3.4 |

The following examples demonstrate the preparation, imaging and developing of the photodefinable compositions of the invention.

A. Preparation of Photodefinable Dielectric Solution, Exposure and Development of a Free Standing Film The polymer was dissolved in cyclohexane (15 weight percent of solids) to which was added an onium salt photoinitiator at 1 to 10 weight percent (based on polymer). The solution was filtered through a 0.45 $\mu$m filter and cast on a watch glass into a 100 $\mu$m thick film. The cast films were baked at 100° C. for 60 minutes under vacuum.

The films were partially masked with aluminum foil and exposed to UV radiation from an Electro-Lite 4000 Modular Light Curing System ($\lambda$max=365 nm).

The exposed films were developed by immersion in nonpolar solvents, such as chloroform or cyclohexane, for 30 to 180 seconds to give negative tone images.

B. Preparation of Photodefinable Dielectric Solution, Exposure and Development of a Spin-Coated Film The polymer was dissolved in cyclohexane (15 weight percent of solids) to which was added the onium salt formulation, GE 9380C, at 5 weight percent (based on polymer). The solution was filtered through a 0.2 $\mu$m filter and spun onto a silicon wafer at a speed of 3000 rpm. The coated wafer was dried at 90 to 100° C. for 5 minutes.

The films were exposed through a quartz mask to UV radiation from an Electro-Lite 4000 Modular Light Curing System ($\lambda$max=365 nm).

The wafers were developed by immersion in a nonpolar solvent, such as cyclohexane, to give negative tone images.

EXAMPLE 100

Norbornene-co-triethoxysilyl norbornene (80/20 mole percent norbornene/triethoxysilyl norbornene) was prepared using a type II catalyst in a hydrocarbon diluent. The catalyst comprised nickel hexanoate, tris(perfluorophenyl) boron, and triethylaluminum in the molar ration of 1:9:10. The molar ratio of monomers to nickel was 2000:1. The polymer was purified to remove reaction impurities and was then dissolved in cyclohexane (15 weight percent of solids). Bis(4-dodecylphenyl)iodonium hexafluoroantimonate (GE 9380C formulated photoinitiator solution sensitized with 2-isopropyl thioxanthone), 1 weight percent to the polymer, was added to the polymer solution. The solution was filtered through a 0.45 $\mu$m filter. A film was cast on a watch glass by slow evaporation of the solvent. The film was further dried at 100° C. under vacuum for 60 minutes to give a 100 $\mu$m thick film. The film was exposed to 365 nm radiation at a dose of 2500 and 5500 mJ/cm$^2$. The film was developed by immersion in cyclohexane for 60 seconds to give a negative tone image.

EXAMPLE 101

Norbornene-co-triethoxysilyl norbornene (80/20 mole percent norbornene/triethoxysilyl norbornene) was prepared as in Example 100. The obtained copolymer was dissolved in cyclohexane (15 weight percent of solids). 4-thiophenyl-diphenylsulfonium hexafluorophospate (Sartomer CD-1011 formulated photoinitiator), 5 weight percent to the polymer, was added to the polymer solution. The solution was filtered through a 0.45 $\mu$m filter. A film was cast on a watch glass by slow evaporation of the solvent. The film was further dried at 100° C. under vacuum for 60 minutes to give a 100 $\mu$m thick film. The film was exposed to 365 nm radiation at a dose of 2500 and 5500 mJ/cm$^2$. The film was developed by immersion in cyclohexane for 60 seconds to give a negative tone image.

EXAMPLE 102

Norbornene-co-triethoxysilyl norbornene (80/20 mole percent norbornene/triethoxysilyl norbornene) was obtained as set forth in Example 100. The copolymer was dissolved in decalin (15 weight percent of solids). Bis(4-dodecylphenyl)iodonium hexafluoroantimonate (GE 93 80C formulated photoinitiator solution sensitized with 2-isopropyl thioxanthone), 5 weight percent to the polymer, was added to the polymer solution. The solution was filtered through a 0.45 $\mu$m filter. A thin film of the dielectric polymer as prepared by spin coating the solution onto a silicon wafer at 3000 rpm to give a 2.5 $\mu$m. The film was baked at 100° C. for 5 minutes, and exposed to 350 nm radiation at a dose of 2500 mJ/cm$^2$. The exposed film was heated at 90° C. for 5 minutes and then developed by immersion in cyclohexane for 60 seconds to give a negative tone image.

EXAMPLE 103

Norbornene-co-triethoxysilyl norbornene (80/20 mole percent norbornene/triethoxysilyl norbornene) was polymerized as in Example 100. The copolymer product was dissolved in decalin (15 weight percent of solids). 4-thiophenyl-diphenylsulfonium hexafluorophospate (Sartomer CD-1011 formulated photoinitiator), 5 weight percent to the polymer, was added to the polymer solution. The solution was filtered through a 0.45 $\mu$m filter. A thin film of the dielectric polymer as prepared by spin coating the solution onto a silicon wafer at 3000 rpm to give a 2.5 $\mu$m. The film was baked at 100° C. for 5 minutes, and exposed to 350 nm radiation at a dose of 2500 mJ/cm$^2$. The exposed film was heated at 90° C. for 5 minutes and then developed by immersion in cyclohexane for 60 seconds to give a negative tone image.

We claim:

1. A photodefinable dielectric composition comprising:
   a) an addition polymer having a Tg of at least 250° C. consisting essentially of polycyclic repeating units wherein a portion of said repeating units have a pendant silyl functional group; and
   b) a photoinitiator component.

2. The photodefinable composition of claim 1 wherein said repeating unit containing the pendant silyl functional group is represented as follows:

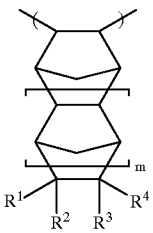

wherein $R^1$ and $R^4$ independently represent hydrogen, linear or branched ($C_1$ to $C_{20}$)alkyl, $R^1$ and $R^4$ when taken together with the two ring carbon atoms to which they are attached form a saturated or unsaturated cyclic ring of 4 to 8 carbon atoms,
wherein said cyclic ring is substituted by at least one of $R^2$ and $R^3$; $R^2$ and $R^3$ independently represent hydrogen, linear or branched ($C_1$ to $C_{20}$)alkyl or the groups:

Ia

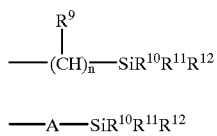

Ib

—A—$SiR^{10}R^{11}R^{12}$ wherein A is a divalent radical selected from the following structures:

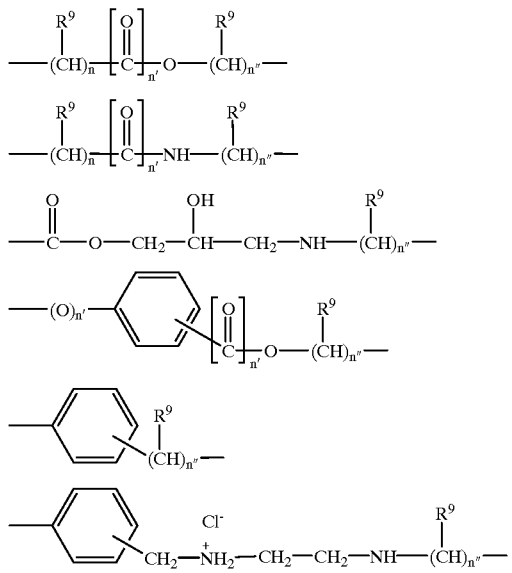

wherein $R^9$ is hydrogen, methyl, or ethyl; $R^{10}$, $R^{11}$, and $R^{12}$ independently represent halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryloxy, linear or branched ($C_1$ to $C_{20}$)alkyl carbonyloxy, ($C_1$ to $C_{20}$)alkyl peroxy, and substituted or unsubstituted ($C_6$ to $C_{20}$)aryloxy; $R^{10}$, $R^{11}$, and $R^{12}$ together with the silicon atom to which they are attached form the group:

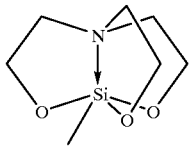

n is a number from 0 to 5; and n' is 0 or 1; and n" is a number from 0 to 10; m is a number from 0 to 4; with the proviso that at least one of $R^2$ and $R^3$ is a silyl substituent selected from the group represented by Ia or Ib above, and that when $R^1$ and $R^4$ together form a cyclic group, $R^2$ and $R^3$ cannot both be a silyl substituent at the same time.

3. The photodefinable composition of claim 2 wherein said addition polymer contains a repeating unit represented as follows:

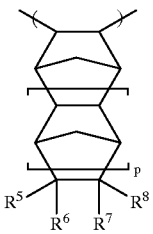

wherein $R^5$, $R^6$, $R^7$, and $R^8$ independently represent hydrogen, linear and branched ($C_1$ to $C_{20}$)alkyl, hydrocarbyl substituted and unsubstituted ($C_5$ to $C_{12}$)cycloalkyl, ($C_6$ to $C_{40}$)aryl, ($C_7$ to $C_{15}$)aralkyl, ($C_3$ to $C_{20}$)alkynyl, linear and branched ($C_3$ to $C_{20}$)alkenyl, or vinyl; any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent a saturated or unsaturated cyclic group containing 4 to 12 carbon atoms or an aromatic ring containing 6 to 17 carbon atoms; and p is a number from 0 to 5.

4. The photodefinable composition of claim 1, 2, or 3 further comprising a solvent.

5. The photodefinable composition of claim 4 having a solids content of from about 5 to about 50 weight percent (polymer in solvent).

6. The photodefinable composition of claim 4 having a solution viscosity of from about 10 to about 50,000 centipoise.

7. The photodefinable composition of claim 1, 2, or 3 having a $T_g$ ranging from 251 to 400° C.

8. The photodefinable composition of claim 2 or 3 wherein at least one of $R^{10}$ to $R^{12}$ is a linear or branched ($C_1$ to $C_{10}$)alkoxy group or halogen.

9. The photodefinable composition of claim 8 wherein $R^{10}$ to $R^{12}$ are the same and are selected from the group consisting of methoxy, ethoxy, propoxy, butoxy, pentoxy, and halogen.

10. The photodefinable composition of claim 9 wherein $R^{10}$ to $R^{12}$ are each ethoxy or chlorine.

11. The photodefinable composition of claim 10 wherein said silyl functional group is triethoxysilyl or trichlorosilyl.

12. The photodefinable composition of claim 9 wherein $R^9$ is hydrogen and n is 0 or 1.

13. The photodefinable composition of claim 2 or 3 wherein said polymer is terminated with an olefinic end group represented by the structures:

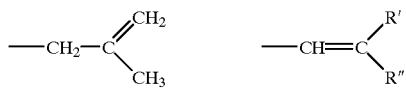

wherein R. and R.. independently represent hydrogen, branched or unbranched ($C_1$ to $C_{40}$)alkyl, branched or unbranched ($C_2$ to $C_{40}$)alkenyl, halogen, or the group:

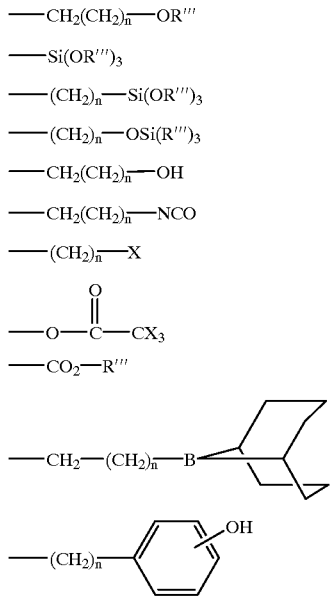

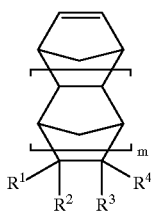

wherein R... is branched or unbranched ($C_1$ to $C_{10}$), branched or unbranched ($C_3$ to $C_9$)alkenyl, substituted or unsubstituted ($C_6$ to $C_{15}$)aryl wherein said substituents if present are selected from branched or unbranched ($C_1$ to $C_{10}$)alkyl or haloalkyl, and halogen, X is chlorine, fluorine, bromine or iodine, and n is 0 to 20.

14. The photodefinable composition of claim 13 wherein R. is hydrogen and R.. is hydrogen or a ($C_1$ to $C_{10}$)alkyl group.

15. The photodefinable composition of claim 14 wherein R.. is selected from the group of methyl, ethyl, propyl, butyl, pentyl, and hexyl.

16. The photodefinable composition of claim 1 wherein said addition polymer is polymerized from a monomer composition consisting essentially of a polycyclic monomer at least a portion of which are represented by a monomer, of the formula:

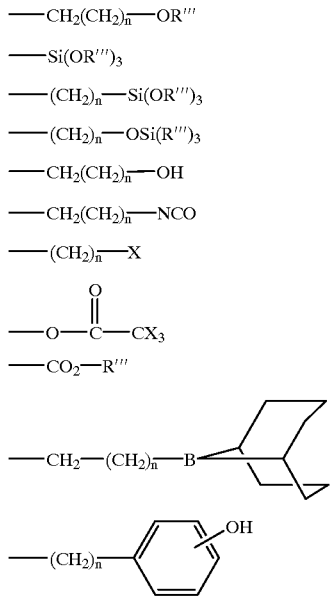

wherein m is 0 to 4; $R^1$ to $R^4$ independently represent hydrogen, linear or branched ($C_1$ to $C_{20}$) alkyl, $R^1$ and $R^4$ when taken together with the two ring carbon atoms to which they are attached form a saturated or unsaturated cyclic ring of 4 to 8 carbon atoms, wherein said cyclic ring is substituted by at least one of $R^2$ and $R^3$; $R^2$ and $R^3$ independently represent hydrogen, linear or branched ($C_1$ to $C_{20}$)alkyl or the groups:

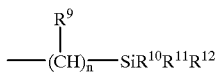

Ia

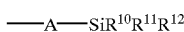

Ib wherein A is a divalent radical selected from the following structures:

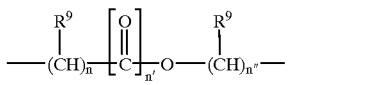

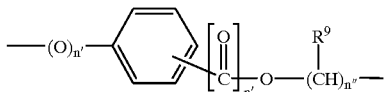

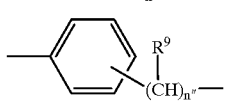

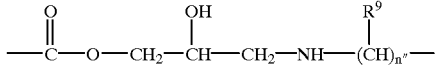

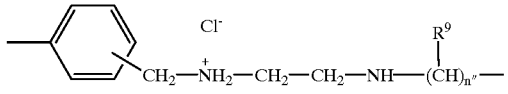

wherein $R^9$ is hydrogen, methyl, or ethyl; $R^{10}$, $R^{11}$, and $R^{12}$ independently represent halogen selected from the group consisting of chlorine, fluorine, bromine and iodine, linear or branched ($Cl_1$ to $C_{20}$)alkyl, linear or branched ($C_1$ to $C_{10}$)alkoxy, substituted or unsubstituted ($C_6$ to $C_{20}$)aryloxy, linear or branched ($C_1$ to $C_{20}$)alkyl carbonyloxy, ($C_1$ to $C_{20}$)alkyl peroxy, and substituted or unsubstituted ($C_6$ to $C_{20}$)aryloxy; $R^{10}$, $R^{11}$, and $R^{12}$ together with the silicon atom to which they are attached form the group:

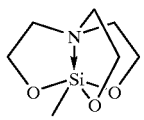

n is a number from 0 to 5; and n' is 0 or 1; and n" is a number from 0 to 10; m is a number from 0 to 4; with the proviso that at least one of $R^2$ and $R^3$ is a silyl substituent selected from the group represented by Ia or Ib above, and that when $R^1$ and $R^4$ together form a cyclic group, $R^2$ and $R^3$ cannot both be a silyl substituent at the same time.

17. The photodefinable composition of claim 16 wherein said monomer composition contains at least one monomer represented by the formula:

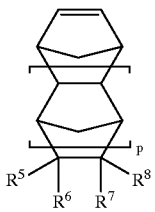

wherein $R^5$ to $R^8$ independently represent hydrogen, linear and branched ($C_1$ to $C_{20}$)alkyl, hydrocarbyl substituted and unsubstituted ($C_5$ to $C_{12}$)cycloalkyl, ($C_6$ to $C_{40}$)aryl, ($C_7$ to $C_{15}$)aralkyl, ($C_3$ to $C_{20}$)alkynyl, linear and branched ($C_3$ to $C_{20}$)alkenyl, or vinyl; any of $R^5$ and $R^6$ or $R^7$ and $R^8$ can be taken together to form a ($C_1$ to $C_{10}$)alkylidenyl group, $R^5$ and $R^8$ when taken with the two ring carbon atoms to which they are attached can represent a saturated or unsaturated cyclic group containing 4 to 12 carbon atoms or an aromatic ring containing 6 to 17 carbon atoms; and p is a number from 0 to 5.

18. The photodefinable composition of claim 16 or 17 wherein at least one of $R^{10}$ to $R^{12}$ is a linear or branched ($C_1$ to $C_{10}$)alkoxy group or halogen.

19. The photodefinable composition of claim 18 wherein $R^{10}$ to $R^{12}$ are the same and are selected from the group consisting of methoxy, ethoxy, propoxy, butoxy, pentoxy, and halogen.

20. The photodefinable composition of claim 19 wherein $R^{10}$ to $R^{12}$ are each ethoxy or chlorine.

21. The photodefinable composition of claim 20 wherein said silyl functional group is triethoxysilyl or trichlorosilyl.

22. The photodefinable composition of claim 19 wherein $R^9$ is hydrogen and n is 0 or 1.

23. A photodefinable composition comprising an addition polymer having a Tg of at least 250° C. said polymer comprising polycyclic repeating units represented by the formula:

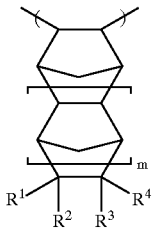

wherein $R^1$ and $R^4$ independently represent hydrogen, linear or branched ($C_1$ to $C_{20}$)alkyl, $R^1$ and $R^4$ when taken together with the two ring carbon atoms to which they are attached form a saturated or unsaturated cyclic ring of 4 to 8 carbon atoms, wherein said cyclic ring is substituted by at least one of $R^2$ and $R^3$; $R^2$ and $R^3$ independently represent hydrogen, linear or branched ($C_1$ to $C_{20}$)alkyl or the groups:

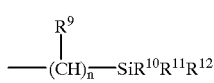

Ia

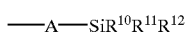

Ib wherein A is a divalent radical selected from the following structures:

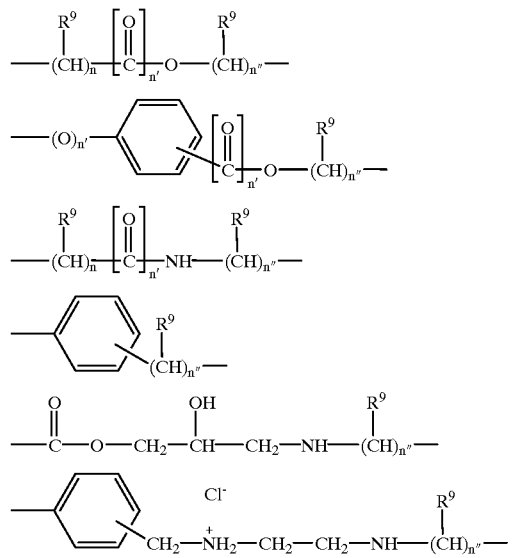

wherein $R^9$ is hydrogen, methyl, or ethyl; $R^{10}$, $R^{11}$, and $R^{12}$ independently represent halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryloxy, linear or branched ($C_1$ to $C_{20}$)alkyl carbonyloxy, ($C_1$ to $C_{20}$)alkyl peroxy, and substituted or unsubstituted ($C_6$ to $C_{20}$)aryloxy; $R^{10}$, $R^{11}$, and $R^{12}$ together with the silicon atom to which they are attached form the group:

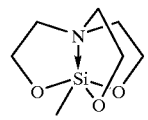

n is a number from 0 to 5; and n' is 0 or 1; and n" is a number from 0 to 10; m is a number from 0 to 4; with the proviso that at least one of $R^2$ and $R^3$ is a silyl substituent selected from the group represented by Ia or Ib above, and that when $R^1$ and $R^4$ together form a cyclic group, $R^2$ and $R^3$ cannot both be a silyl substituent at the same time; and a photoinitiator component selected from the group consisting of bisazides, diamine generating compounds and photoacid generating compounds.

24. The photodefinable composition of claim 23 further comprising a repeating unit represented by the formula:

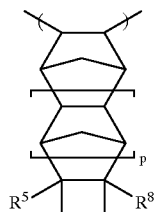

wherein $R^5$, $R^6$, $R^7$, and $R^8$ independently represent hydrogen, linear and branched ($C_1$ to $C_{20}$)alkyl, hydrocarbyl substituted or unsubstituted ($C_5$ to $C_{12}$)cycloalkyl, ($C_6$ to $C_{40}$)aryl, ($C_7$ to $C_{15}$)aralkyl, ($C_3$ to $C_{20}$)alkynyl, linear and branched ($C_3$ to $C_{20}$)alkenyl, or vinyl; any of $R^5$ and $R^6$ or R[7] and R[8] can be taken together to form a ($C_1$ to $C_{20}$) alkylidenyl group, R[5] and R[8] when taken with the two ring carbon atoms to which they are attached can represent saturated or unsaturated cyclic groups containing 4 to 12 carbon atoms or an aromatic ring containing 6 to 17 carbon atoms; and p is a number from 0 to 5.

25. The photodefinable composition of claim 23 or 24 further comprising a solvent.

26. The photodefinable composition of claim 23 or 24 wherein at least one of $R^{10}$ $R^{12}$ is a linear or branched ($C_1$ to $C_{10}$)alkoxy group or halogen.

27. The photodefinable composition of claim 26 wherein $R^{10}$ to $R^{12}$ are the same and are selected from the group consisting of methoxy, ethoxy, propoxy, butoxy, pentoxy, and halogen.

28. The photodefinable composition of claim 27 wherein $R^{10}$ to $R^{12}$ are each ethoxy or chlorine.

29. The photodefinable composition of claim 28 wherein said silyl functional group is triethoxysilyl or trichlorosilyl.

30. A photodefinable dielectric composition comprising:
 a) an addition polymer containing polycyclic repeating units wherein a portion of said repeating units have a pendant silyl functional group; and
 b) a photoinitiator component, wherein said repeating unit containing the pendant silyl functional group is represented as follows:

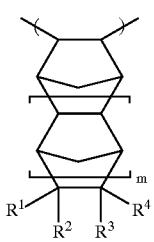

wherein $R^1$ and $R^4$ independently represent hydrogen, linear or branched ($C_1$ to $C_{20}$)alkyl, $R^1$ and $R^4$ when taken together with the two ring carbon atoms to which they are attached form a saturated or unsaturated cyclic ring of 4 to 8 carbon atoms,
wherein said cyclic ring is substituted by at least one of $R^2$ and $R^3$; $R^2$ and $R^3$ independently represent hydrogen, linear or branched ($C_1$ to $C_{20}$)alkyl or the groups:

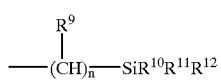

Ia

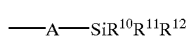

Ib wherein A is a divalent radical selected from the following structures:

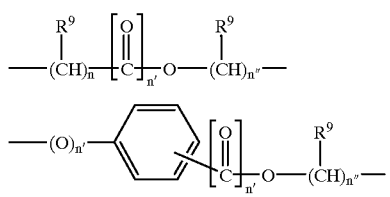

-continued

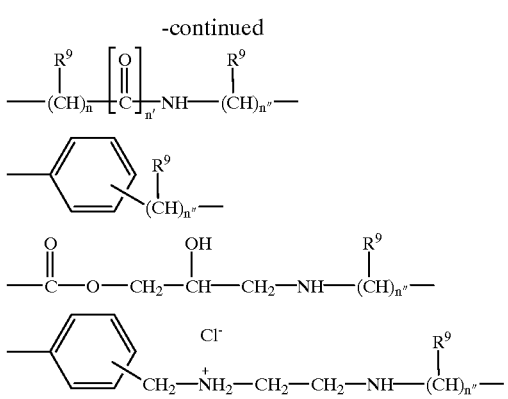

wherein $R^9$ is hydrogen, methyl, or ethyl; $R^{10}$, $R^{11}$, and $R^{12}$ independently represent halogen selected from the group consisting of chlorine, fluorine, bromine and iodine, linear or branched ($C_1$ to $C_{20}$)alkyl, linear or branched ($C_1$ to $C_{20}$)alkoxy substituted or unsubstituted ($C_6$ to $C_{10}$)aryloxy, linear or branched ($C_1$ to $C_{20}$)alkyl carbonyloxy, ($C_1$ to $C_{20}$)alkyl peroxy, and substituted or unsubstituted ($C_6$ to $C_{20}$)aryloxy; $R^{10}$, $R^{11}$, and $R^{12}$ together with the silicon atom to which they are attached form the group:

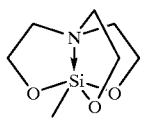

n is a number from 0 to 5; and n' is 0 or 1; and n" is a number from 0 to 10; m is a number from 0 to 4; with the proviso that at least one of $R^2$ and $R^3$ is a silyl substituent selected from the group represented by Ia or Ib above, and that when $R^1$ and $R^4$ together form a cyclic group, $R^2$ and $R^3$ cannot both be a silyl substituent at the same time, and wherein said polymer is terminated with an olefinic end group represented by the structures:

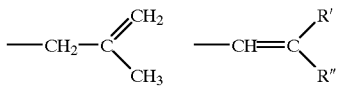

wherein R, and R,, independently represent hydrogen, branched or unbranched ($C_1$ to $C_{40}$)alkyl, branched or unbranched ($C_2$ to $C_{40}$)alkenyl, halogen, or the group:

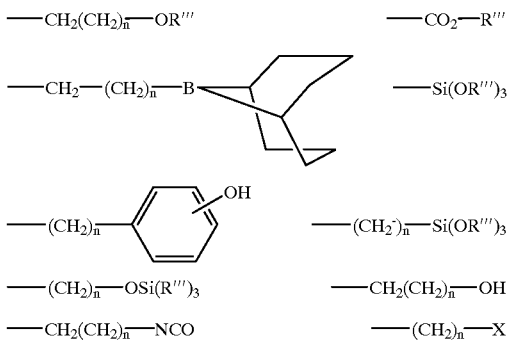

-continued

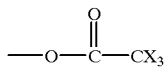

wherein $R_{iv}$ is branched or unbranched ($C_1$ to $C_{10}$), branched or unbranched ($C_3$ to $C_9$)alkenyl, substituted or unsubstituted ($C_6$ to $C_{15}$)aryl wherein said substituents if present are selected from branched or unbranched ($C_1$ to $C_{10}$)alkyl or haloalkyl, and halogen, X is chlorine, fluorine, bromine or iodine, and n is 0 to 20.

31. The photodefinable composition of claim 30 wherein $R_i$ is hydrogen and $R_{ii}$ is hydrogen or a ($C_1$ to $C_{10}$)alkyl group.

32. The photodefinable composition of claim 31 wherein $R_{ii}$ is selected from the group of methyl, ethyl, propyl, butyl, pentyl, and hexyl.

33. The photodefinable composition of claim 1, 2, 3, or 30 wherein said photoinitiator is selected from the group consisting of aromatic bisazides, diamine generating compounds and photoacid generating compounds.

* * * * *